(12) United States Patent
Syn

(10) Patent No.: US 12,171,108 B2
(45) Date of Patent: Dec. 17, 2024

(54) ORGANIC ELECTROLUMINESCENCE DEVICE

(71) Applicant: Samsung Display Co., Ltd., Yongin-si (KR)

(72) Inventor: Hojung Syn, Seongnam-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 784 days.

(21) Appl. No.: 17/358,660

(22) Filed: Jun. 25, 2021

(65) Prior Publication Data

US 2022/0123246 A1 Apr. 21, 2022

(30) Foreign Application Priority Data

Oct. 20, 2020 (KR) .................. 10-2020-0135932

(51) Int. Cl.
| | |
|---|---|
| *H10K 50/11* | (2023.01) |
| *C09K 11/06* | (2006.01) |
| *H10K 50/00* | (2023.01) |
| *H10K 85/30* | (2023.01) |
| *H10K 85/60* | (2023.01) |
| *H10K 101/00* | (2023.01) |
| *H10K 101/10* | (2023.01) |
| *H10K 101/30* | (2023.01) |
| *H10K 101/40* | (2023.01) |
| *H10K 102/00* | (2023.01) |

(52) U.S. Cl.
CPC .............. *H10K 50/00* (2023.02); *C09K 11/06* (2013.01); *H10K 50/11* (2023.02); *H10K 85/346* (2023.02); *H10K 85/631* (2023.02); *H10K 85/654* (2023.02); *H10K 85/6572* (2023.02); *C09K 2211/1029* (2013.01); *C09K 2211/185* (2013.01); *H10K 2101/10* (2023.02); *H10K 2101/30* (2023.02); *H10K 2101/40* (2023.02); *H10K 2101/90* (2023.02); *H10K 2102/351* (2023.02)

(58) Field of Classification Search
None
See application file for complete search history.

(56) References Cited

U.S. PATENT DOCUMENTS

| | | | | |
|---|---|---|---|---|
| 9,040,170 B2* | 5/2015 | Deaton | .................. | H05B 33/14 |
| | | | | 428/690 |
| 9,604,928 B2 | 3/2017 | Shitagaki et al. | | |
| 10,240,085 B2 | 3/2019 | Ihn et al. | | |
| 10,418,573 B2 | 9/2019 | Kim et al. | | |
| 2005/0147846 A1* | 7/2005 | Marks | ................... | H10K 71/12 |
| | | | | 313/506 |
| 2006/0134460 A1* | 6/2006 | Kondakova | ............ | C09K 11/06 |
| | | | | 313/506 |
| 2008/0020234 A1* | 1/2008 | Ren | ........................ | H05B 33/14 |
| | | | | 428/917 |
| 2008/0020237 A1* | 1/2008 | Ren | ...................... | H10K 85/342 |
| | | | | 428/704 |
| 2008/0102310 A1* | 5/2008 | Thompson | ........... | H10K 50/125 |
| | | | | 313/503 |
| 2008/0286610 A1* | 11/2008 | Deaton | ................ | H10K 50/125 |
| | | | | 428/411.1 |
| 2009/0309487 A1* | 12/2009 | Royster, Jr. | .......... | H10K 85/326 |
| | | | | 313/504 |
| 2010/0084647 A1* | 4/2010 | Kondakova | ............ | H10K 85/30 |
| | | | | 257/E51.026 |
| 2015/0295197 A1* | 10/2015 | Adamovich | ......... | C07D 213/02 |
| | | | | 257/40 |

(Continued)

FOREIGN PATENT DOCUMENTS

| | | | | |
|---|---|---|---|---|
| KR | 10-0685971 | | 2/2007 | |
| KR | 20150001485 A | * | 1/2015 | ............. H01L 51/50 |

(Continued)

OTHER PUBLICATIONS

Machine translation of KR-20150001485-A, translation generated Apr. 2024, 11 pages. (Year: 2024).*
Aonuma, Masaki, et al. "Material design of hole transport materials capable of thick-film formation in organic light emitting diodes." Applied Physics Letters 90.18 (2007). (Year: 2007).*

(Continued)

*Primary Examiner* — Robert S Loewe
(74) *Attorney, Agent, or Firm* — KILE PARK REED & HOUTTEMAN PLLC

(57) ABSTRACT

An organic electroluminescence device according to an embodiment includes a first electrode, a hole transport region disposed on the first electrode, an exciton diffusion layer disposed on the hole transport region and including a first host represented by Formula 1, an emission layer disposed on the exciton diffusion layer and including a second host, a third host, and a phosphorescent dopant, an electron transport region disposed on the emission layer, and a second electrode disposed on the electron transport region. The organic electroluminescence device exhibits high efficiency and a long service life.

19 Claims, 7 Drawing Sheets

(56) References Cited

U.S. PATENT DOCUMENTS

| | | | | |
|---|---|---|---|---|
| 2015/0311447 A1* | 10/2015 | Kondakova | .......... | H10K 85/633 |
| | | | | 257/40 |
| 2017/0062734 A1* | 3/2017 | Suzuki | ............... | H10K 85/6572 |
| 2017/0301871 A1 | 10/2017 | Li | | |
| 2019/0280213 A1* | 9/2019 | Adamovich | ......... | H10K 85/342 |
| 2020/0343457 A1* | 10/2020 | Weaver | ................ | H10K 85/342 |
| 2021/0159462 A1* | 5/2021 | Hamer | ................... | H10K 59/38 |

FOREIGN PATENT DOCUMENTS

| | | |
|---|---|---|
| KR | 10-1706752 | 2/2017 |
| KR | 10-2017-0026075 | 3/2017 |
| KR | 10-2018-0137595 | 12/2018 |
| KR | 10-2020-0025382 | 3/2020 |
| WO | WO-2019059695 A1 * | 3/2019 ........... C07D 239/74 |

OTHER PUBLICATIONS

Tyler Fleetham et al., "Efficient "Pure" Blue OLEDs Employing Tetradentate Pt Complexes with a Narrow Spectral Bandwidth", Advanced Materials, 2014, DOI: 10.1002/adma.201401759.

* cited by examiner

ORGANIC ELECTROLUMINESCENCE DEVICE

CROSS-REFERENCE TO RELATED APPLICATION(S)

This application claims priority to and benefits of Korean Patent Application No. 10-2020-0135932 under 35 U.S.C. § 119, filed on Oct. 20, 2020 in the Korean Intellectual Property Office, the entire contents of which are incorporated herein by reference.

BACKGROUND

1. Technical Field

The disclosure relates to an organic electroluminescence device with enhanced service life and luminous efficiency.

2. Description of the Related Art

Active development continues for an organic electroluminescence display as an image display device. In contrast to a liquid crystal display and the like, the organic electroluminescence display apparatus is a so-called self-luminescent display apparatus in which holes and electrons respectively injected from a first electrode and a second electrode recombine in an emission layer so that a light-emitting material including an organic compound in the emission layer emits light to achieve display.

In the application of an organic electroluminescence device to a display apparatus, there is a need to decrease driving voltage and increase luminous efficiency and service life of an organic electroluminescence device, and continuous development is required for materials for an organic electroluminescence device which stably achieves such qualities.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an organic electroluminescence device with improved service life and luminous efficiency by disposing an exciton diffusion layer adjacent to an emission layer.

An embodiment provides an organic electroluminescence device that may include a first electrode, a hole transport region disposed on the first electrode, an exciton diffusion layer disposed on the hole transport region and including a first host, an emission layer disposed on the exciton diffusion layer and including a second host, a third host, and a phosphorescent dopant, an electron transport region disposed on the emission layer, and a second electrode disposed on the electron transport region. The first host may be represented by Formula 1 below:

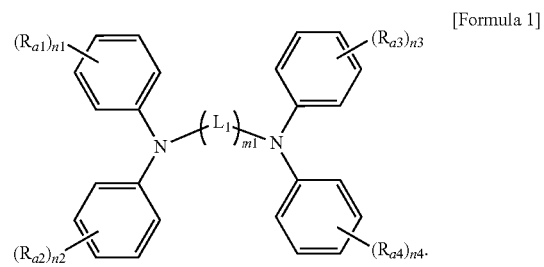

[Formula 1]

In Formula 1 above, $L_1$ may be a substituted or unsubstituted ring-forming arylene group having 6 to 30 carbon atoms, or a substituted or unsubstituted ring-forming heteroarylene group having 2 to 30 carbon atoms, and $R_{a1}$ to $R_{a4}$ may each independently be a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. In Formula 1, m1 may be 1 or 2, and n1 to n4 may each independently be an integer from 0 to 5.

In an embodiment, an absolute value of a highest occupied molecular orbital (HOMO) energy level of the first host may be in a range of about 4.7 eV to about 5.1 eV.

In an embodiment, an absolute value of a difference between a highest occupied molecular orbital (HOMO) energy level of the first host and a highest occupied molecular orbital (HOMO) energy level of the second host may be in a range of about 0.2 eV to about 1.5 eV, and an absolute value of a difference between the highest occupied molecular orbital (HOMO) energy level of the first host and a highest occupied molecular orbital (HOMO) energy level of the third host may be in a range of about 0.2 eV to about 1.5 eV.

In an embodiment, a thickness of the exciton diffusion layer may be less than or equal to a triplet exciton diffusion length of the first host.

In an embodiment, the hole transport region may include a hole injection layer disposed on the first electrode, a hole transport layer disposed on the hole injection layer, and an electron blocking layer disposed on the hole transport layer.

In an embodiment, the phosphorescent dopant may be an organometallic complex containing Pt as a central metal atom.

In an embodiment, $L_1$ in Formula 1 above may be represented by any one among Formula 2-1 to Formula 2-3 below.

[Formula 2-1]

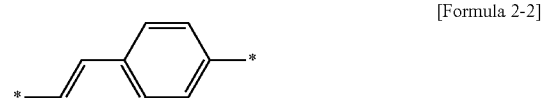

[Formula 2-2]

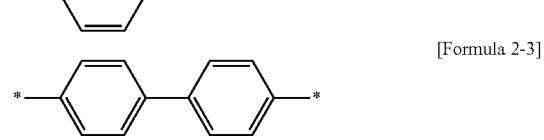

[Formula 2-3]

In Formula 2-1 to 2-3, * indicates a binding site to a neighboring atom.

In an embodiment, the second host may be represented by any one among Formula 3-1 to Formula 3-4 below.

[Formula 3-1]

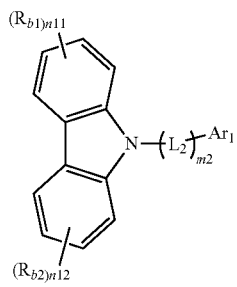

[Formula 3-2]

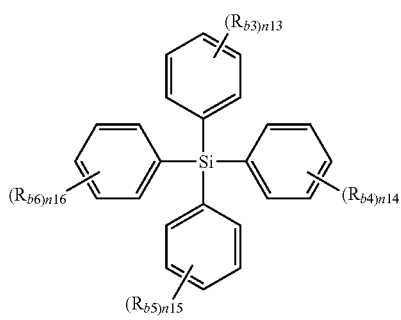

[Formula 3-2]

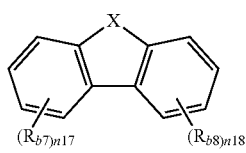

[Formula 3-4]

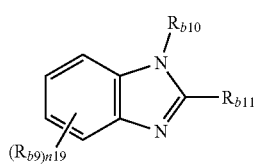

In Formula 3-1 to Formula 3-4 above, $R_{b1}$ and $R_{b2}$ may each independently be a hydrogen atom, a deuterium atom, a halogen atom, a substituted or unsubstituted phosphine oxide group, a substituted or unsubstituted silyl group, a substituted or unsubstituted alkyl group having 1 to 30 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring. In Formula 3-1 to Formula 3-4, $L_2$ may be a direct linkage, a substituted or unsubstituted ring-forming arylene group having 6 to 30 carbon atoms, or a substituted or unsubstituted ring-forming heteroarylene group having 2 to 30 carbon atoms, and $Ar_1$ may be a substituted or unsubstituted alkyl group having 1 to 30 carbon atoms, a substituted or unsubstituted ring-forming hydrocarbon ring group having 4 to 30 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring. In Formula 3-1 to Formula 3-4, $R_{b3}$ to $R_{b6}$ may each independently be a hydrogen atom, a deuterium atom, a halogen atom, a substituted or unsubstituted silyl group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. In Formula 3-1 to Formula 3-4, X may be O or S, and $R_{b7}$ and $R_{b8}$ may each independently be a hydrogen atom, a deuterium atom, a halogen atom, a substituted or unsubstituted phosphine oxide group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. In Formula 3-1 to Formula 3-4, $R_{b9}$ may be a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, and $R_{b10}$ and $R_{b11}$ may each independently be a substituted or unsubstituted ring-forming aryl group having 6 to 30 carbon atoms, or a substituted or unsubstituted ring-forming heteroaryl group having 2 to 30 carbon atoms. In Formula 3-1 to Formula 3-4, m2 may be an integer from 0 to 4, n11, n12, and n17 to n19 may each independently be an integer from 0 to 4, and n13 to n16 may each independently be an integer from 0 to 5.

In an embodiment, the third host may be represented by Formula 4 below.

[Formula 4]

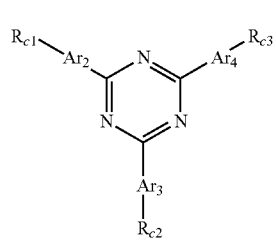

In Formula 4 above, $Ar_2$ to $Ar_4$ may each independently be a direct linkage, a substituted or unsubstituted ring-forming arylene group having 6 to 30 carbon atoms, or a substituted or unsubstituted ring-forming heteroarylene group having 2 to 30 carbon atoms, and $R_{c1}$ to $R_{c3}$ may each independently be a hydrogen atom, a deuterium atom, a halogen atom, a substituted or unsubstituted amine group, a substituted or unsubstituted alkoxy group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In an embodiment, the phosphorescent dopant may be represented by Formula 5 below.

$MT_1(T_2)_d$ [Formula 5]

In Formula 5 above, M may be Pt, $T_1$ may be represented by Formula 5-1 or Formula 5-2 below, $T_2$ may be a monovalent ligand, and d may be 0 or 1.

[Formula 5-1]

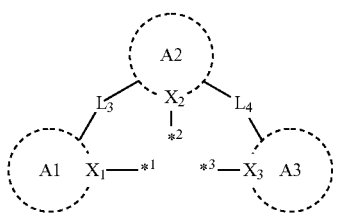

[Formula 5-2]

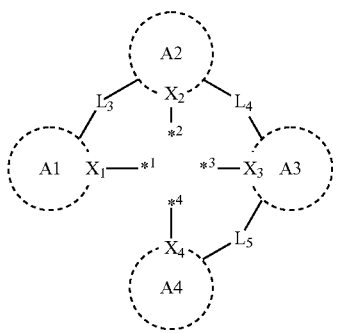

In Formula 5-1 and Formula 5-2 above, $X_1$ to $X_4$ may each independently be N or C, A1 to A4 may each independently be a substituted or unsubstituted ring-forming monocyclic or polycyclic hydrocarbon ring group having 6 to 30 carbon atoms, or a substituted or unsubstituted ring-forming monocyclic or polycyclic heterocyclic group having 2 to 30 carbon atoms, $L_3$ to $L_5$ may each independently a direct linkage, O, or S, and *¹ to *⁴ are each independently a binding site to M.

In an embodiment, A1 and A4 may each independently be represented by any one among Formula 6-1 to Formula 6-6 below.

[Formula 6-1]

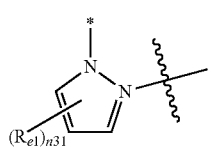

[Formula 6-2]

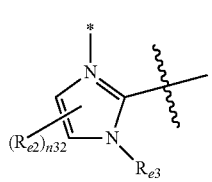

[Formula 6-3]

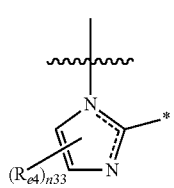

[Formula 6-4]

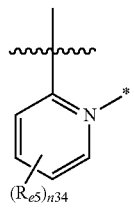

[Formula 6-5]

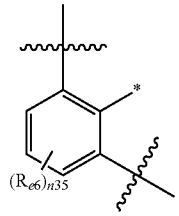

[Formula 6-6]

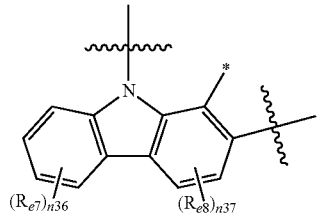

In Formula 6-1 to 6-6 above, $R_{e1}$ to $R_{e8}$ may each independently be a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring. In Formula 6-1 to 6-6, n31 and n35 may each independently be an integer from 0 to 3, n32, n33, and n37 may each independently be an integer from 0 to 2, n34 and n36 may each independently be an integer of 0 to 4, —* indicates a binding position to a Pt atom, and

indicates a binding position to an adjacent group.

In an embodiment, the first host may be any one among compounds represented in Compound Group 1 below.

In an embodiment, the second host may be any one among compounds represented in Compound Group 2 below.

In an embodiment, the third host may be any one among compounds represented in Compound Group 3 below.

In an embodiment, the phosphorescent dopant may be any one among compounds represented in Compound Group 4 below.

In an embodiment, a content of the phosphorescent dopant may be in a range of about 10 wt % to about 16 wt % based on the total weight of the second host, the third host, and the phosphorescent dopant.

In an embodiment, an organic electroluminescence device may include a first electrode, a hole injection layer disposed on the first electrode, a hole transport layer disposed on the hole injection layer, an electron blocking layer disposed on the hole transport layer, an exciton diffusion layer disposed on the electron blocking layer and including a first host that transports holes, an emission layer disposed on the exciton diffusion layer and including a second host that transports holes, a third host that transports electrons, and a phosphorescent dopant including Pt, an electron transport layer disposed on the emission layer, an electron injection layer disposed on the electron transport layer, and a second electrode disposed on the electron injection layer. An absolute value of a highest occupied molecular orbital (HOMO) energy level of the first host may be in a range of about 4.7 eV to about 5.1 eV.

In an embodiment, the first host may be represented by Formula 1 below.

[Formula 1]

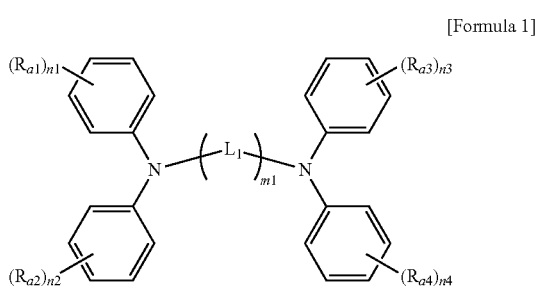

In Formula 1 above, $L_1$ may be a substituted or unsubstituted ring-forming arylene group having 6 to 30 carbon atoms, or a substituted or unsubstituted ring-forming heteroarylene group having 2 to 30 carbon atoms, and $R_{a1}$ to $R_{a4}$ may each independently be a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. In Formula 1, m1 may be 1 or 2, and n1 to n4 may each independently be an integer from 0 to 5.

In an embodiment, a thickness of the exciton diffusion layer may be less than or equal to a triplet exciton diffusion length of the first host.

In an embodiment, an absolute value of a difference between a highest occupied molecular orbital (HOMO) energy level of the first host and a highest occupied molecular orbital (HOMO) energy level of the second host may be in a range of about 0.2 eV to about 1.5 eV, and an absolute value of a difference between the highest occupied molecular orbital (HOMO) energy level of the first host and a highest occupied molecular orbital (HOMO) energy level of the third host may be in a range of about 0.2 eV to about 1.5 eV.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
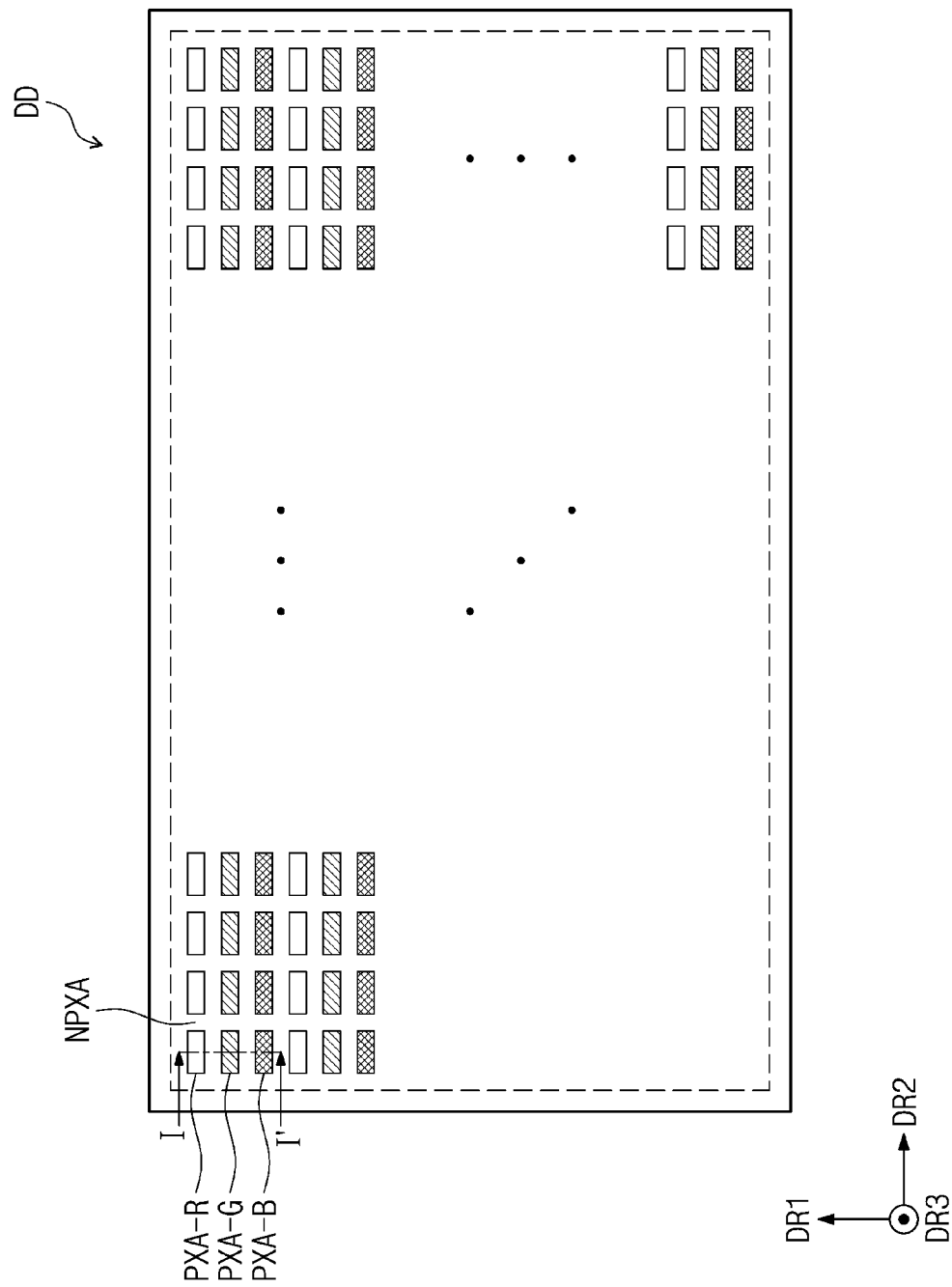
FIG. 1 is a plan view illustrating a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be explained with reference to the drawings.

Figure 2:
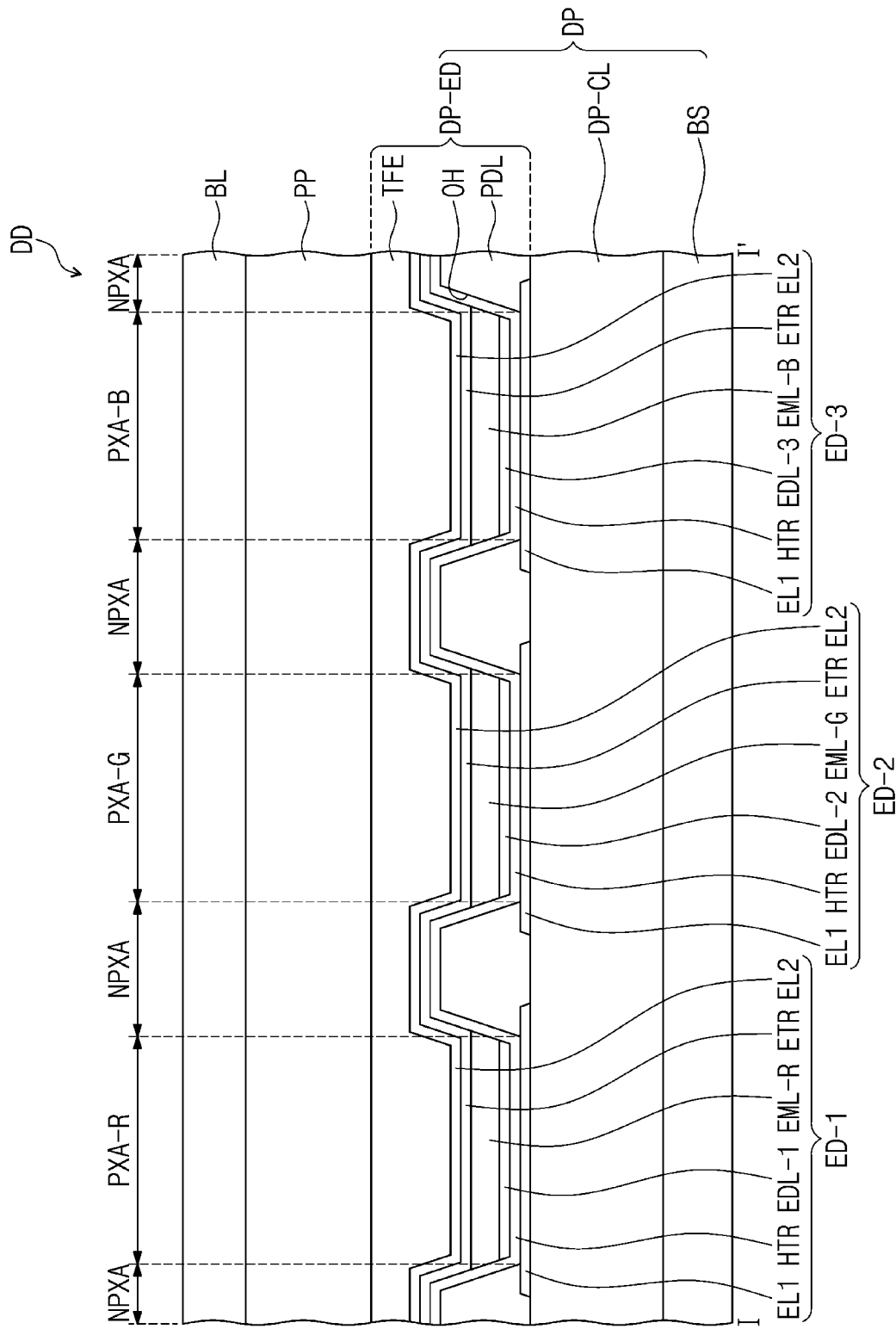
FIG. 2 is a schematic cross-sectional view illustrating a display apparatus according to an embodiment.

FIG. 1 is a plan view illustrating an embodiment of a display apparatus DD. FIG. 2 is a schematic cross-sectional view of a display apparatus DD according to an embodiment. FIG. 2 is a schematic cross-sectional view illustrating a portion corresponding to line I-I' in FIG. 1.

The display apparatus DD may include a display panel DP and an optical layer PP disposed on the display panel DP. The display apparatus DD according to an embodiment includes organic electroluminescence devices ED-1, ED-2, and ED-3, and at least one of the organic electroluminescence devices ED-1, ED-2, and ED-3 includes exciton diffusion layers EDL-1, EDL-2, and EDL-3.

The optical layer PP may be disposed on the display panel DP and control light reflected from an external light on the display panel DP. The optical layer PP may include, for example, a polarization layer or a color filter layer. Although not shown in the drawings, the optical layer PP may be omitted in the display apparatus DD according to another embodiment.

A base substrate BL may be disposed on the optical layer PP. The base substrate BL may be a member that provides a base surface on which the optical layer PP is disposed. The base substrate BL may be a glass substrate, a metal substrate, a plastic substrate, or the like. However, embodiments are not limited thereto, and the base substrate BL may be an inorganic layer, an organic layer, or a composite material layer. Although not shown in the drawings, the base substrate BL may be omitted in another embodiment.

The display apparatus DD according to an embodiment may further include a filling layer (not shown). The filling layer (not shown) may be disposed between a display device layer DP-ED and a base substrate BL. The filling layer (not shown) may be an organic material layer. The filling layer (not shown) may include at least one of acrylic-based resin, silicone-based resin, and epoxy-based resin.

The display panel DP may include a base layer BS, a circuit layer DP-CL provided on the base layer BS, and a display device layer DP-ED. The display device layer DP-ED may include a pixel-defining film PDL, organic electroluminescence devices ED-1, ED-2, and ED-3 disposed between the pixel-defining film PDL, and an encapsulating layer TFE disposed on the organic electroluminescence devices ED-1, ED-2, and ED-3.

The base layer BS may be a member that provides a base surface on which the display device layer DP-ED is disposed. The base layer BS may be a glass substrate, a metal substrate, a plastic substrate, or the like. However, embodiments are not limited thereto, and the base layer BS may be an inorganic layer, an organic layer, or a composite material layer.

In an embodiment, the circuit layer DP-CL may be disposed on the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving the organic electroluminescence devices ED-1, ED-2, and ED-3 of the display device layer DP-ED.

Each of the organic electroluminescence devices ED-1, ED-2, and ED-3 may have a structure of an organic electroluminescence device ED according to an embodiment of FIGS. 3 to 5, which will be described below. Each of the organic electroluminescence devices ED-1, ED-2, and ED-3 may include a first electrode EL1, a hole transport region HTR, exciton diffusion layers EDL-1, EDL-2, and EDL-3, emission layers EML-R, EML-G, and EML-B, an electron transport region ETR, and a second electrode EL2.

In FIG. 2, the exciton diffusion layers EDL-1, EDL-2, and EDL-3, and the emission layers EML-R, EML-G, and EML-B of the organic electroluminescence devices ED-1, ED-2, and ED-3 are disposed in an opening OH defined in the pixel-defining film PDL, and the hole transport region HTR, the electron transport region ETR, and the second electrode EL2 are provided as common layers in all of the organic electroluminescence devices ED-1, ED-2, and ED-3. However, embodiments are not limited thereto. Although not shown in FIG. 2, in an embodiment, the hole transport region HTR and the electron transport region ETR may be patterned and provided in the opening OH defined in the pixel-defining film PDL. For example, in an embodiment, the hole transport region HTR, the emission layers EML-R, EML-G, and EML-B, and the electron transport region ETR, etc. of the organic electroluminescence devices ED-1, ED-2, and ED-3 may be patterned and provided by an inkjet printing method.

An encapsulating layer TFE may cover the organic electroluminescence devices ED-1, ED-2, and ED-3. The encapsulating layer TFE may seal the display device layer DP-ED.

The encapsulating layer TFE may be a thin film encapsulating layer. The encapsulating layer TFE may be a single layer or a stack of multiple layers. The encapsulating layer TFE may include at least one insulating layer. The encapsulating layer TFE according to an embodiment may include at least one inorganic film (hereinafter, an encapsulating inorganic film). The encapsulating layer TFE according to an embodiment may include at least one organic film (hereinafter, an encapsulating organic film) and at least one encapsulating inorganic film.

The encapsulating inorganic film may protect the display device layer DP-ED from moisture and/or oxygen, and the encapsulating organic film may protect the display device layer DP-ED from foreign materials such as dust particles. The encapsulating inorganic film may include silicon nitride, silicon oxy nitride, silicon oxide, titanium oxide, aluminum oxide, or the like, but embodiments are not limited thereto. The encapsulating organic film may include an acrylic-based compound, an epoxy-based compound, or the like. The encapsulating organic film may include an organic material capable of photopolymerization, but embodiments are not limited thereto.

The encapsulating layer TFE may be disposed on the second electrode EL2 and may be disposed to fill the opening OH.

Referring to FIG. 1 and FIG. 2, the display apparatus DD may include a non-light emitting region NPXA and light-emitting regions PXA-R, PXA-G, and PXA-B. Each of the light-emitting regions PXA-R, PXA-G, and PXA-B may be a region in which light generated from each of the organic electroluminescence devices ED-1, ED-2, and ED-3 is emitted. The light-emitting regions PXA-R, PXA-G, and PXA-B may be spaced apart from each other on a plane.

Each of the light-emitting regions PXA-R, PXA-G, and PXA-B may be a region separated by the pixel-defining film PDL. The non-light emitting regions NPXA may be regions interposed between the neighboring light-emitting regions PXA-R, PXA-G, and PXA-B, and may be regions corresponding to the pixel-defining film PDL. In the disclosure, the light-emitting regions PXA-R, PXA-G, and PXA-B may respectively correspond to pixels. The pixel-defining film PDL may separate the organic electroluminescence devices ED-1, ED-2, and ED-3. Emission layers EML-R, EML-G, and EML-B of the organic electroluminescence devices ED-1, ED-2, and ED-3 may be disposed in the opening OH defined in the pixel-defining film PDL and separated from each other.

The light-emitting regions PXA-R, PXA-G, and PXA-B may be arranged into groups according to the color of light generated from the organic electroluminescence devices ED-1, ED-2, and ED-3. In the display apparatus DD according to an embodiment shown in FIG. 1 and FIG. 2, three light-emitting regions PXA-R, PXA-G, and PXA-B respectively emitting red light, green light, and blue light are illustrated by way of example. For example, the display apparatus DD according to an embodiment may include a red light-emitting region PXA-R, a green light-emitting region PXA-G, and a blue light-emitting region PXA-B, which are separated from each other.

In the display apparatus DD according to an embodiment, the organic electroluminescence devices ED-1, ED-2, and ED-3 may each emit light of different wavelength regions. For example, in an embodiment, the display apparatus DD may include a first organic electroluminescence device ED-1 emitting red light, a second organic electroluminescence device ED-2 emitting green light, and a third organic electroluminescence device ED-3 emitting blue light. For example, the red light-emitting region PXA-R, the green light-emitting region PXA-G, and the blue light-emitting region PXA-B of the display apparatus DD may correspond to the first organic electroluminescence device ED-1, the second organic electroluminescence device ED-2, and the third organic electroluminescence device ED-3, respectively.

However, embodiments are not limited thereto, and the first to third organic electroluminescence devices ED-1, ED-2, and ED-3 may emit light of the same wavelength region, or at least one thereof may emit light of a different wavelength region. For example, all of the first to third organic electroluminescence devices ED-1, ED-2, and ED-3 may emit blue light.

The light-emitting regions PXA-R, PXA-G, and PXA-B in the display apparatus DD according to an embodiment may be arranged in a stripe shape. Referring to FIG. 1, red light-emitting regions PXA-R, green light-emitting regions PXA-G, and blue light-emitting regions PXA-B may be arranged respectively along a second direction DR2. The red light-emitting region PXA-R, the green light-emitting region PXA-G, and the blue light-emitting region PXA-B may be alternatively arranged in order along a first direction DR1.

FIG. 1 and FIG. 2 illustrate that areas of the light-emitting regions PXA-R, PXA-G, and PXA-B are all similar, but embodiments are not limited thereto. The areas of the light-emitting regions PXA-R, PXA-G, and PXA-B may be different from each other depending on the wavelength region of the emitted light. For example, the areas of the light-emitting regions PXA-R, PXA-G, and PXA-B may be areas in a plan view that are defined by the first direction DR1 and the second direction DR2.

An arrangement of the light-emitting regions PXA-R, PXA-G, and PXA-B is not limited to what is illustrated in FIG. 1, and the arrangement order of the red light-emitting region PXA-R, the green light-emitting region PXA-G, and the blue light-emitting region PXA-B may be provided in various combinations depending on the required characteristics of display quality in the display apparatus DD. For example, the light-emitting regions PXA-R, PXA-G, and PXA-B may be arranged in a PenTile® arrangement or in a diamond arrangement.

The areas of the light-emitting regions PXA-R, PXA-G, and PXA-B may be different from each other. For example, in an embodiment, the area of the green light-emitting region PXA-G may be smaller than the area of the blue light-emitting region PXA-B, but embodiments are not limited thereto.

Figure 3:
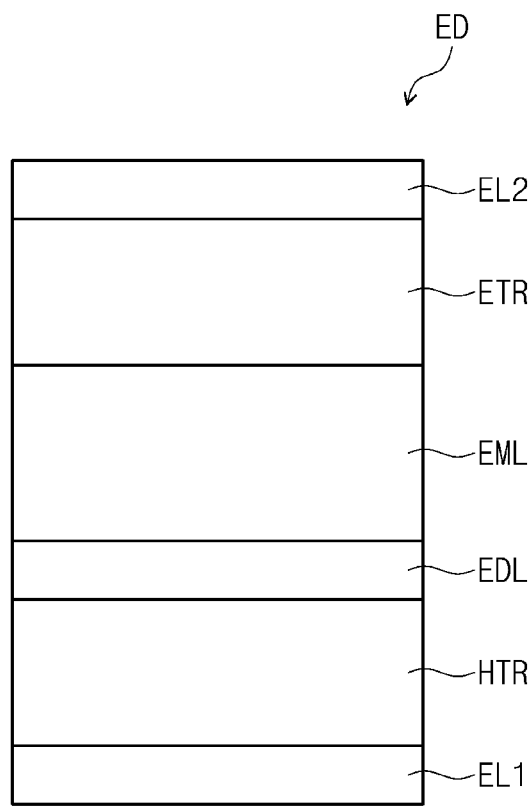
FIG. 3 is a schematic cross-sectional view illustrating an organic electroluminescence device according to an embodiment.
Figure 4:
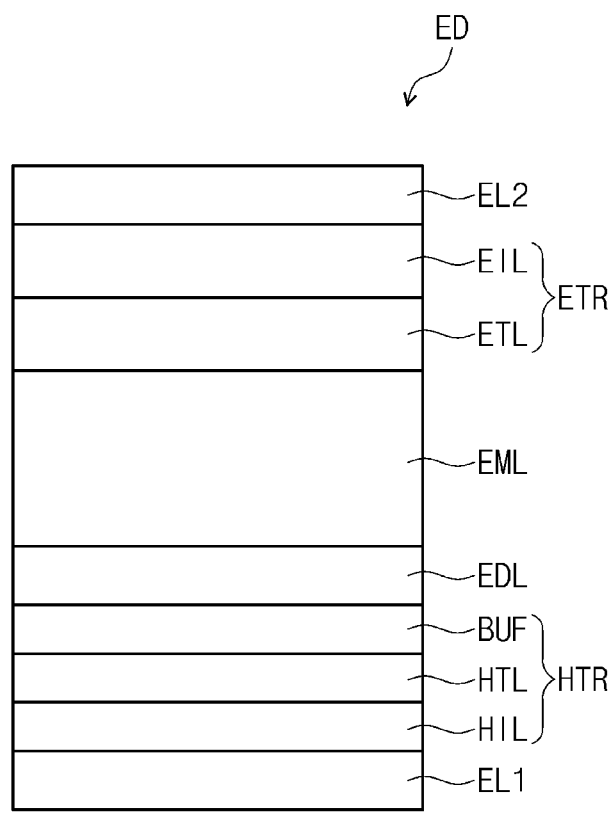
FIG. 4 is a schematic cross-sectional view illustrating an organic electroluminescence device according to an embodiment.
Figure 5:
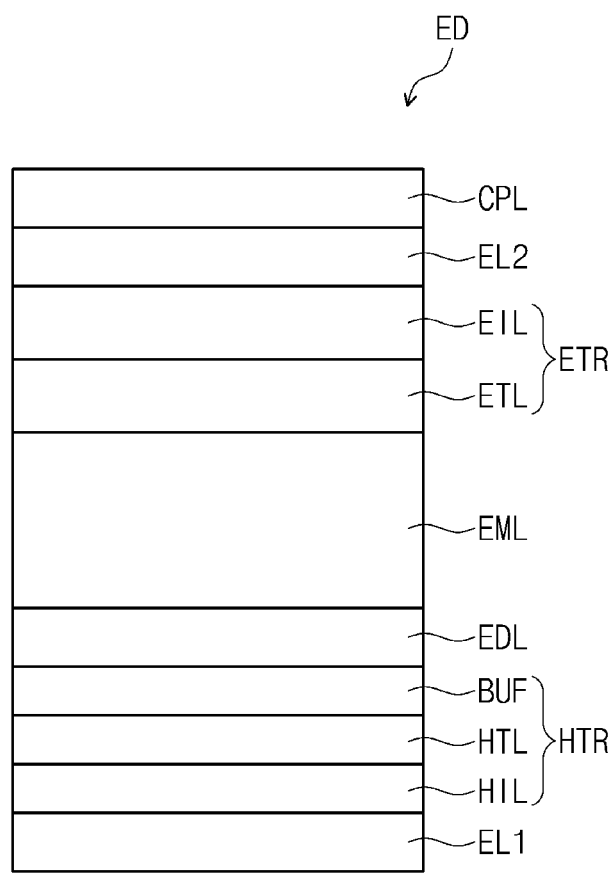
FIG. 5 is a schematic cross-sectional view illustrating an organic electroluminescence device according to an embodiment.

Hereinafter, FIGS. 3 to 5 are schematic cross-sectional views illustrating an organic electroluminescence device according to an embodiment. The organic electroluminescence device ED according to an embodiment may include a first electrode EL1, a hole transport region HTR, an exciton diffusion layer EDL, an emission layer EML, an electron transport region ETR, and a second electrode EL2 which are sequentially stacked. The organic electroluminescence device ED according to an embodiment includes exciton diffusion layers EDL-1, EDL-2, and EDL-3 between the hole transport region HTR and the emission layer EML.

In comparison to FIG. 3, FIG. 4 shows a schematic cross-sectional view of an organic electroluminescence device ED according to an embodiment, wherein a hole transport region HTR includes a hole injection layer HIL, a hole transport layer HTL, and an electron blocking layer BUF, and an electron transport region ETR includes an electron injection layer EIL and an electron transport layer ETL. In comparison to FIG. 4, FIG. 5 shows a schematic cross-sectional view of an organic electroluminescence device ED according to an embodiment, which includes a capping layer CPL disposed on the second electrode EL2. However, embodiments are not limited thereto, and the hole transport region HTR may further include an emission auxiliary layer (not shown), etc. as a sub-organic layer, and the electron transport region ETR may further include a hole blocking layer (not shown), etc. as a sub-organic layer.

The first electrode EL1 has conductivity. The first electrode EL1 may be formed using a metal material, a metal alloy, or a conductive compound. The first electrode EL1 may be an anode or a cathode. However, embodiments are not limited thereto. In an embodiment, the first electrode EL1 may be a pixel electrode. The first electrode EL1 may be a transmissive electrode, a transflective electrode, or a reflective electrode. If the first electrode EL1 is a transmissive electrode, the first electrode EL1 may include transparent metal oxide such as indium tin oxide (ITO), indium zinc oxide (IZO), zinc oxide (ZnO), indium tin zinc oxide (ITZO), or the like. If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, or a compound thereof, or a mixture thereof (for example, a mixture of Ag and Mg). In an embodiment, the first electrode EL1 may have a multi-layered structure including a reflective film or a transflective film formed using the above-described materials and a transparent conductive film formed using indium tin oxide (ITO), indium zinc oxide (IZO), zinc oxide (ZnO), indium tin zinc oxide (ITZO), or the like. For example, the first electrode EL1 may have a three-layer structure of ITO/Ag/ITO, but embodiments are not limited thereto. In an embodiment, the first electrode EL1 may include the above-described metal material, a combination of two or more metal materials selected from the above-described metal materials, or oxides of the above-described metal materials. A thickness of the first electrode EL1 may be in a range of about 700 Å to about 10,000 Å. For example, the thickness of the first electrode EL1 may be in a range of about 1,000 Å to about 3,000 Å.

The hole transport region HTR may be provided on the first electrode EL1. The hole transport region HTR may include at least one of a hole injection layer HIL, a hole transport layer HTL, an electron blocking layer BUF, and an emission auxiliary layer (not shown). A thickness of the hole transport region HTR may be, for example, in a range of about 50 Å to about 15,000 Å.

The hole transport region HTR may have a single layer structure formed using a single material, a single layer structure formed using different materials, or a multilayer structure having layers formed using different materials.

For example, the hole transport region HTR may have a structure of a single layer of a hole injection layer HIL or a hole transport layer HTL, and may have a structure of a single layer formed using a hole injection material and a hole transport material. The hole transport region HTR may have a structure of a single layer formed using different materials, or a structure in which a hole injection layer HIL/hole transport layer HTL, a hole injection layer HIL/hole transport layer HTL/electron blocking layer BUF, a hole injection layer HIL/electron blocking layer (BUF), or a hole transport layer HTL/electron blocking layer (BUF) are stacked in order from the first electrode EL1, but embodiments are not limited thereto.

The hole transport region HTR may be formed by using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below.

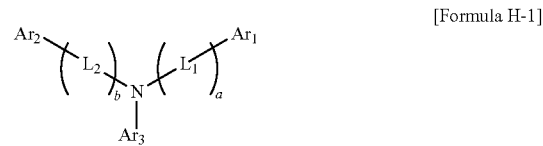

[Formula H-1]

In Formula H-1 above, $L_1$ and $L_2$ may each independently be a direct linkage, a substituted or unsubstituted ring-forming arylene group having 6 to 30 carbon atoms, or a substituted or unsubstituted ring-forming heteroarylene group having 2 to 30 carbon atoms. In Formula H-1, a and b may each independently be an integer from 0 to 10. In Formula H-1, if a or b is an integer of 2 or more, multiple $L_1(s)$ and $L_2(s)$ may each independently be a substituted or unsubstituted ring-forming arylene group having 6 to 30 carbon atoms, or a substituted or unsubstituted ring-forming heteroarylene group having 2 to 30 carbon atoms. In Formula H-1, $Ar_1$ and $Ar_2$ may each independently be a substituted or unsubstituted ring-forming aryl group having 6 to 30 carbon atoms, or a substituted or unsubstituted ring-forming heteroaryl group having 2 to 30 carbon atoms. In Formula H-1, $Ar_3$ may be a substituted or unsubstituted ring-forming aryl group having 6 to 30 carbon atoms.

The compound represented by Formula H-1 above may be a monoamine compound. In another embodiment, the compound represented by Formula H-1 above may be a diamine compound in which at least one among $Ar_1$ to $Ar_3$ includes an amine group as a substituent. The compound represented by Formula H-1 above may be a carbazole-based compound including a substituted or unsubstituted carbazole group in at least one of $Ar_1$ and $Ar_2$, or a fluorene-based compound including a substituted or unsubstituted fluorene group in at least one of $Ar_1$ and $Ar_2$.

The compound represented by Formula H-1 may be represented by any one among the compounds in Compound Group H below. However, the compounds listed in Compound Group H below are illustrative, and compound represented by Formula H-1 is not limited to those represented in Compound Group H below.

[Compound Group H]

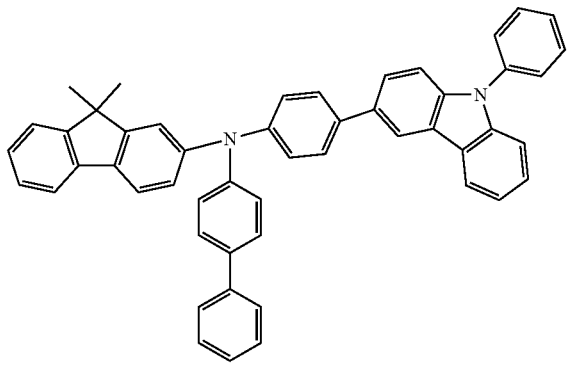

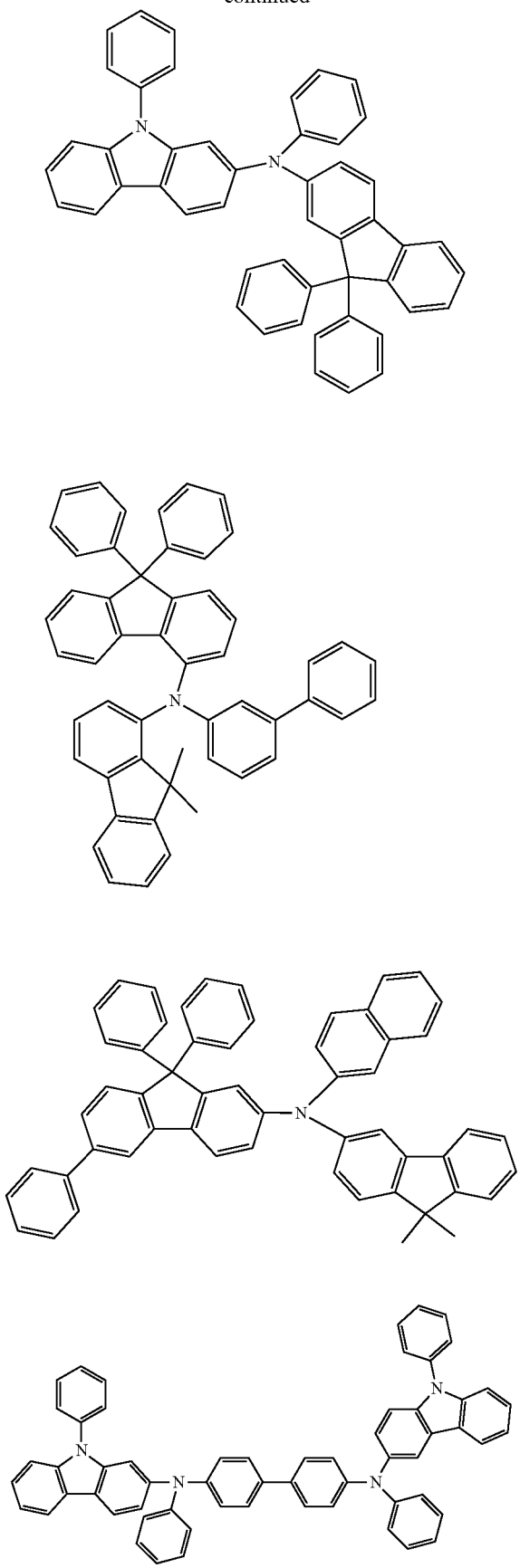
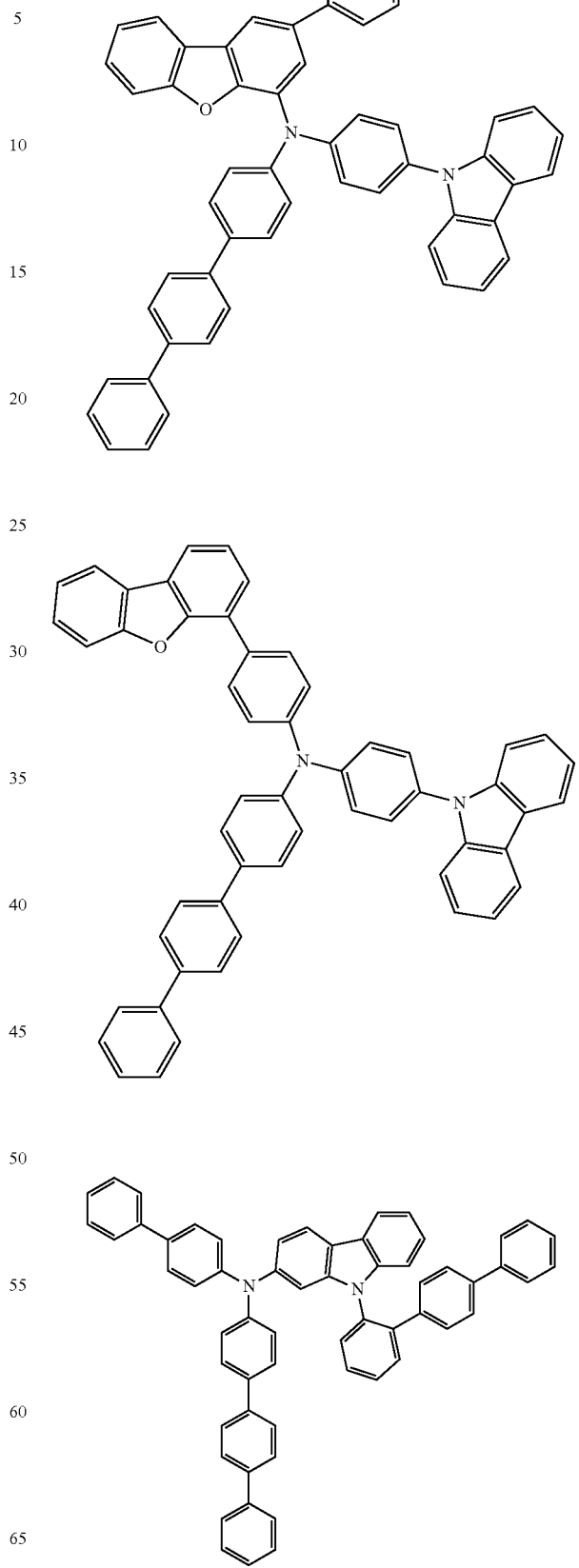

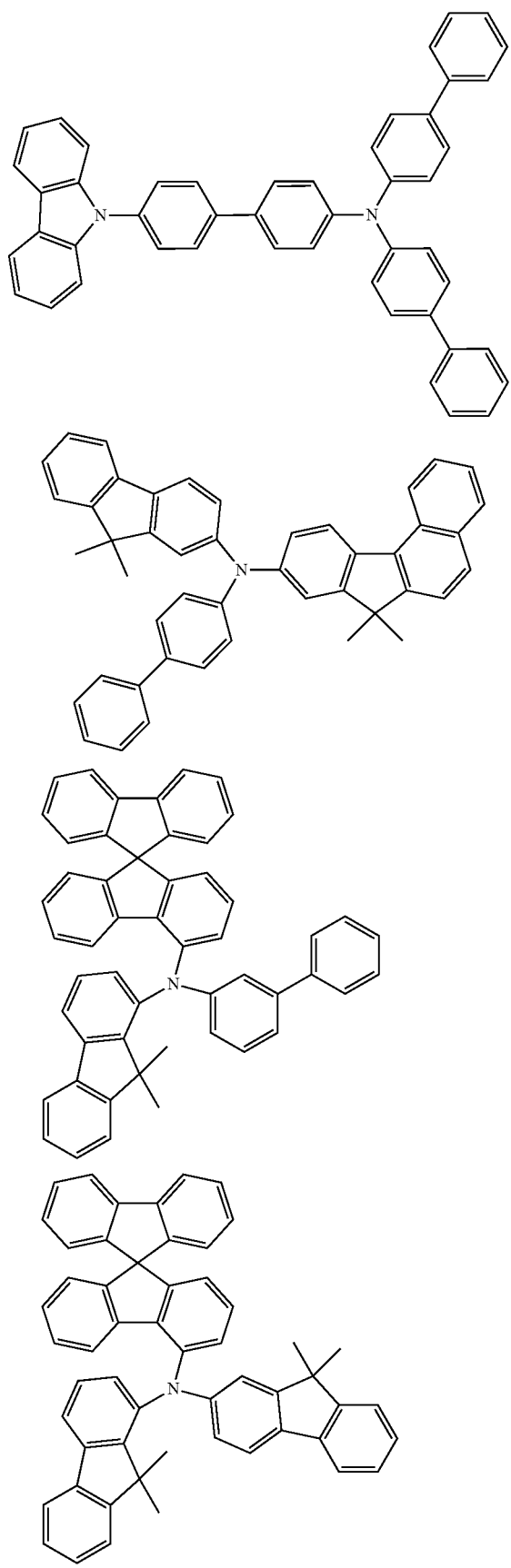
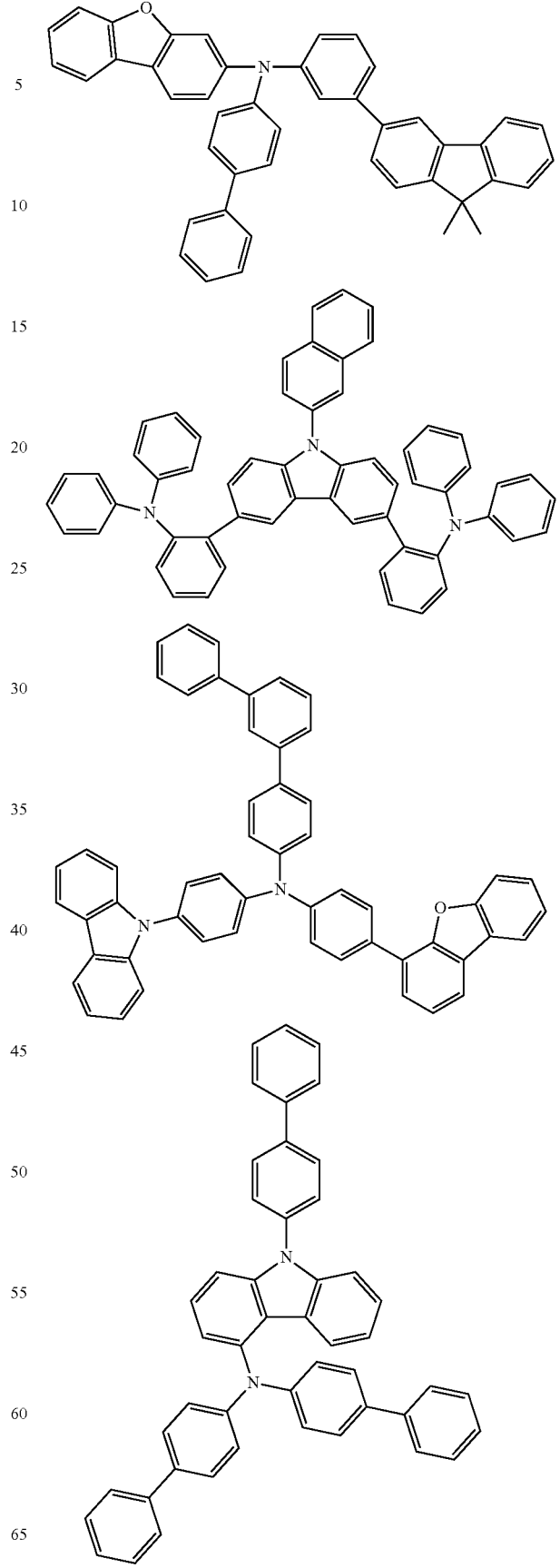

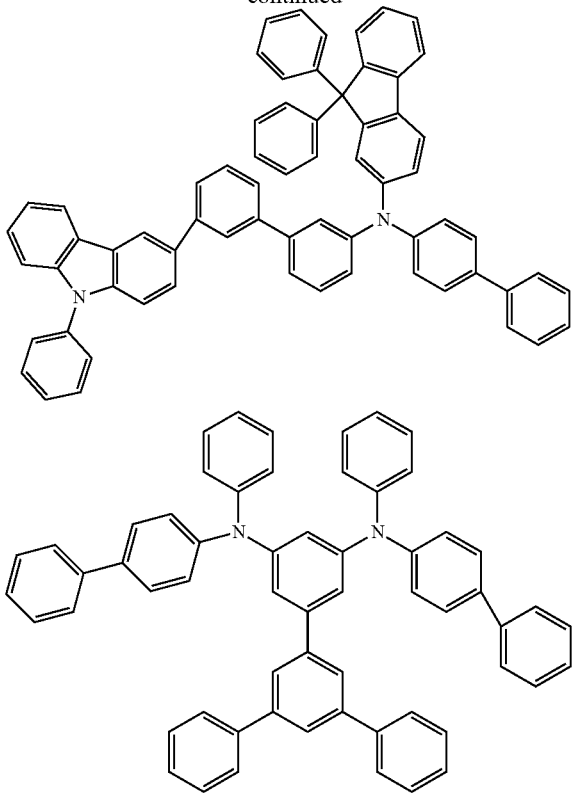

The hole transport region HTR may further include a phthalocyanine compound such as copper phthalocyanine, N¹,N¹'-([1,1'-biphenyl]-4,4'-diyl)bis(N1-phenyl-N⁴,N⁴-di-m-tolylbenzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), polyaniline/poly(4-styrenesulfonate) (PANI/PSS), N,N-di(naphthalene-1-yl)-N,N-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h] quinoxaline-2,3,6,7,10,11-hexacarbonitrile (HATCN), or the like.

The hole transport region HTR may further include a carbazole-based derivative such as N-phenyl carbazole and polyvinyl carbazole, a fluorene-based derivative, a triphenylamine-based derivative such as N,N-bis(3-methylphenyl)-N,N'-diphenyl-[1,1-biphenyl]-4,4'-diamine (TPD), 4,4', 4"-tris(N-carbazolyl)triphenylamine (TCTA), N,N'-di (naphthalene-1-yl)-N,N'-diphenyl-benzidine (NPB), 4,4'-cyclohexylidene bis[N,N-bis(4-methylphenyl) benzeneamine] (TAPC), 4,4'-bis[N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), or the like.

The hole transport region HTR may include the aforementioned compounds of the hole transport region in at least one of the hole injection layer HIL, the hole transport layer HTL, and the electron blocking layer BUF.

In an embodiment, a thickness of the hole transport region HTR may be in a range of about 100 Å to about 10,000 Å. For example, the thickness of the hole transport region HTR may be in a range of about 100 Å to about 5,000 Å. If the hole transport region HTR includes a hole injection layer HIL, a thickness of the hole injection layer HIL may be, for example, in a range of about 30 Å to about 1,000 Å. If the hole transport region HTR includes a hole transport layer HTL, a thickness of the hole transport layer HTL may be in a range of about 30 Å to about 1,000 Å. For example, if the hole transport region HTR includes an electron blocking layer BUF, a thickness of the electron blocking layer BUF may be in a range of about 10 Å to about 1,000 Å. If the thicknesses of the hole transport region HTR, the hole injection layer HIL, the hole transport layer HTL, and the electron blocking layer BUF satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may be, for example, a p-dopant. The p-dopant may include at least one among a halogenated metal compound, a quinone derivative, metal oxide, and a cyano group-containing compound, but embodiments are not limited thereto. For example, the p-dopant may include a halogenated metal compound such as CuI and RbI, a quinone derivative such as tetracyanoquinodimethane (TCNQ) and 2,3,5,6-tetrafluoro-7,7,8,8-tetracyanoquinodimethane (F4-TCNQ), and/or a metal oxide such as tungsten oxide and molybdenum oxide, but embodiments are not limited thereto.

As described above, the hole transport region HTR may further include the electron blocking layer BUF in addition to the hole injection layer HIL and the hole transport layer HTL. The electron blocking layer BUF is a layer which may prevent electron injection from the electron transport region ETR to the hole transport region HTR. The electron blocking layer BUF may compensate an optical resonance distance according to the wavelength of light emitted from the emission layer EML, and may increase luminous efficiency. A material which may be included in the hole transport region HTR may be used as a material included in the electron blocking layer BUF.

The emission layer is provided on the hole transport region HTR. The emission layer EML may have a thickness of, for example, in a range of about 100 Å to about 1.000 Å. For example, the thickness of the emission layer EML may be in a range of about 100 Å to about 300 Å. The emission layer EML may have a single layer formed using a single material, a single layer formed using different materials, or a multilayer structure having layers formed using different materials. In an embodiment, the emission layer EML may include a second host, a third host, and a phosphorescent dopant.

The exciton diffusion layer EDL is disposed between the hole transport region HTR and the emission layer EML. In an embodiment, the exciton diffusion layer EDL may include a first host material.

In an embodiment, recombination which generates an exciton by combining electrons and holes may occur in both the exciton diffusion layer EDL and the emission layer EML.

The holes injected from the first electrode EL1 may be provided to the exciton diffusion layer EDL and the emission layer EML through the hole transport region HTR. The electrons injected from the second electrode EL2 may be provided to the exciton diffusion layer EDL and the emission layer EML through the electron transport region ETR.

The electrons and the holes are recombined in the emission layer EML to generate excitons. The excitons may be transferred to the dopant, pass through the triplet excited state, and fall to the ground state to emit phosphorescence.

The electrons and the holes are also respectively recombined in the exciton diffusion layer EDL to generate excitons. Triplet excitons of the first host may be diffused into an interface between the exciton diffusion layer EDL and the emission layer EML by diffusion. For example, the diffused triplet excitons are transferred to the dopant included in the emission layer EML and finally fall from the triplet excited state of the dopant to the ground state, resulting in phosphorescence emission.

Accordingly, all excitons formed by recombination in the exciton diffusion layer EDL and the emission layer EML may be transferred to the dopant in the emission layer EML and emit light, and thus light efficiency and service life of the organic electroluminescence device ED may be improved.

In an embodiment, an absolute value of a highest occupied molecular orbital (HOMO) energy level of a first host may be in a range of about 4.7 eV to about 5.1 eV. If the absolute value of the highest occupied molecular orbital (HOMO) energy level of the first host satisfies the above-described range, the injection of holes into the exciton diffusion layer EDL may be facilitated, and a recombination region may be formed in the exciton diffusion layer EDL.

In an embodiment, a thickness of the exciton diffusion layer may be less than or equal to a triplet exciton diffusion length of the first host. For example, the thickness of the exciton diffusion layer EDL may be appropriately selected within the diffusion length according to the triplet exciton diffusion length of the first host. For example, if the triplet exciton diffusion length of the first host is about 5 nm, a thickness of the exciton diffusion layer EDL may be up to about 5 nm. If the thickness of the exciton diffusion layer EDL is longer than the triplet exciton diffusion length of the first host, diffusion of excitons into the emission layer EML may be likely to reduce as the triplex exciton is deactivated during diffusion. In an embodiment, a thickness of the exciton diffusion layer may be in a range of about 2 nm to about 17 nm.

In the description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents may be substituted or unsubstituted. For example, a biphenyl group may be interpreted as an aryl group or a phenyl group substituted with a phenyl group.

In the description, the term "combining with an adjacent group to form a ring" may mean combining with an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and heterocycle may be monocyclic or polycyclic. In an embodiment, a ring formed via the combining with an adjacent group may be linked with another ring to form a Spiro structure.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. For example, in 4,5-dimethylphenanthrene, two methyl groups may be interpreted as "adjacent groups" to each other.

In the description, examples of the halogen atom may include a fluorine atom, a chlorine atom, a bromine atom, and an iodine atom.

In the description, the alkyl group may be a linear, branched, or cyclic type. The number of carbon atoms in the alkyl group may be 1 to 50, 1 to 30, 1 to 20, 1 to 10, or 1 to 6. Examples of the alkyl group may include, but are not limited to, methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, and so on.

In the description, the hydrocarbon ring group may be any functional group or substituent derived from an aliphatic hydrocarbon ring. The hydrocarbon ring group may be a saturated ring-forming hydrocarbon ring group having 5 to 20 carbon atoms.

In the description, the aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include, but are not limited to, phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, and so on.

In the description, the heterocyclic group may be any functional group or substituent derived from a ring including one or more among B, O, N, P, Si, and S as a heteroatom. The heterocyclic group may include an aliphatic heterocyclic group and an aromatic heterocyclic group. The aromatic heterocyclic group may be a heteroaryl group. The aliphatic heterocycle and the aromatic heterocycle may be monocyclic or polycyclic.

In the description, the heterocyclic group may include one or more among B, O, N, P, Si, and S as a heteroatom. If the heterocyclic group includes two or more heteroatoms, two or more heteroatoms may be the same as or different from each other. The heterocyclic group may be a monocyclic heterocyclic group or a polycyclic heterocyclic group, and may include a heteroaryl group. The number of ring-forming carbon atoms in the heterocyclic group may be 2 to 30, 2 to 20, or 2 to 10.

In the description, the heteroaryl group may include one or more among B, O, N, P, Si, and S as a heteroatom. If the heteroaryl group includes two or more heteroatoms, two or more heteroatoms may be the same as or different from each other. The heteroaryl group may be a monocyclic heterocyclic group or a polycyclic heterocyclic group. The number of ring-forming carbon atoms in the heteroaryl group may be 2 to 30, 2 to 20, or 2 to 10. Examples of the heteroaryl group include, but are not limited to, thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isoxazole, oxazole, oxadiazole, thiadiazole, phenothiazine, dibenzosilole, dibenzofuran, and so on.

In the description, the aforementioned description for the aryl group may be applied to an arylene group, except that the arylene group is a divalent group. The aforementioned description for the heteroaryl group may be applied to a heteroarylene group except that the heteroarylene group is a divalent group.

In the description, a direct linkage may be a single bond.

In the description

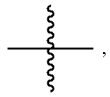

—*, and * may each indicate a binding site to a neighboring atom.

In an embodiment, a first host may be represented by Formula 1 below.

[Formula 1]

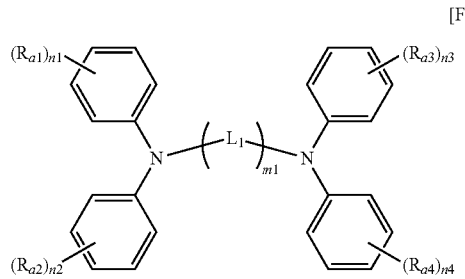

In Formula 1, $L_1$ may be a substituted or unsubstituted ring-forming arylene group having 6 to 30 carbon atoms, or a substituted or unsubstituted ring-forming heteroarylene group having 2 to 30 carbon atoms.

In Formula 1, $R_{a1}$ to $R_{a4}$ may each independently be a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 1, m1 may be 1 or 2. If m1 is 2, multiple $L_1$(s) may be the same as or different from each other.

In Formula 1, n1 may be an integer from 0 to 5. If n1 is 2 or more, multiple $R_{a1}$(s) may be the same as or different from each other.

In Formula 1, n2 may be an integer from 0 to 5. If n2 is 2 or more, multiple $R_{a2}$(s) may be the same as or different from each other.

In Formula 1, n3 may be an integer from 0 to 5. If n3 is 2 or more, multiple $R_{a3}$(s) may be the same as or different from each other.

In Formula 1, n4 may be an integer from 0 to 5. If n4 is 2 or more, multiple $R_{a4}$(s) may be the same as or different from each other.

In an embodiment, $L_1$ in Formula 1 may be represented by any one among Formula 2-1 to Formula 2-3 below.

[Formula 2-1]

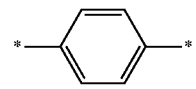

[Formula 2-2]

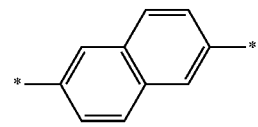

[Formula 2-3]

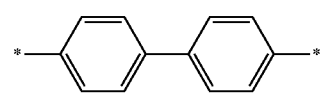

In Formula 2-1 to Formula 2-3, * indicates a binding site to a neighboring atom.

A first host represented by Formula 1 according to an embodiment may be any one selected from compounds represented in Compound Group 1 below. However, embodiments are not limited thereto.

[Compound Group 1]

HTa-1

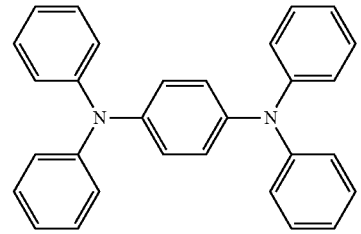

HTa-2

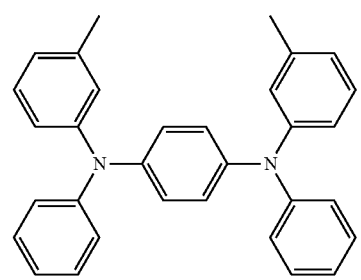

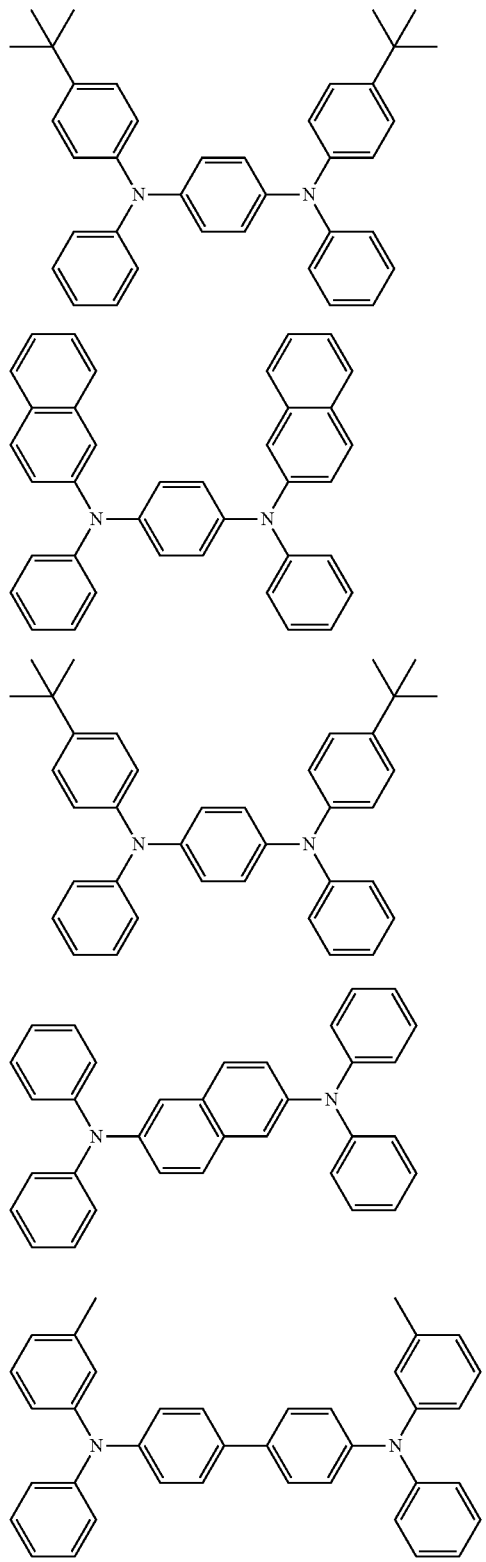

HTa-3

HTa-4

HTa-5

HTa-6

HTa-7

In an embodiment, an emission layer EML may include a second host that is capable of transporting holes, a third host that is capable of transporting electrons, and a phosphorescent dopant. Holes and electrons may be easily injected into the emission layer EML by including both the second host which is capable of transporting holes and the third host which is capable of transporting electrons in the emission layer EML. A charge balance within the emission layer EML may be increased, thereby exhibiting high luminous efficiency and long service life characteristics.

In an embodiment, the second host may be represented by any one among Formula 3-1 to Formula 3-4 below.

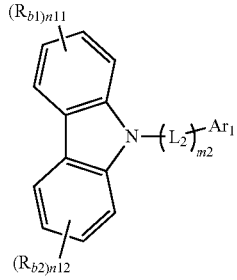

[Formula 3-1]

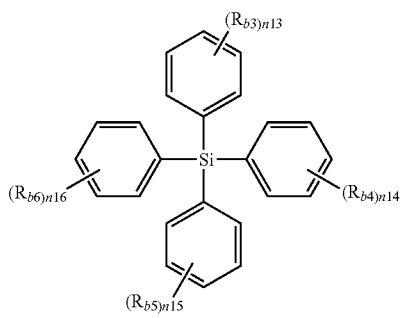

[Formula 3-2]

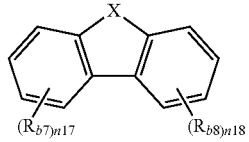

[Formula 3-3]

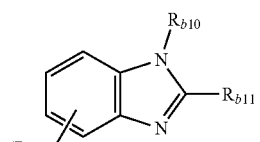

[Formula 3-4]

In Formula 3-1, $R_{b1}$ and $R_{b2}$ may each independently be a hydrogen atom, a deuterium atom, a halogen atom, a substituted or unsubstituted phosphine oxide group, a substituted or unsubstituted silyl group, a substituted or unsubstituted alkyl group having 1 to 30 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring.

In Formula 3-1, $L_2$ may be a direct linkage, a substituted or unsubstituted ring-forming arylene group having 6 to 30 carbon atoms, or a substituted or unsubstituted ring-forming heteroarylene group having 2 to 30 carbon atoms.

In Formula 3-1, $Ar_1$ may be a substituted or unsubstituted alkyl group having 1 to 30 carbon atoms, a substituted or unsubstituted ring-forming hydrocarbon ring group having 4 to 30 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring.

In Formula 3-1, m2 may be an integer from 0 to 4. If m2 is 2 or more, multiple L$_2$(s) may be the same as or different from each other.

In Formula 3-1, n11 may be an integer from 0 to 4. If n11 is 2 or more, multiple R$_b$1 (s) may be the same as or different from each other.

In Formula 3-1, n12 may be an integer from 0 to 4. If n12 is 2 or more, multiple R$_b$2 (s) may be the same as or different from each other.

In Formula 3-2, R$_{b3}$ to R$_{b6}$ may each independently be a hydrogen atom, a deuterium atom, a halogen atom, a substituted or unsubstituted silyl group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 3-2, n13 may be an integer from 0 to 5. If n13 is 2 or more, multiple R$_{b3}$(s) may be the same as or different from each other.

In Formula 3-2, n14 may be an integer from 0 to 5. If n14 is 2 or more, multiple R$_{b4}$(s) may be the same as or different from each other.

In Formula 3-2, n15 may be an integer from 0 to 5. If n15 is 2 or more, multiple R$_{b5}$(s) may be the same as or different from each other.

In Formula 3-2, n16 may be an integer from 0 to 5. If n16 is 2 or more, multiple R$_{b6}$(s) may be the same as or different from each other.

In Formula 3-3, X may be O or S, and R$_{b7}$ and R$_b$g may each independently be a hydrogen atom, a deuterium atom, a halogen atom, a substituted or unsubstituted phosphine oxide group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 3-3, n17 may be an integer from 0 to 4. If n17 is 2 or more, multiple R$_{b7}$(s) may be the same as or different from each other.

In Formula 3-3, n18 may be an integer from 0 to 4. If n18 is 2 or more, multiple R$_{b8}$(s) may be the same as or different from each other.

In Formula 3-4, R$_{b9}$ may be a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula 3-4, R$_{b10}$ and R$_{b11}$ may each independently be a substituted or unsubstituted ring-forming aryl group having 6 to 30 carbon atoms, or a substituted or unsubstituted ring-forming heteroaryl group having 2 to 30 carbon atoms.

In Formula 3-4, n19 may be an integer from 0 to 4. If n19 is 2 or more, multiple R$_{b9}$(s) may be the same as or different from each other.

In an embodiment, L$_2$ in Formula 3-1 may be a biphenylene group.

The second host represented by Formula 3-1 to Formula 3-4 according to an embodiment may be any one selected from compounds represented in Compound Group 2 below. However, embodiments are not limited thereto.

[Compound Group 2]

HTb-01
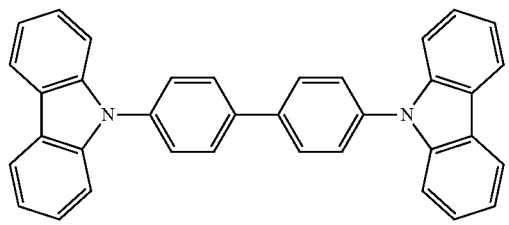

HTb-02
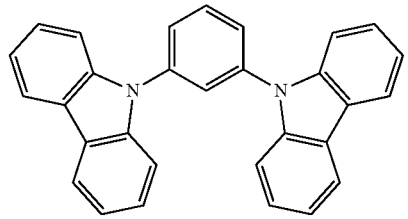

HTb-03
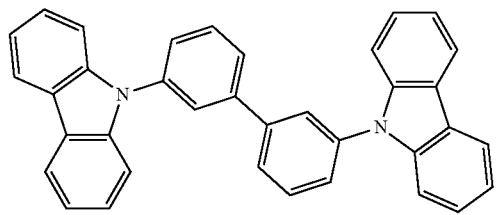

HTb-04
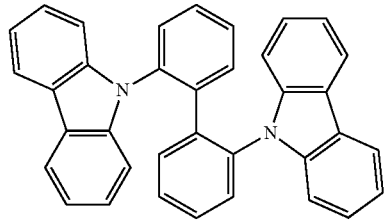

HTb-05
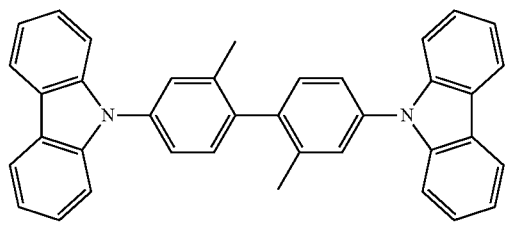

HTb-06
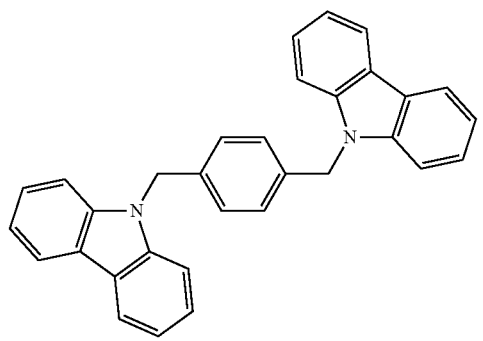

HTb-07
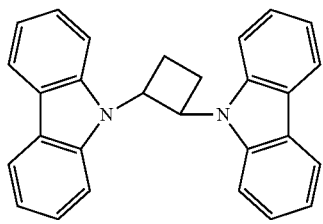
HTb-08
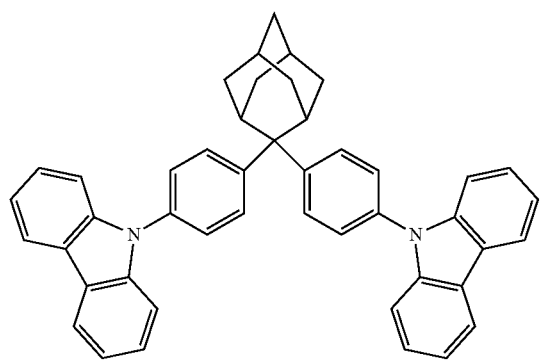
HTb-09
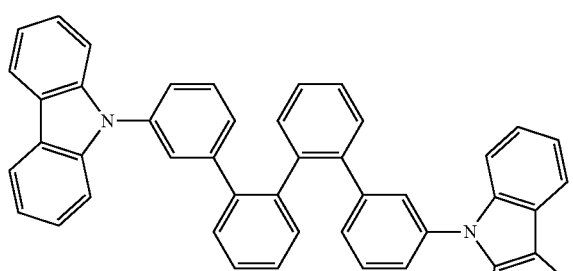
HTb-10
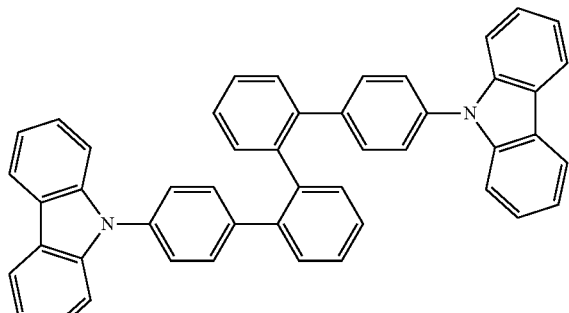
HTb-11
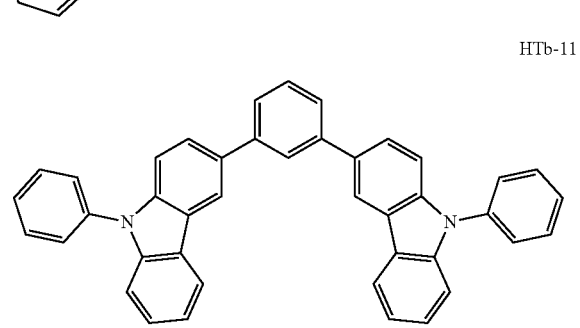
HTb-12
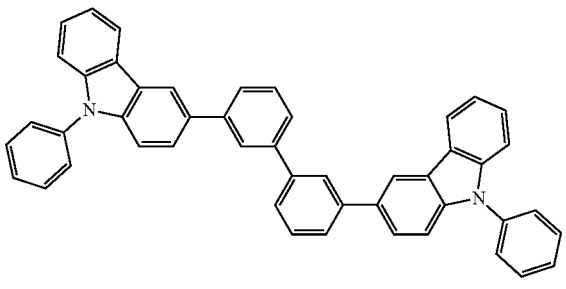
HTb-13
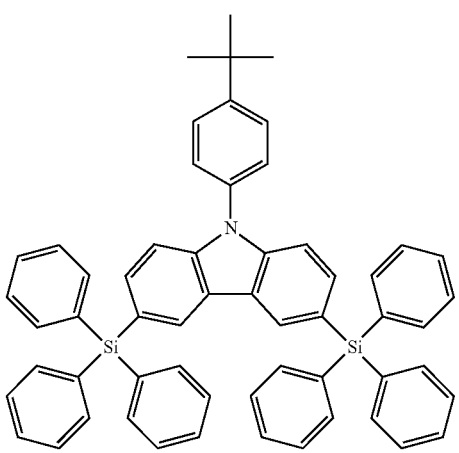
HTb-14
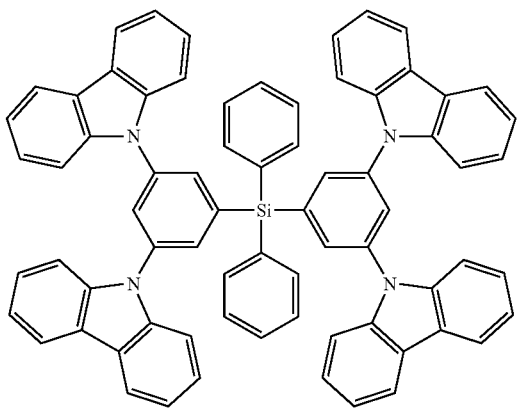
HTb-15
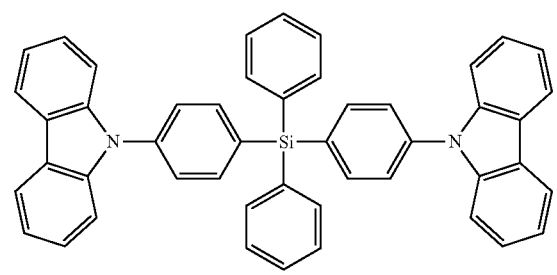

HTb-16
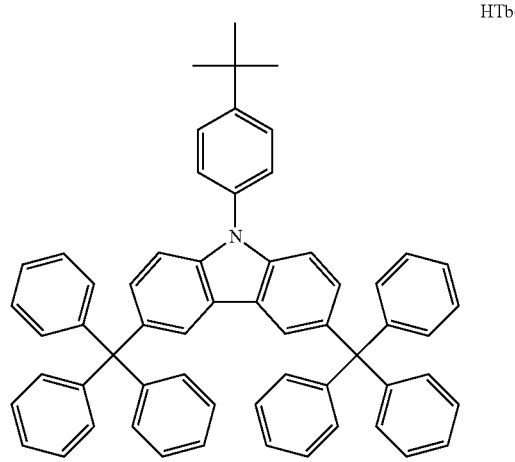
HTb-17
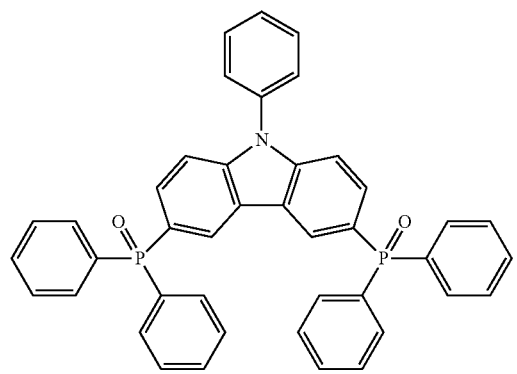
HTb-18
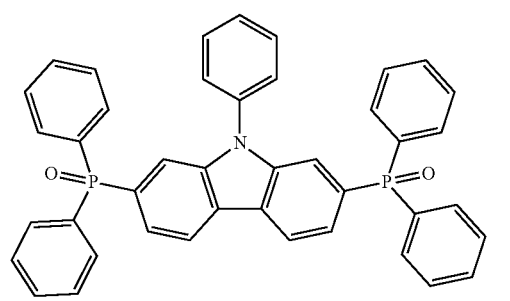
HTb-19
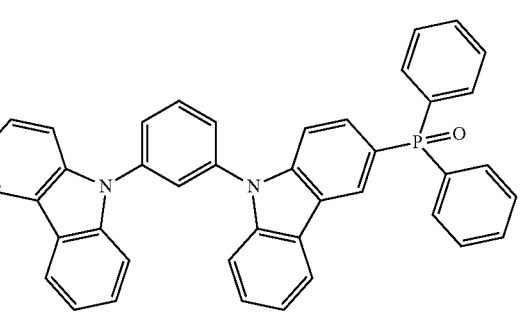
HTb-20
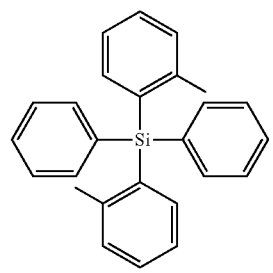
HTb-21
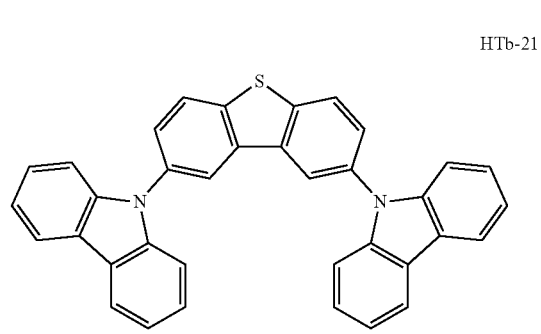
HTb-22
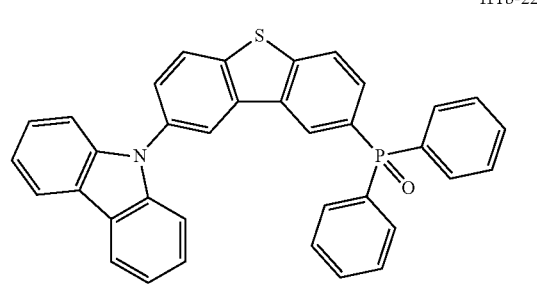
HTb-23
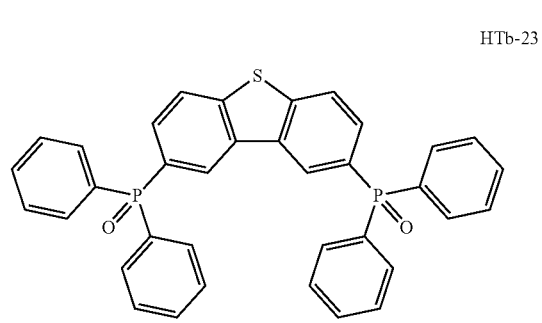
HTb-24
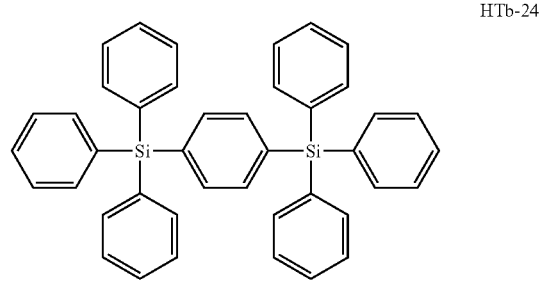

-continued
HTb-25
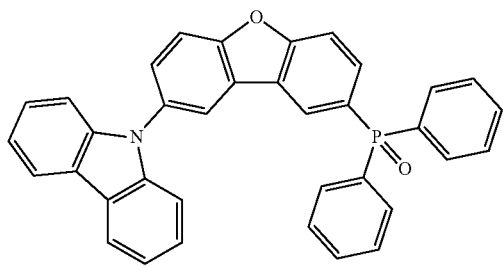
HTb-26
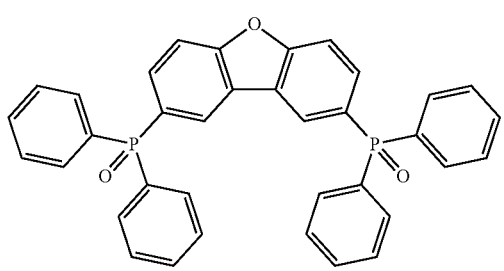
HTb-27
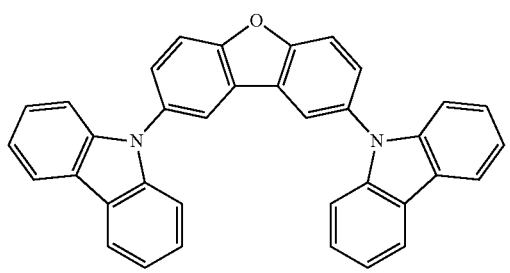
HTb-28
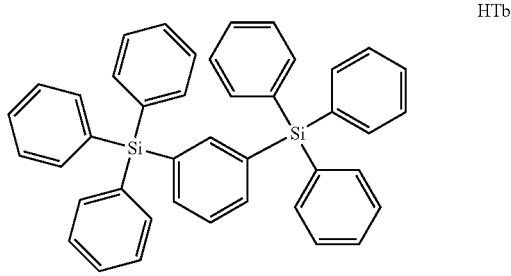
HTb-29
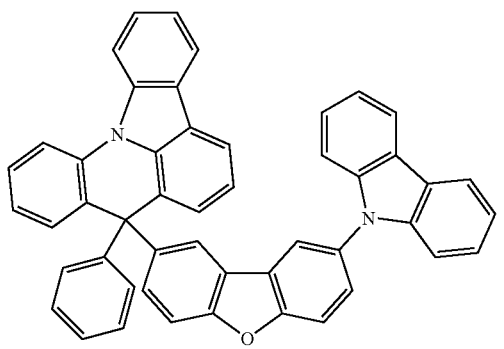
-continued
HTb-30
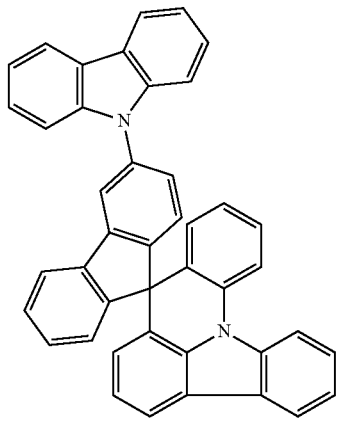
HTb-31
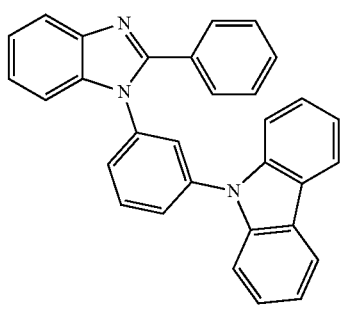
HTb-32
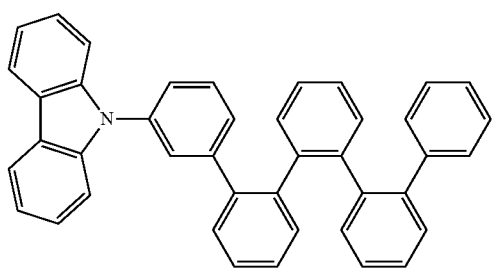
HTb-33
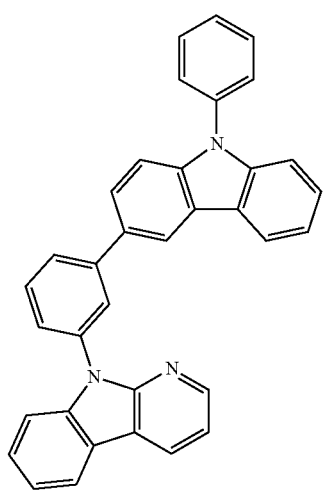

-continued

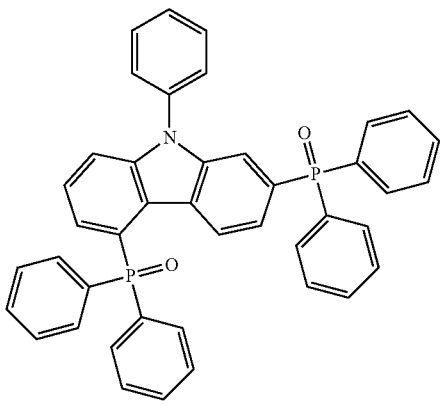
HTb-34

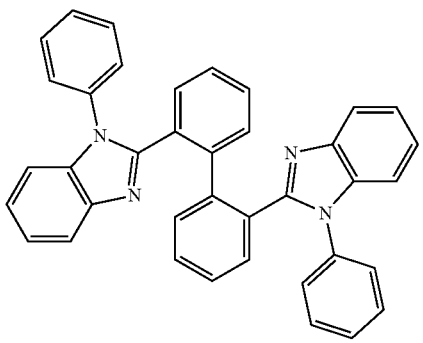
HTb-35

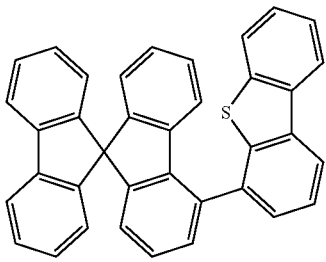
HTb-36

In an embodiment, the third host may be represented by Formula 4 below.

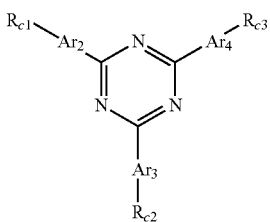
[Formula 4]

In Formula 4, $Ar_2$ to $Ar_4$ may each independently be a direct linkage, a substituted or unsubstituted ring-forming arylene group having 6 to 30 carbon atoms, or a substituted or unsubstituted ring-forming heteroarylene group having 2 to 30 carbon atoms.

In Formula 4, $R_{c1}$ to $R_{c3}$ may each independently be a hydrogen atom, a deuterium atom, a halogen atom, a substituted or unsubstituted amine group, a substituted or unsubstituted alkoxy group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

As the highest occupied molecular orbital (HOMO) energy level of the second host and the third host included in the emission layer EML are similar to the highest occupied molecular orbital (HOMO) energy level of the first host, excitons may be effectively diffused from the exciton diffusion layer EDL to the emission layer EML. For example, an absolute value of a difference between the highest occupied molecular orbital (HOMO) energy level of the first host and the highest occupied molecular orbital (HOMO) energy level of the second host may be in a range of about 0.2 eV to about 1.5 eV, and an absolute value of a difference between the highest occupied molecular orbital (HOMO) energy level of the first host and the highest occupied molecular orbital (HOMO) energy level of the third host may be in a range of about 0.2 eV to about 1.5 eV.

The third host represented by Formula 4 according to an embodiment may be any one selected from compounds represented in Compound Group 3 below. However, embodiments are not limited thereto.

[Compound Group 3]

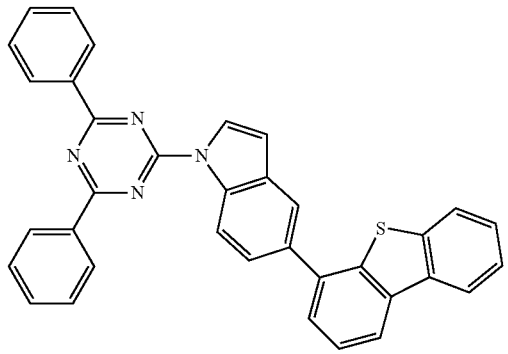
ET-01

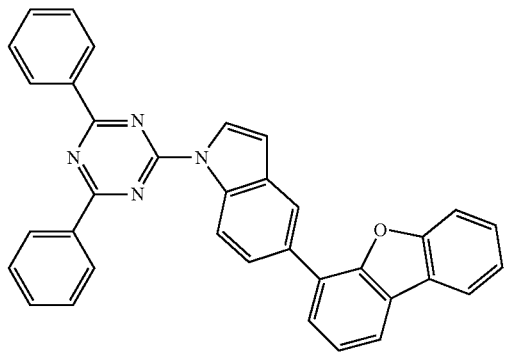
ET-02

ET-03
ET-04
ET-05
ET-06
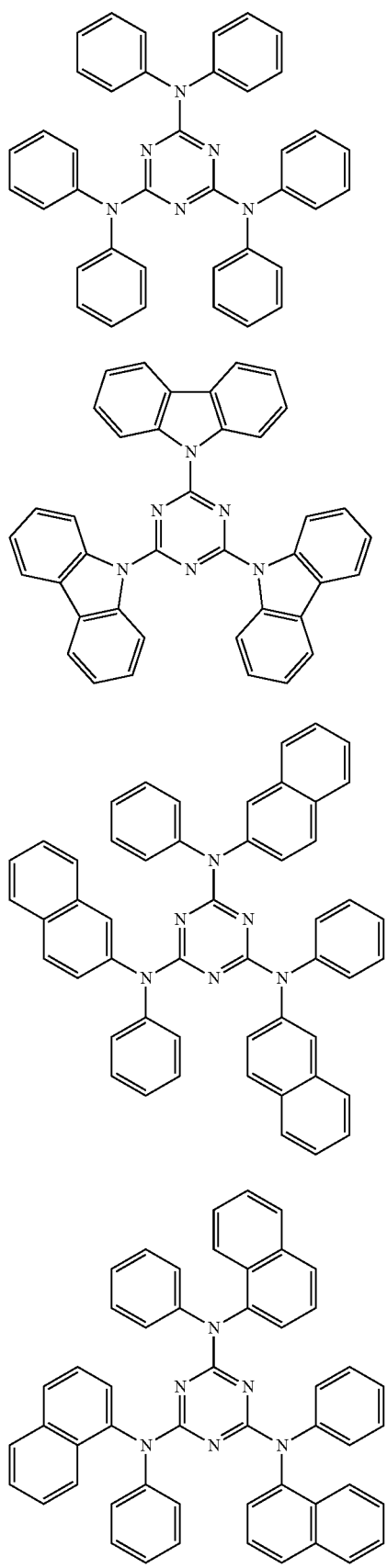
ET-07
ET-08
ET-09
ET-10
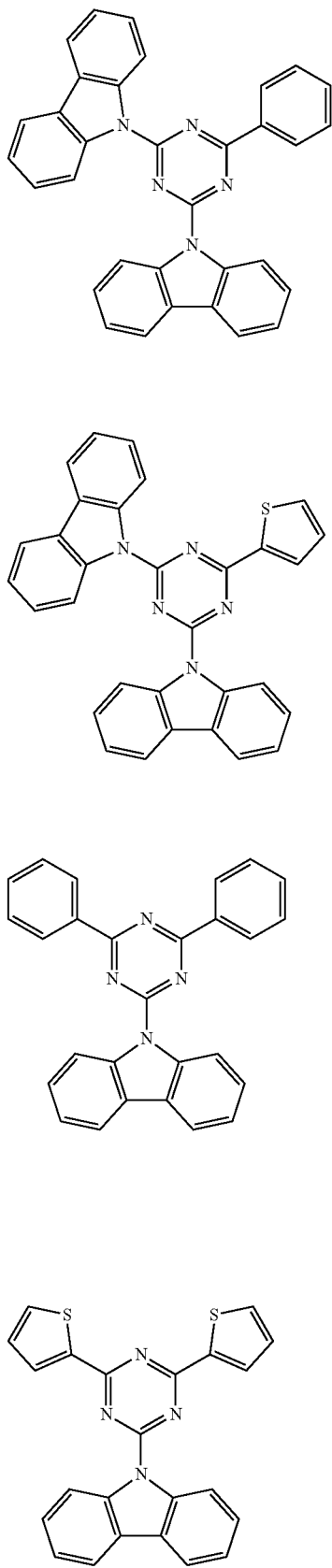

ET-11
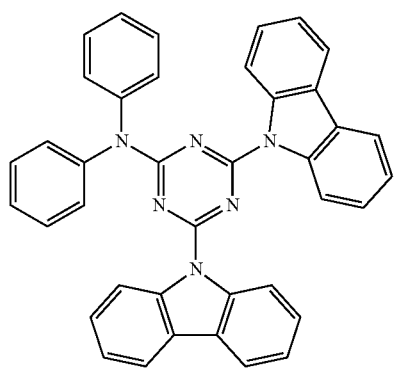
ET-14
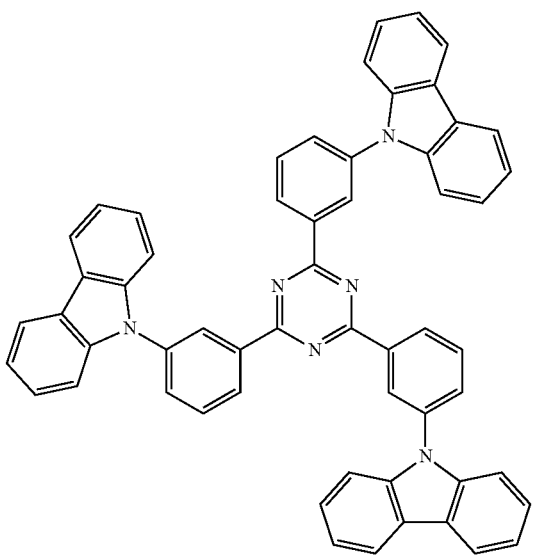
ET-12
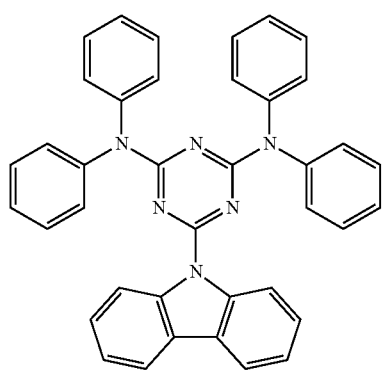
ET-15
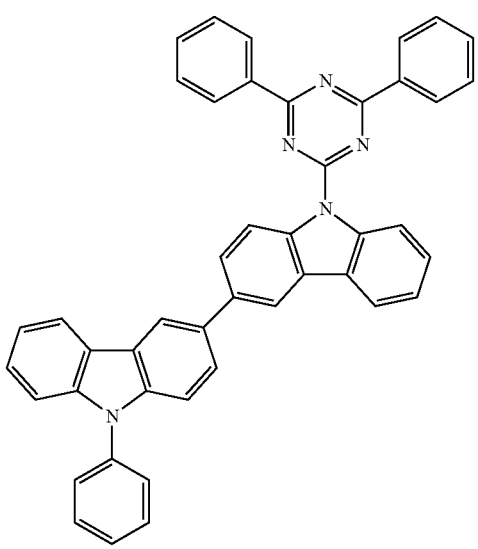
ET-13
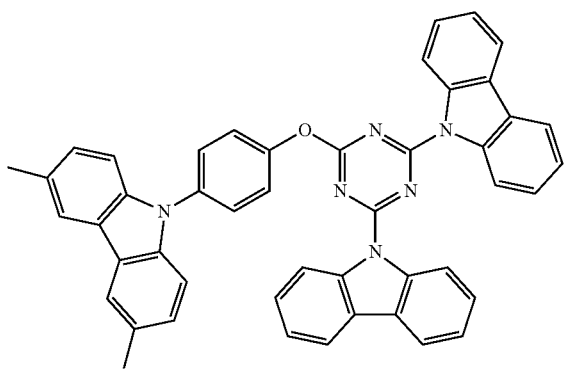
ET-16
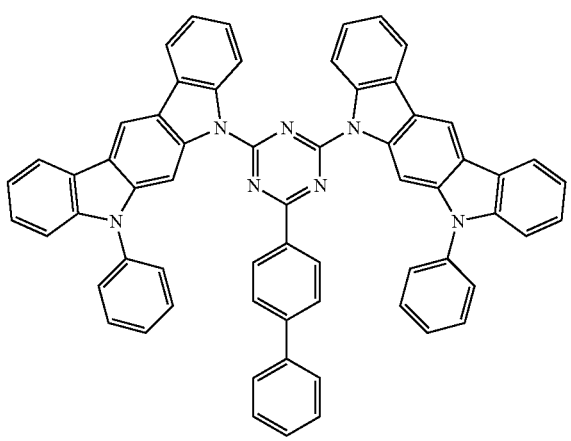

-continued

ET-17

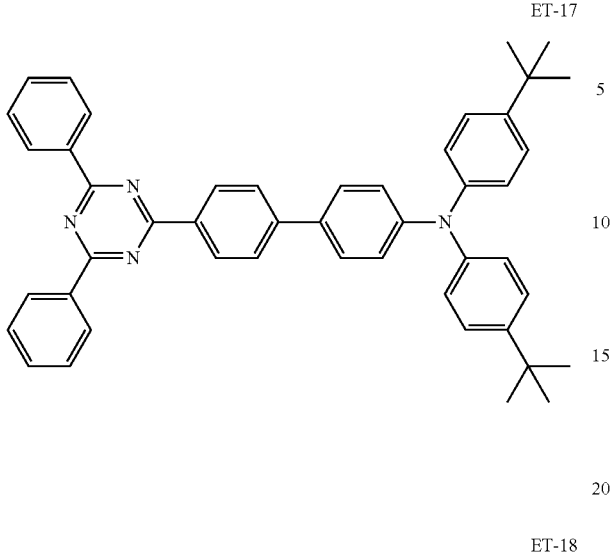

ET-18

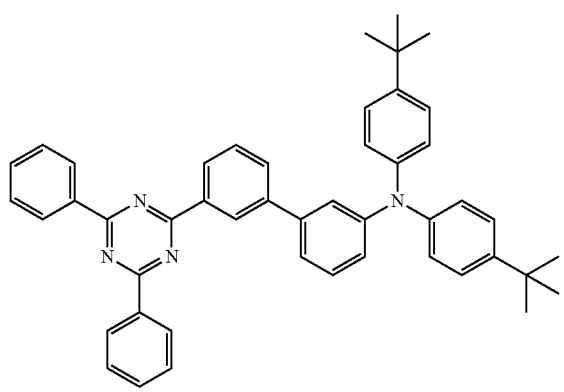

ET-19

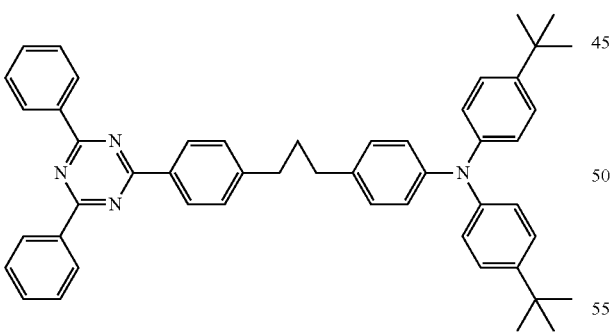

In an embodiment, the phosphorescent dopant may include an organometallic complex containing Pt as a central metal atom.

In an embodiment, the phosphorescent dopant may be represented by Formula 5 below.

$$MT_1(T_2)_d \quad \text{[Formula 5]}$$

In Formula 5, M may be Pt, $T_1$ may be represented by Formula 5-1 or Formula 5-2 below, $T_2$ may be a monovalent ligand, and d may be 0 or 1.

[Formula 5-1]

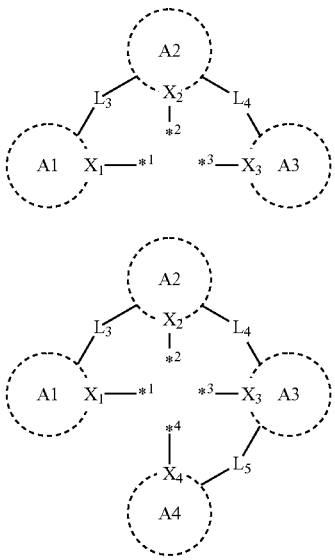

[Formula 5-2]

In Formula 5-1 and Formula 5-2, $X_1$ to $X_4$ may each independently be N or C.

In Formula 5-1 and Formula 5-2, A1 to A4 may each independently be a substituted or unsubstituted ring-forming monocyclic or polycyclic hydrocarbon ring group having 6 to 30 carbon atoms, or a substituted or unsubstituted ring-forming monocyclic or polycyclic heterocyclic group having 2 to 30 carbon atoms.

In Formula 5-1 and Formula 5-2, $L_3$ to $L_5$ may each independently be a direct linkage, O, or S.

In Formula 5-1 and Formula 5-2, *¹ to *⁴ may each independently be a binding site to M.

In an embodiment, $T_2$ may be a halogen atom.

In an embodiment, $T_2$ may be Cl.

In an embodiment, A1 to A4 in Formula 5-1 and Formula 5-2 may each independently be represented by any one among Formula 6-1 to Formula 6-6 below.

[Formula 6-1]

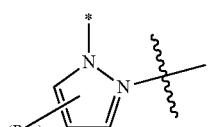

[Formula 6-2]

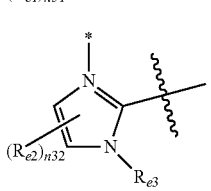

[Formula 6-3]

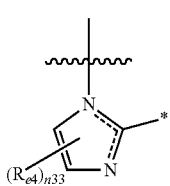

-continued

[Formula 6-4]

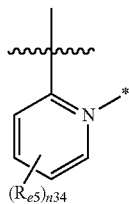

[Formula 6-5]

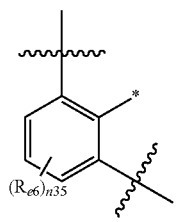

[Formula 6-6]

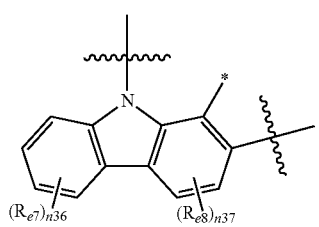

In Formula 6-1 to Formula 6-6, $R_{e1}$ to $R_{e8}$ may each independently be a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or may be combined with an adjacent group to form a ring.

In Formula 6-1, n31 may be an integer from 0 to 3. If n31 is 2 or more, multiple $R_{e1}(S)$ may be the same as or different from each other.

In Formula 6-2, n32 may be an integer from 0 to 2. If n32 is 2, multiple $R_{e}2$ (s) may be the same as or different from each other.

In Formula 6-3, n33 may be an integer from 0 to 2. If n33 is 2, multiple $R_{e}4$ (s) may be the same as or different from each other.

In Formula 6-4, n34 may be an integer from 0 to 4. If n34 is 2 or more, multiple $R_{e5}(s)$ may be the same as or different from each other.

In Formula 6-5, n35 may be an integer from 0 to 3. If n35 is 2 or more, multiple $R_{e6}(S)$ may be the same as or different from each other.

In Formula 6-6, n36 may be an integer from 0 to 4. If n36 is 2 or more, multiple $R_{e7}(s)$ may be the same as or different from each other.

In Formula 6-6, n37 may be an integer from 0 to 2. If n37 is 2, multiple $R_{e}s(s)$ may be the same as or different from each other.

In Formula 6-1 to Formula 6-6, —* indicates a binding position to a Pt atom, and

indicates a binding position to an adjacent group.

The phosphorescent dopant represented by Formula 5 according to an embodiment may be any one selected from compounds represented in Compound Group 4 below. However, embodiments are not limited thereto.

[Compound Group 4]

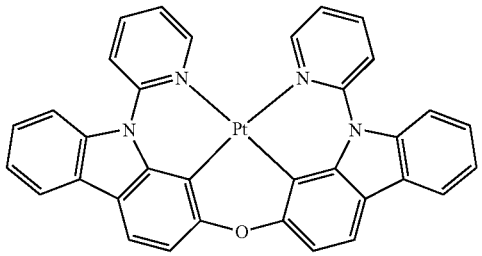

D-1

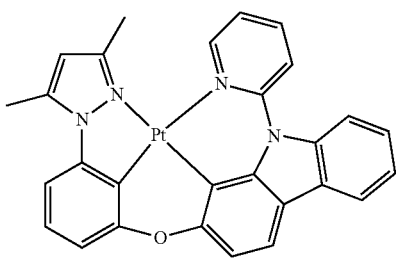

D-2

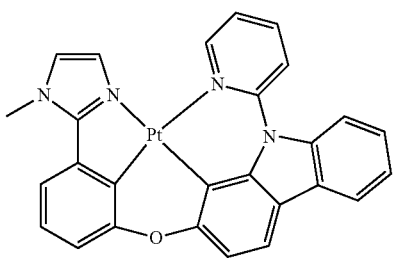

D-3

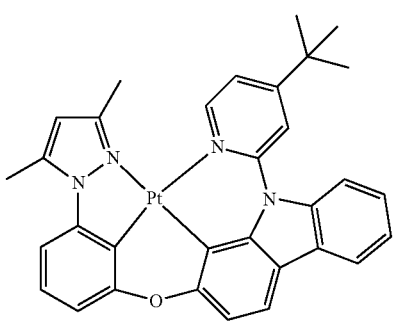

D-4

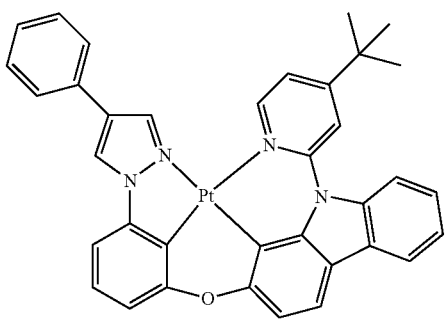

D-5

-continued

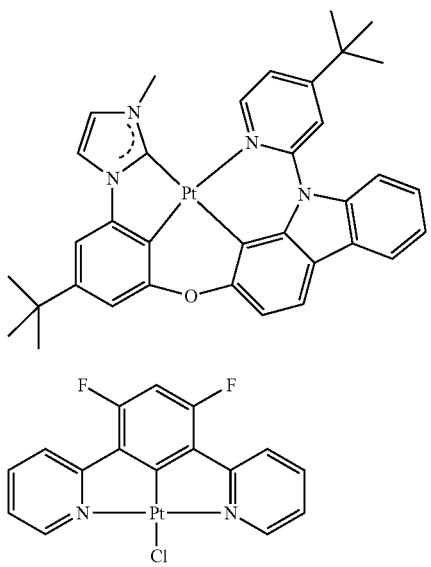

D-6

D-7

In an embodiment, a content of the phosphorescent dopant may be in a range of about 10 wt % to about 16 wt % based on the total weight of the second host, the third host, and the phosphorescent dopant.

An organic electroluminescence device according to an embodiment will be explained with reference back to FIGS. 3 to 5.

The organic electroluminescence device ED according to an embodiment may include the emission layer EML disposed directly on the exciton diffusion layer EDL. Accordingly, optical efficiency is high by utilizing both exciton diffusion from the exciton diffusion layer EDL to the emission layer EML and direct recombination within the emission layer EML.

Although not shown in the drawings, the organic electroluminescence device ED according to an embodiment may include multiple emission layers. The emission layers may be provided by sequentially stacking, and for example, the organic electroluminescence device ED including the emission layers may emit white light. The organic electroluminescence device including the multiple emission layers may be an organic electroluminescence device having a tandem structure. If the organic electroluminescence device ED includes multiple emission layers, at least one of emission layers EML may include all of the second host, the third host, and the dopant as described above.

In the organic electroluminescence device ED according to an embodiment, the emission layer EML may further include an anthracene derivative, a pyrene derivative, a fluoranthene derivative, a chrysene derivative, a dihydrobenzanthracene derivative, or a triphenylene derivative. In particular, the emission layer EML may include an anthracene derivative or a pyrene derivative.

In the organic electroluminescence devices ED according to an embodiment illustrated in FIGS. 3 to 5, the emission layer EML may further include a host and a dopant, and the emission layer EML may include a compound represented by Formula E-1 below. The compound represented by Formula E-1 below may be used as a fluorescent host material.

[Formula E-1]

In Formula E-1, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring. In Formula E-1, $R_{31}$ to $R_{40}$ may be combined with an adjacent group to form a saturated hydrocarbon ring or an unsaturated hydrocarbon ring.

In Formula E-1, c and d may each independently be an integer from 0 to 5.

The compound represented by Formula E-1 may be selected from any one among Compound E1 to Compound E19 below.

E1

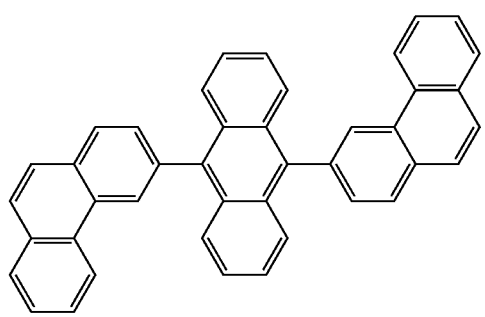

E2

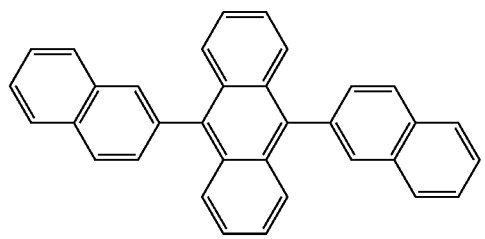

E3

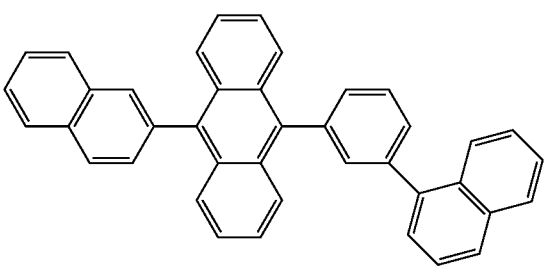

E4
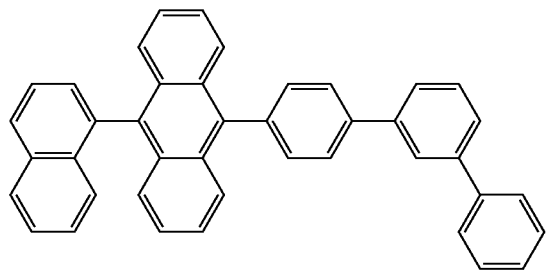
E5
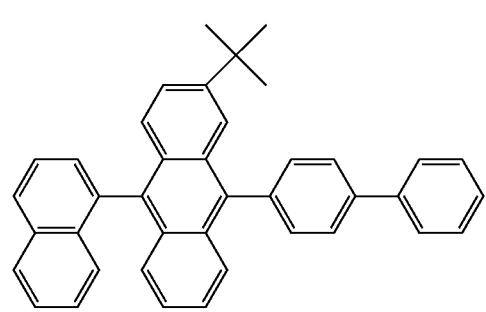
E6
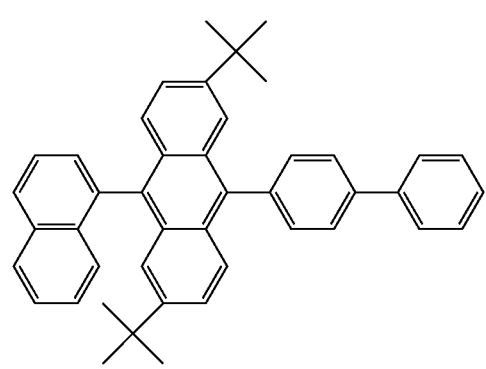
E7
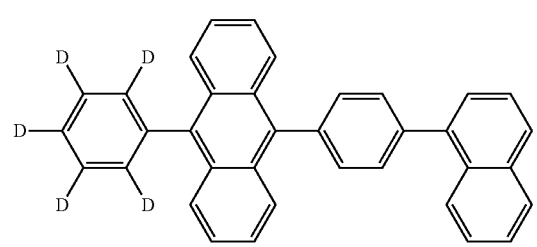
E8
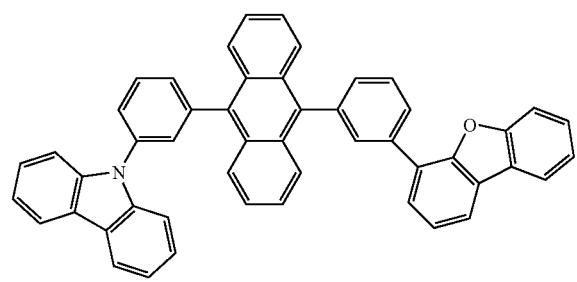
E9
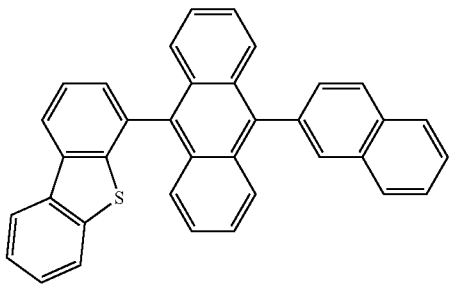
E10
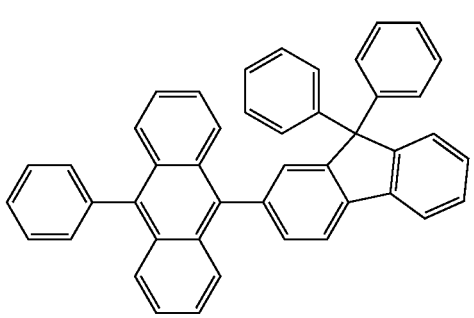
E11
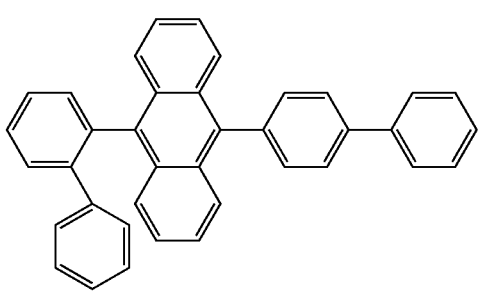
E12
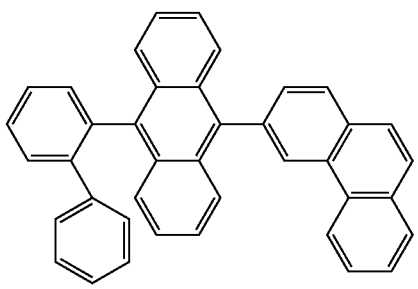
E13
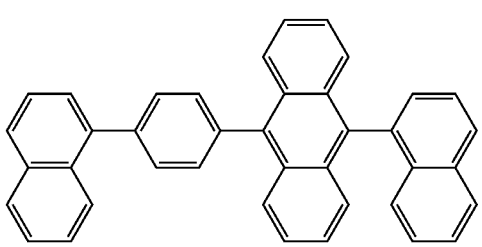

E14
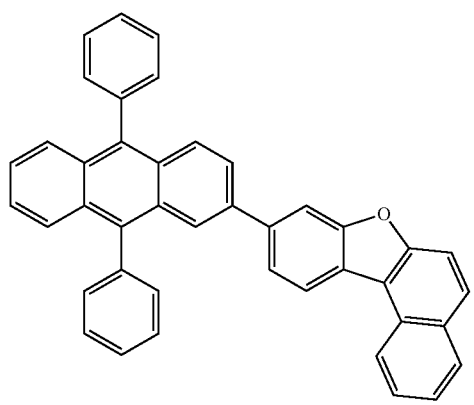
E15
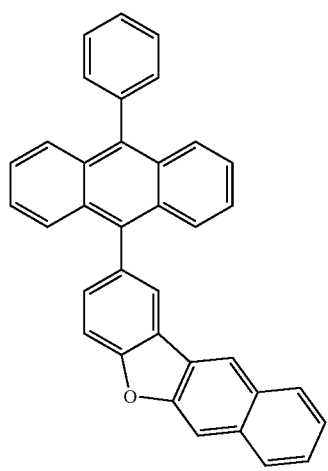
E16
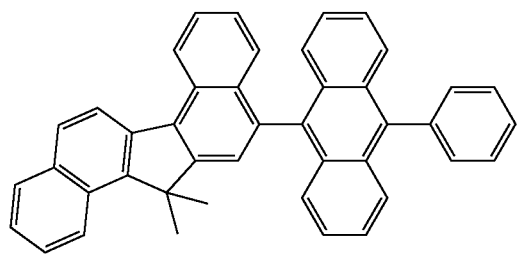
E17
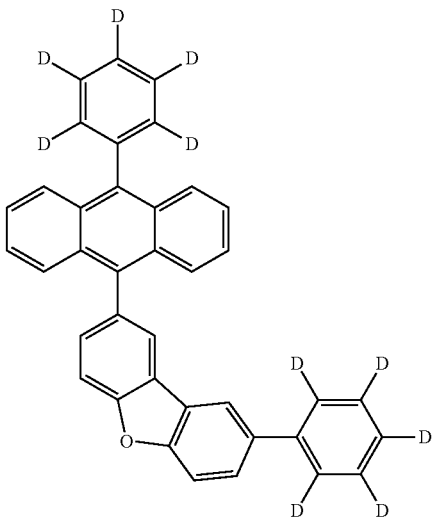
E18
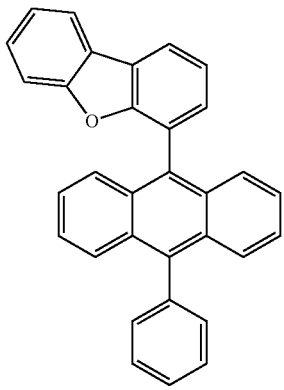
E19
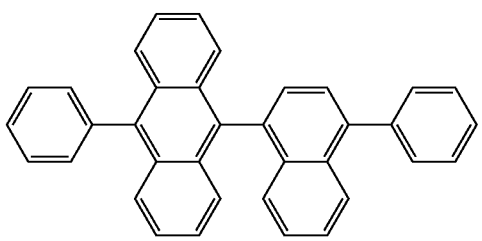
In an embodiment, the emission layer EML may further include a compound represented by Formula E-2a or Formula E-2b below. The compound represented by Formula E-2a or Formula E-2b below may be used as a phosphorescent host material.

[Formula E-2a]

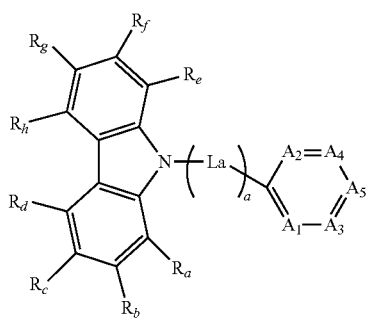

[Compound Group E-2]

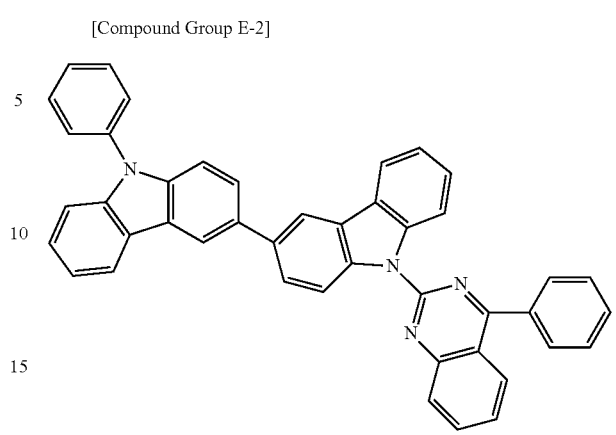

In Formula E-2a, a may be an integer from 0 to 10, and La may be a direct linkage, a substituted or unsubstituted ring-forming arylene group having 6 to 30 carbon atoms, or a substituted or unsubstituted ring-forming heteroarylene group having 2 to 30 carbon atoms. In Formula E-2a, if a is 2 or more, multiple $L_a$(s) may each independently be a substituted or unsubstituted ring-forming arylene group having 6 to 30 carbon atoms, or a substituted or unsubstituted ring-forming heteroarylene group having 2 to 30 carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring. $R_a$ to $R_i$ may be combined with an adjacent group to form a hydrocarbon ring or a heterocycle including N, O, S, or the like as a ring-forming atom.

In Formula E-2a, two or three of $A_1$ to $A_5$ may be N, and the remainder of $A_1$ to $A_5$ may be $C(R_i)$.

[Formula E-2b]

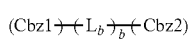

In Formula E-2b, Cbz1 and Cbz2 may each independently be an unsubstituted carbazole group, or a carbazole group substituted with a ring-forming aryl group having 6 to 30 carbon atoms. $L_b$ may be a direct linkage, a substituted or unsubstituted ring-forming arylene group having 6 to 30 carbon atoms, or a substituted or unsubstituted ring-forming heteroarylene group having 2 to 30 carbon atoms. In Formula E-2b, b may be an integer from 0 to 10, and if b is 2 or more, multiple $L_b$(s) may each independently be a substituted or unsubstituted ring-forming arylene group having 6 to 30 carbon atoms, or a substituted or unsubstituted ring-forming heteroarylene group having 2 to 30 carbon atoms.

The compound represented by Formula E-2a or Formula E-2b may be represented by any one among compounds in Compound Group E-2 below. However, the compounds listed in Compound Group E-2 below are illustrative, and the compound represented by Formula E-2a or Formula E-2b is not limited to those represented in Compound Group E-2 below.

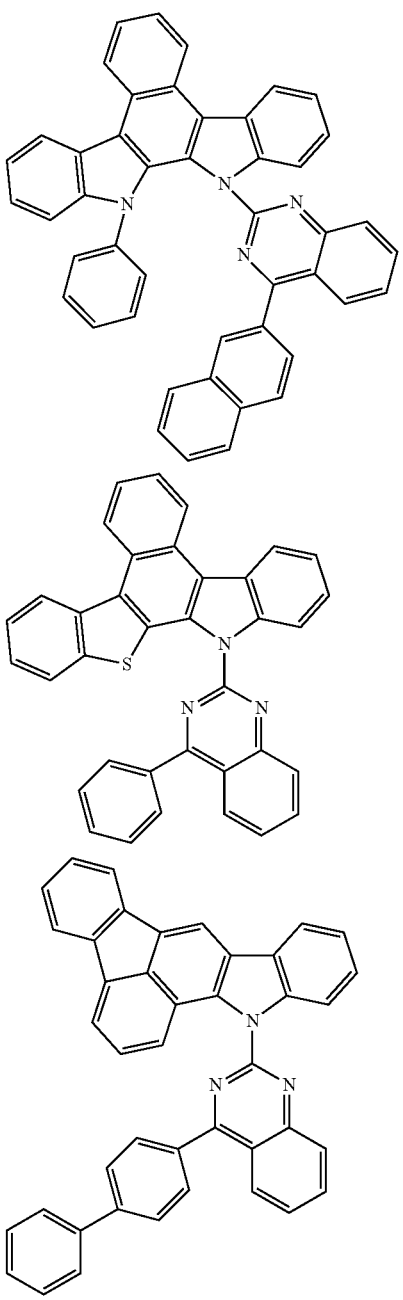

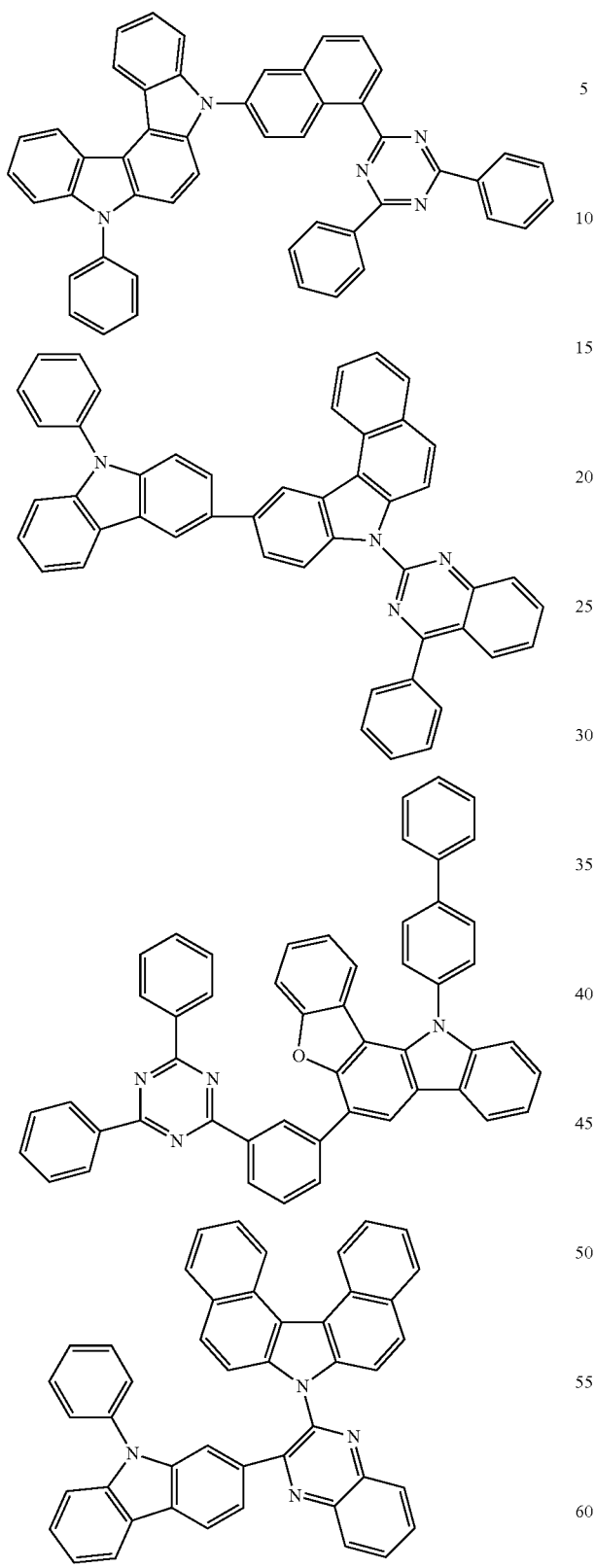
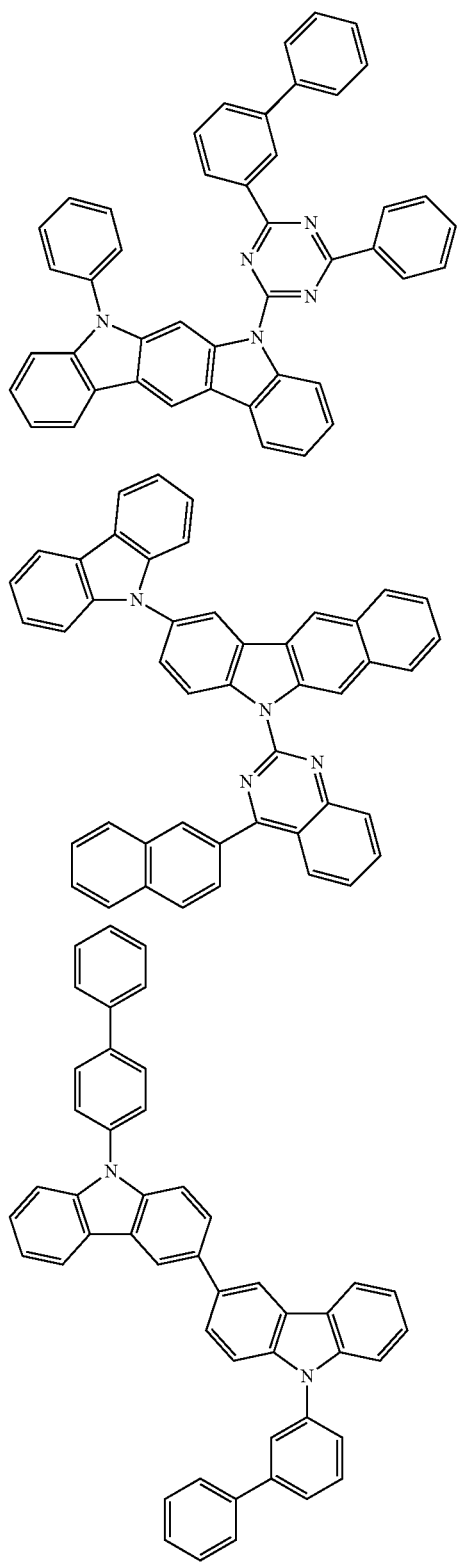

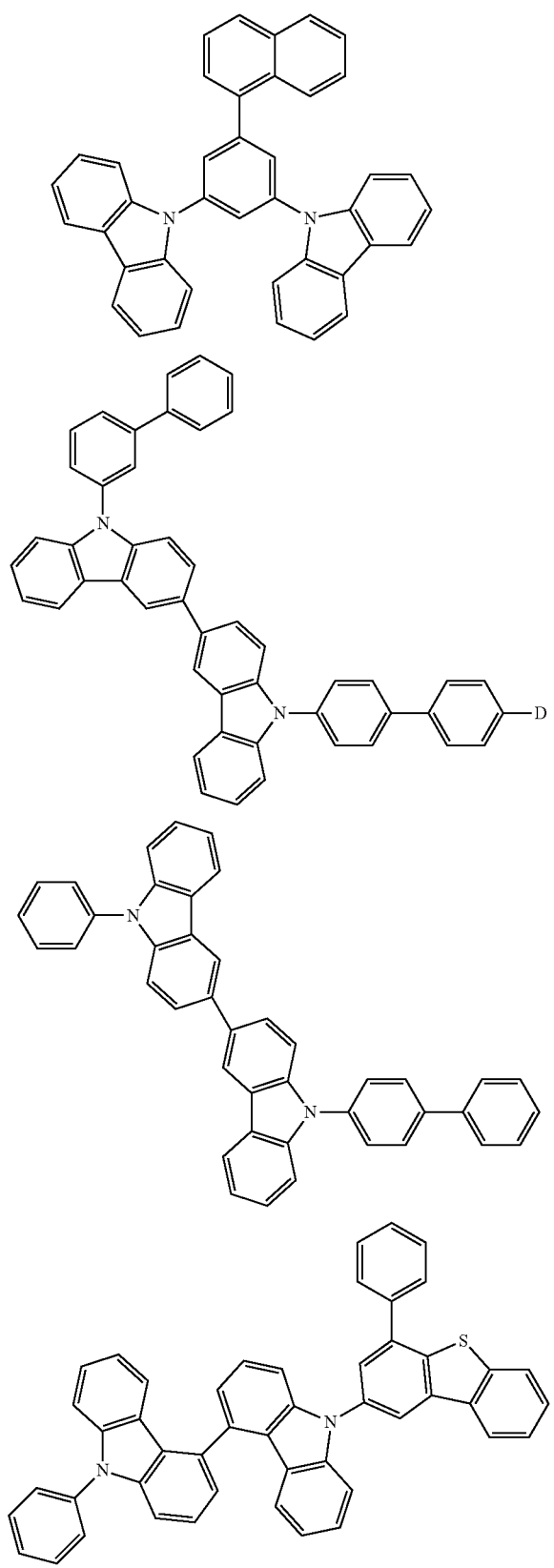
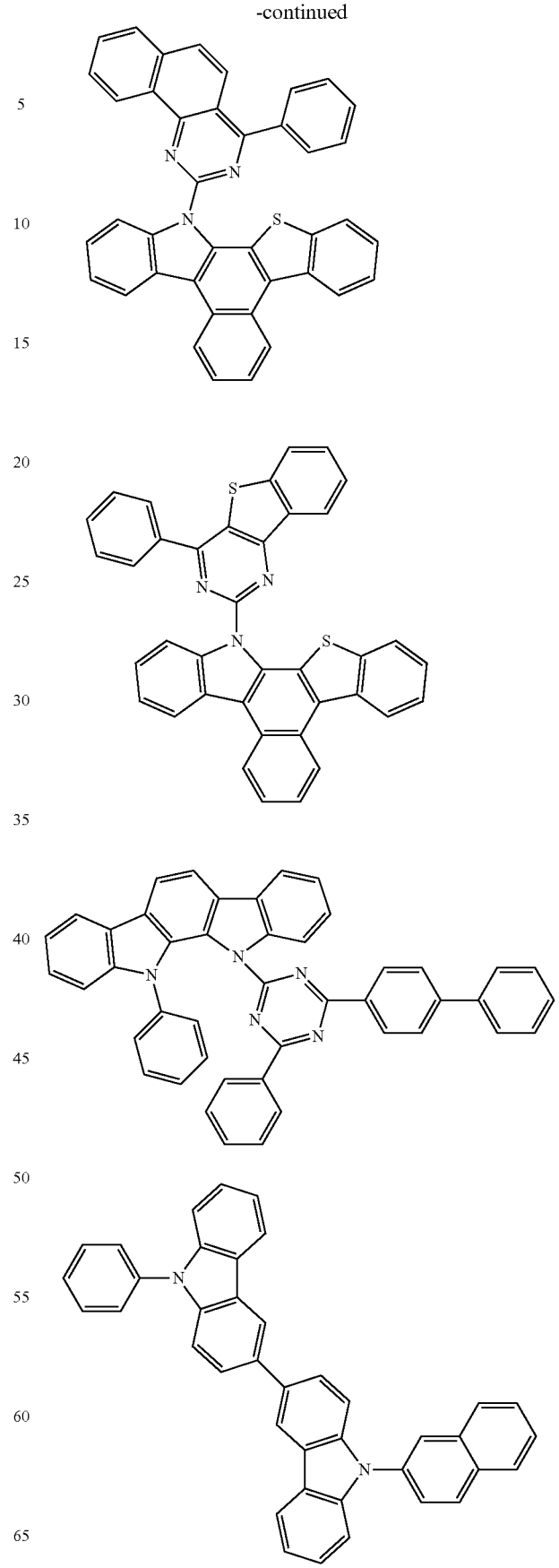

-continued

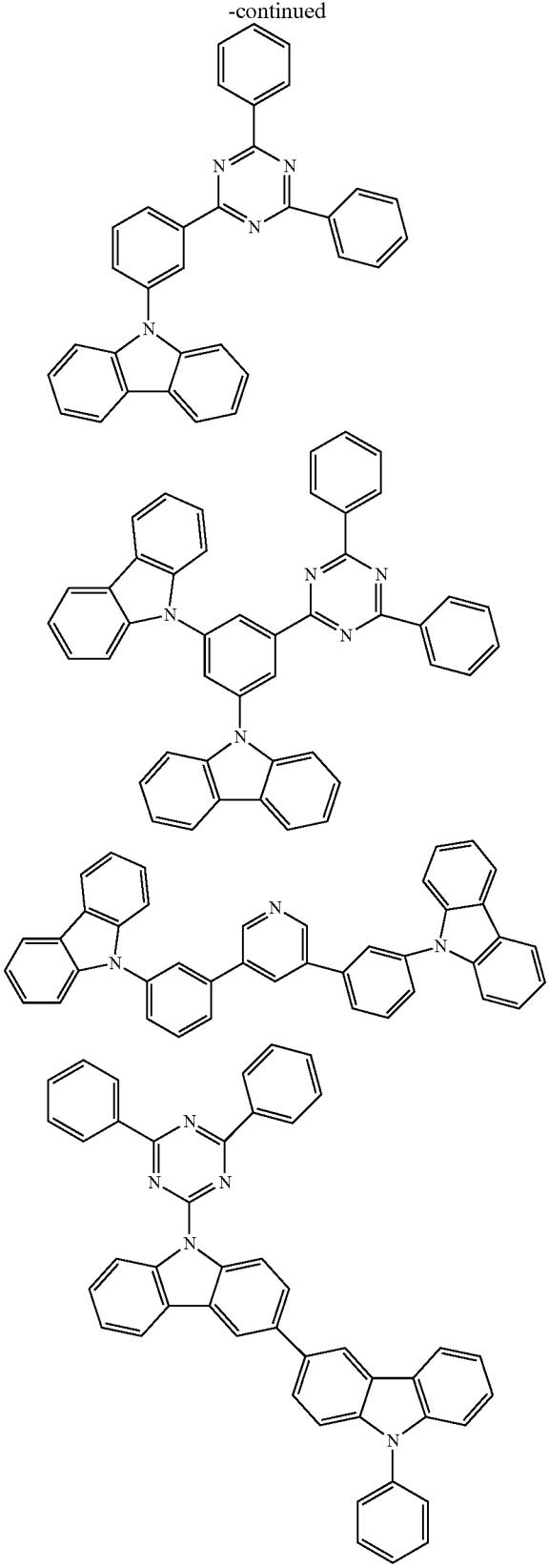

The emission layer EML may further include a common material in the art as a host material. For example, the emission layer EML may include at least one among bis[2-(diphenylphosphino)phenyl] ether oxide (DPEPO), 4,4'-bis (carbazol-9-yl)biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), and 1,3,5-tris(1-phenyl-1H-benzo[d]imidazole-2-yl)benzene (TPBi) as the host material. However, embodiments are not limited thereto, and for example, tris(8-hydroxyquinolino)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), 2,8-bis(diphenylphosphoryl)dibenzofuran (PPF), or the like may be used as the host material.

The emission layer EML may further include a compound represented by Formula M-a or Formula M-b below. The compound represented by Formula M-a or Formula M-b below may be used as another phosphorescent dopant material.

[Formula M-a]

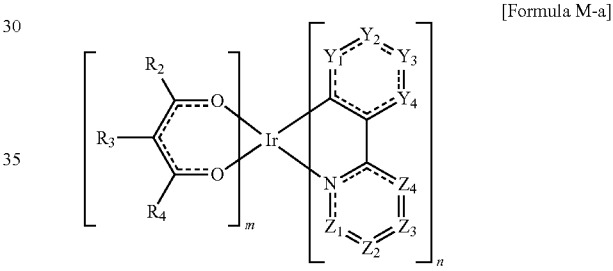

In Formula M-a above, $Y_1$ to $Y_4$, and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a red phosphorescent dopant or a green phosphorescent dopant.

The compound represented by Formula M-a may be represented by any one among Compounds M-a1 to M-a19 below. However, Compounds M-a1 to M-a19 below are illustrative, and the compound represented by Formula M-a is not limited to those represented by Compounds M-a1 to M-a19 below.

M-a1 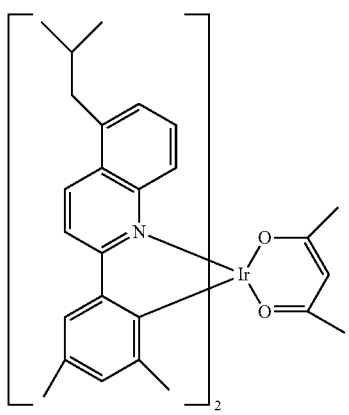
M-a2 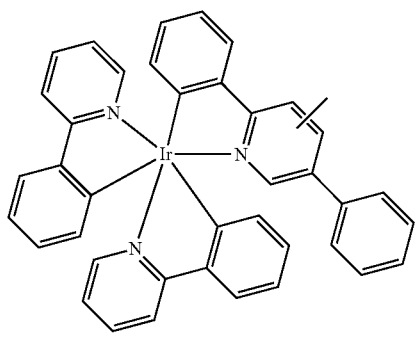
M-a3 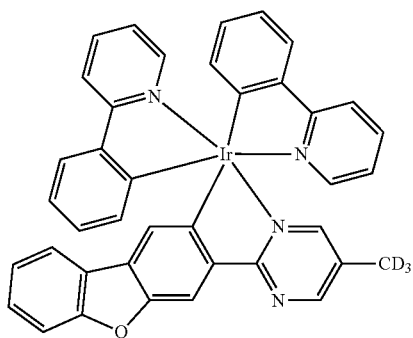
M-a5 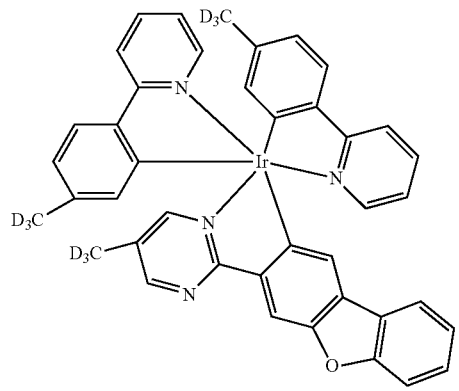
M-a6 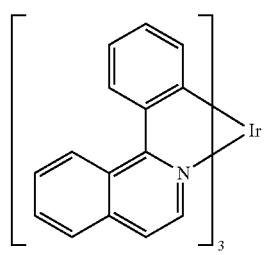
M-a7 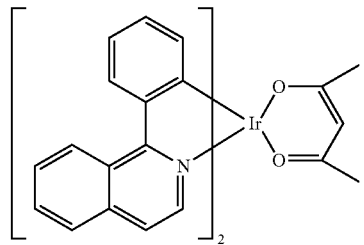
M-a8 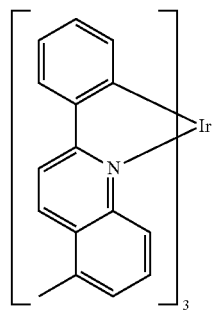
M-a9 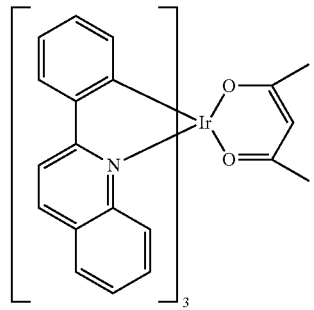

M-a10
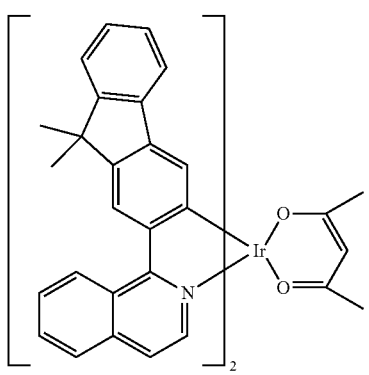
M-a15
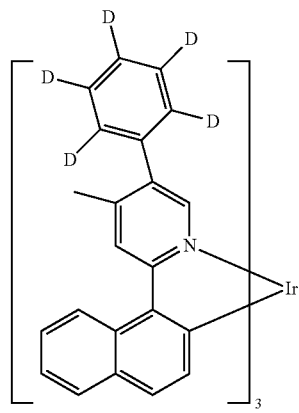
M-a11
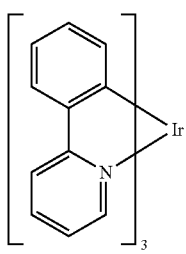
M-a16
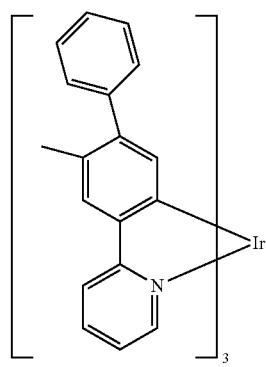
M-a12
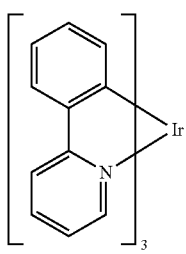
M-a13
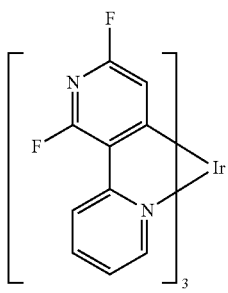
M-a17
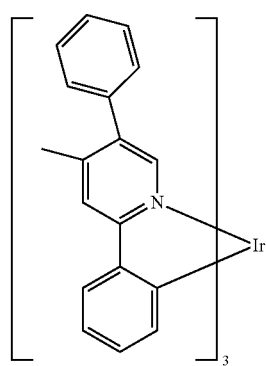
M-a14
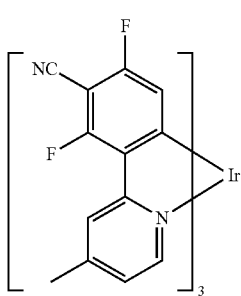
M-a18
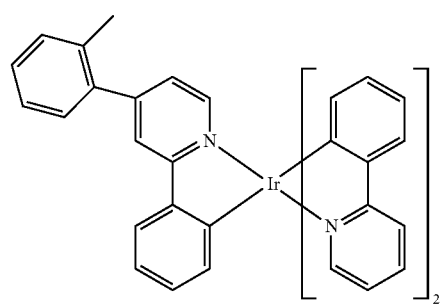

-continued

M-a19

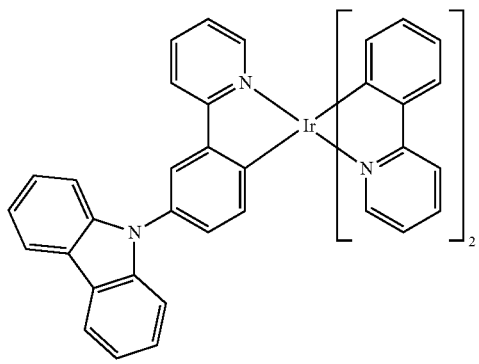

Compound M-a1 and Compound M-a2 may be used as a red dopant material, and Compounds M-a3 to M-a5 may be used as a green dopant material.

[Formula M-b]

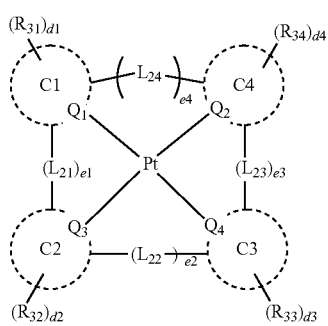

In Formula M-b, $Q_1$ to $Q_4$ may each independently be C or N, and C1 to C4 may each independently be a substituted or unsubstituted ring-forming hydrocarbon ring having 5 to 30 carbon atoms, or a substituted or unsubstituted ring-forming heterocycle having 2 to 30 carbon atoms. $L_{21}$ to $L_{24}$ may each independently be a direct linkage, *—O—*, *—S—*,

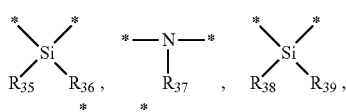

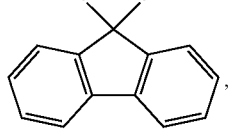

a substituted or unsubstituted divalent alkyl group having 1 to 20 carbon atoms, a substituted or unsubstituted ring-forming arylene group having 6 to 30 carbon atoms, or a substituted or unsubstituted ring-forming heteroarylene group having 2 to 30 carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring, and d1 to d4 may each independently be an integer from 0 to 4.

The compound represented by Formula M-b may be used as a blue phosphorescent dopant or a green phosphorescent dopant.

The compound represented by Formula M-b may be represented by any one among the compounds below. However, the compounds below are illustrative, and the compound represented by Formula M-b is not limited to those represented in the compounds below.

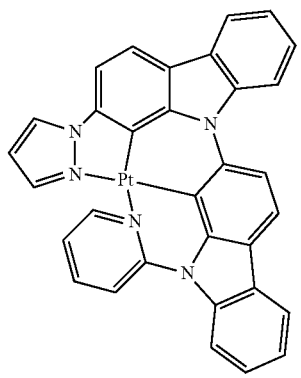

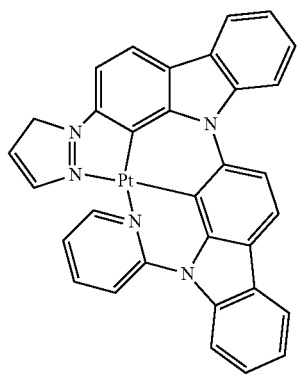

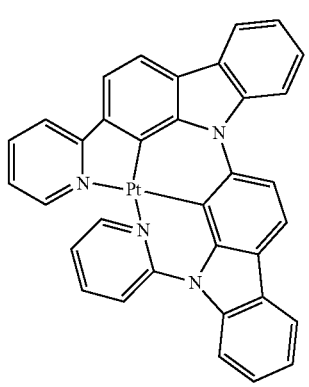

65
-continued
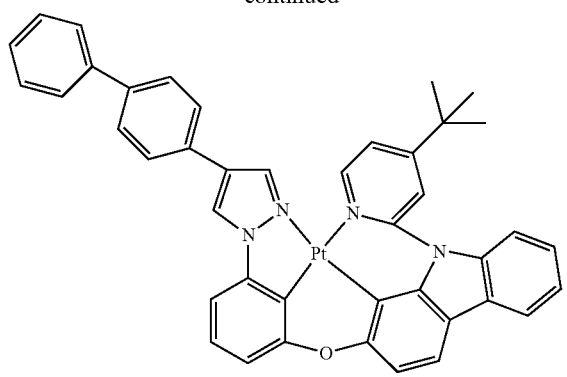
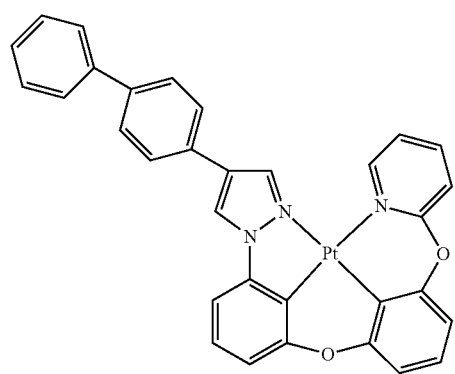
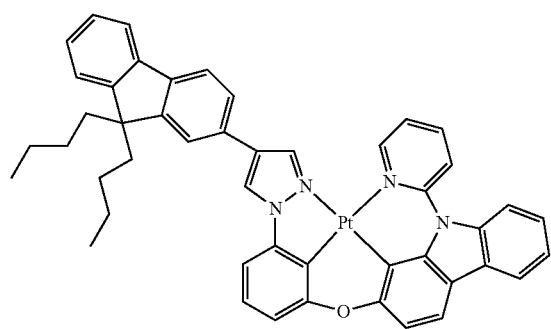
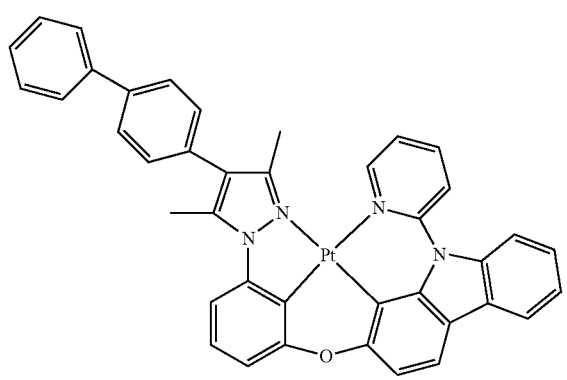
66
-continued
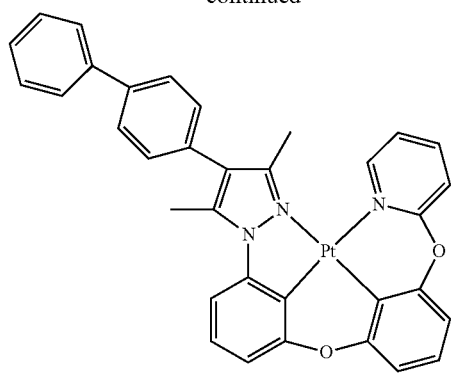
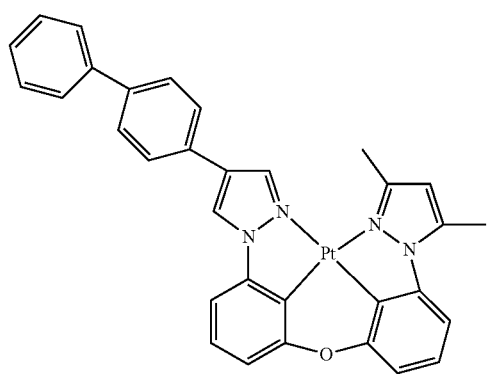
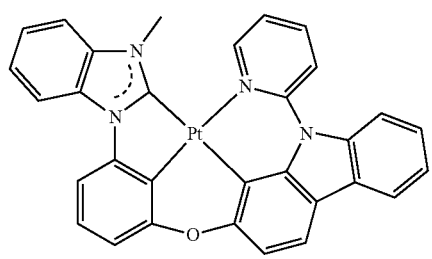
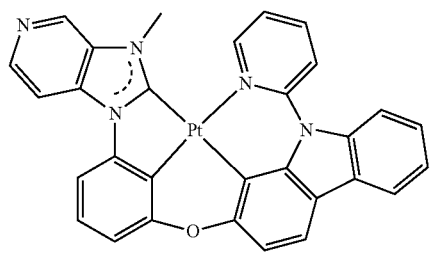
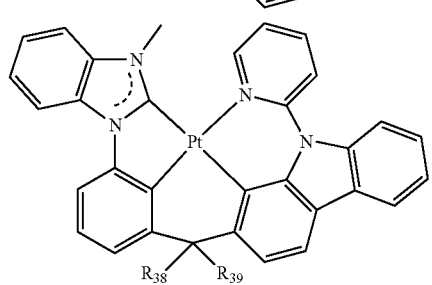

-continued

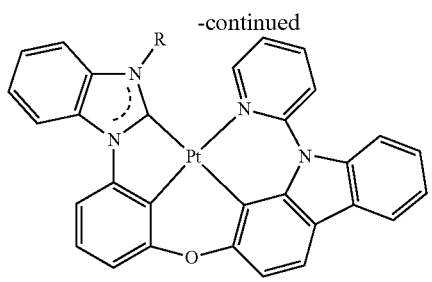

In the above compounds, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

The emission layer EML may further include a compound represented by any one among Formula F-a to Formula F-c below. The compound represented by Formula F-a to Formula F-c below may be used as a fluorescent dopant material.

[Formula F-a]

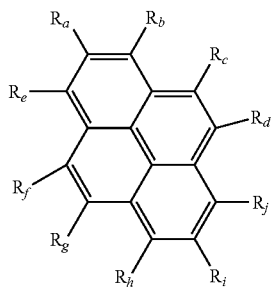

In Formula F-a above, two selected among $R_a$ to $R_R$ may each independently be substituted with *—$NAr_1Ar_2$. The remainder among $R_a$ to $R_R$ that are not substituted with *—$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. In *—$NAr_1Ar_2$, $Ar_1$ and $Ar_2$ may each independently be a substituted or unsubstituted ring-forming aryl group having 6 to 30 carbon atoms, or a substituted or unsubstituted ring-forming heteroaryl group having 2 to 30 carbon atoms. For example, at least one of $Ar_1$ and $Ar_2$ may be a heteroaryl group including O or S as a ring-forming atom.

[Formula F-b]

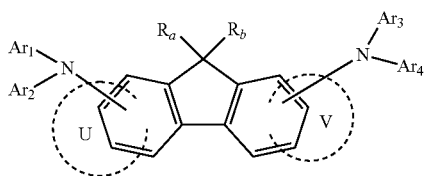

In Formula F-b above, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted ring-forming aryl group having 6 to 30 carbon atoms, or a substituted or unsubstituted ring-forming heteroaryl group having 2 to 30 carbon atoms, or combined with an adjacent group to form a ring.

In Formula F-b, U and V may each independently be a substituted or unsubstituted ring-forming hydrocarbon ring having 5 to 30 carbon atoms, or a substituted or unsubstituted ring-forming heterocycle having 2 to 30 carbon atoms.

In Formula F-b, a number of rings represented by U and V may each independently be 0 or 1. For example, in Formula F-b, if a number of U or V is 1, one ring may be included in a condensed ring in a portion indicated as U or V, and if a number of U or V is 0, it means that a ring indicated as U or V may not exist. Specifically, if a number of U is 0 and a number of V is 1, or a number of U is 1 and a number of V is 0, a condensed ring having a fluorene core of Formula F-b may be a tetracyclic compound. If a number of U and V are each 0, the condensed ring of Formula F-b may be a tricyclic compound. If a number of U and V are each 1, a condensed ring having a fluorene core of Formula F-b may be a pentacyclic compound.

[Formula F-c]

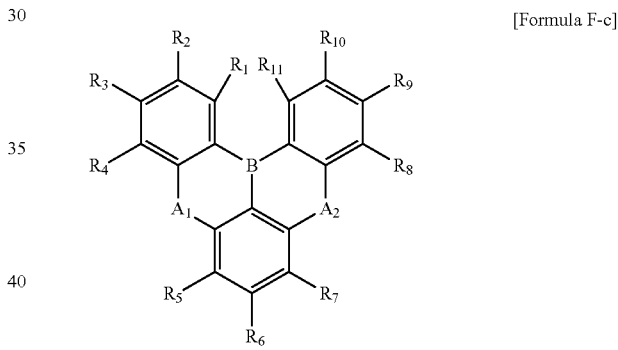

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, or may be combined with an adjacent group to form a ring.

In Formula F-c, $A_1$ and $A_2$ may each independently be combined with substituents of an adjacent ring to form a condensed ring. For example, when $A_1$ and $A_2$ are each independently $N(R_m)$, $A_1$ may be combined with $R_4$ or $R_5$ to form a ring. In formula F-c, $A_2$ may be combined with $R_7$ or $R_8$ to form a ring.

In an embodiment, the emission layer EML may further include, as a dopant material, a styryl derivative (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), N-(4-((E)-2-(6-((E)-4-(diphenylamino) styryl)naphthalen-2-yl)vinyl)phenyl)-N-phenylbenzenamine (N-BDAVBi)), 4,4'-bis[2-(4-(N,N-diphenylamino) phenyl)vinyl]biphenyl (DPAVBi), perylene and a derivative thereof (for example, 2,5,8,11-tetra-t-butylperylene (TBP)), pyrene and a derivative thereof (for example, 1,1-dipyrene, 1,4-dipyrenylbenzene,1,4-bis(N,N-diphenylamino)pyrene), or the like.

The emission layer EML may further include a phosphorescent dopant material. For example, a metal complex including iridium (Ir), platinum (Pt), osmium (Os), gold (Au), titanium (Ti), zirconium (Zr), hafnium (Hf), europium (Eu), terbium (Tb), or thulium (Tm) may be used as a phosphorescent dopant. In particular, iridium (III) bis(4,6-difluorophenylpyridinato-N,C2') (FIrpic), bis(2,4-difluorophenylpyridinato)-tetrakis(1-pyrazolyl)borate iridium (III) (FIr6), or platinum octaethyl porphyrin (PtOEP) may be used as a phosphorescent dopant. However, embodiments are not limited thereto.

In the organic electroluminescence device ED according to an embodiment shown in FIGS. 3 to 5, the electron transport region ETR is provided on the emission layer EML. The electron transport region ETR may include at least one of a hole blocking layer (not shown), an electron transport layer ETL, and an electron injection layer EIL, but embodiments are not limited thereto.

The electron transport region ETR may have a single layer structure formed using a single material, a single layer structure formed using different materials, or a multilayer structure having layers formed using different materials.

For example, the electron transport region ETR may have a structure of a single layer of an electron injection layer EIL or an electron transport layer ETL, and may have a structure of a single layer formed using an electron injection material and an electron transport material. Further, the electron transport region ETR may have a single layer structure formed using different materials, or a structure of an electron transport layer ETL/electron injection layer EIL, or a hole blocking layer (not shown)/electron transport layer ETL/ electron injection layer EIL which are sequentially stacked from the emission layer EML, but embodiments are not limited thereto. A thickness of the electron transport region ETR may be, for example, in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1 below.

[Formula ET-1]

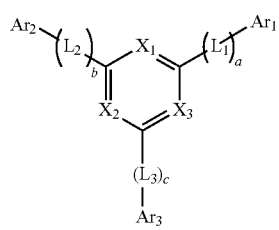

In Formula ET-1, at least one among $X_1$ to $X_3$ may be N, and the remainder may be $C(R_a)$. $R_a$ may be a hydrogen atom, a deuterium atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms. $Ar_1$ to $Ar_3$ may each independently be a hydrogen atom, a deuterium atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

In Formula ET-1, a to c may each independently be an integer from 0 to 10. In Formula ET-1, $L_1$ to $L_3$ may each independently be a direct linkage, a substituted or unsubstituted ring-forming arylene group having 6 to 30 carbon atoms, or a substituted or unsubstituted ring-forming heteroarylene group having 2 to 30 carbon atoms. In Formula ET-1, if a to c are 2 or more, $L_1$ to $L_3$ may each independently be a substituted or unsubstituted ring-forming arylene group having 6 to 30 carbon atoms, or a substituted or unsubstituted ring-forming heteroarylene group having 2 to 30 carbon atoms.

The electron transport region ETR may further include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-Tri(1-phenyl-1H-benzo[d] imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), or a mixture thereof.

The electron transport region ETR may further include a halogenated metal such as LiF, NaCl, CsF, RbCl, RbI, CuI, KI, a lanthanide metal such as Yb, and a co-deposited material of the above-described halogenated metal and lanthanide metals as well. For example, the electron transport region ETR may include KI:Yb, RbI:Yb, or the like as a co-deposited material. The electron transport region ETR may include metal oxide such as $Li_2O$, BaO, or Liq(8-hydroxyl-lithium quinolate), but embodiments are not limited thereto. The electron transport region ETR may be also formed using a mixture material of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, and/or metal stearates.

The electron transport region ETR may include the aforementioned compounds of the electron transport region in at least one of the electron injection layer EIL, the electron transport layer ETL, and the hole blocking layer (not shown).

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be achieved without substantial increase of a driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above-described range, satisfactory electron injection characteristics may be achieved without substantial increase of a driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second electrode EL2 may be a cathode, and if the first electrode EL1 is a cathode, the second electrode EL2 may be an anode.

The second electrode EL2 may be a transmissive electrode, a transflective electrode, or a reflective electrode. If the second electrode EL2 is a transmissive electrode, the second electrode EL2 may include transparent metal oxide such as indium tin oxide (ITO), indium zinc oxide (IZO), zinc oxide (ZnO), indium tin zinc oxide (ITZO), or the like.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (for example, AgMg, AgYb, or MgAg). In an embodiment, the second electrode EL2 may have a multilayered structure including a reflective film or a transflective film formed using the aforementioned materials and a transparent conductive film formed using indium tin oxide (ITO), indium zinc oxide (IZO), zinc oxide (ZnO), indium tin zinc oxide (ITZO), or the like. For example, the second electrode EL2 may include the aforementioned metal material, a combination of two or more metal materials selected from the aforementioned metal materials, or an oxide of the aforementioned metal materials.

Although not illustrated, the second electrode EL2 may be electrically connected to an auxiliary electrode. If the second electrode EL2 is electrically connected with the auxiliary electrode, the resistance of the second electrode EL2 may decrease.

A capping layer CPL may be further disposed on the second electrode EL2 of the organic electroluminescence device ED according to an embodiment. The capping layer CPL may include multiple layers or a single layer.

In an embodiment, the capping layer CPL may be an organic layer or an inorganic layer. For example, if the capping layer CPL includes an inorganic material, the inorganic material may include an alkali metal compound such as LiF, an alkaline earth metal compound such as $MgF_2$, SiON, $SiN_X$, $SiO_Y$, or the like.

For example, if the capping layer CPL includes an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol sol-9-yl) triphenylamine (TCTA), etc., epoxy resin, or acrylate such as methacrylate. However, embodiments are not limited thereto, and the capping layer CPL may include at least one among Compounds P1 to P5 below.

P1
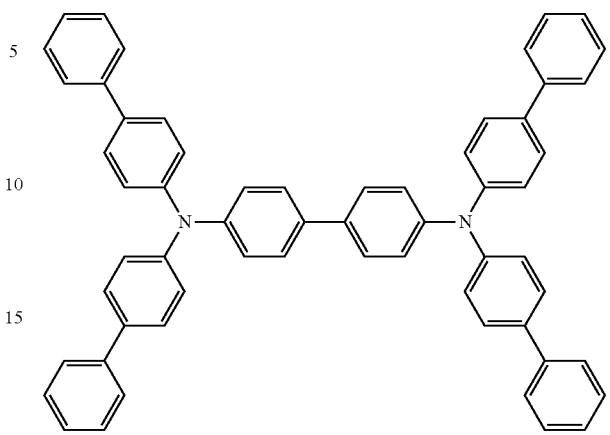

P2
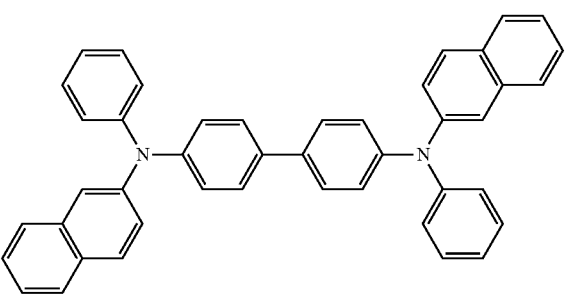

P3
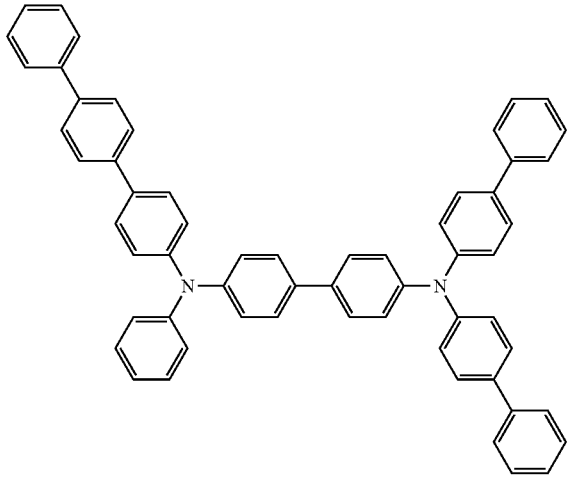

P4
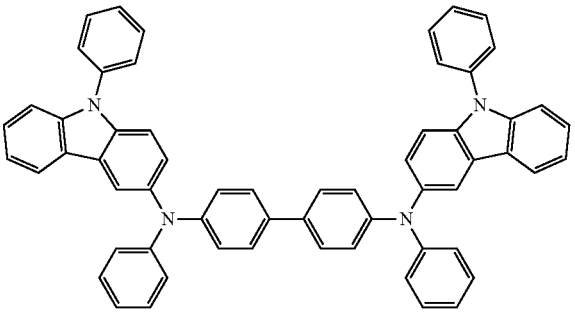

-continued

P5

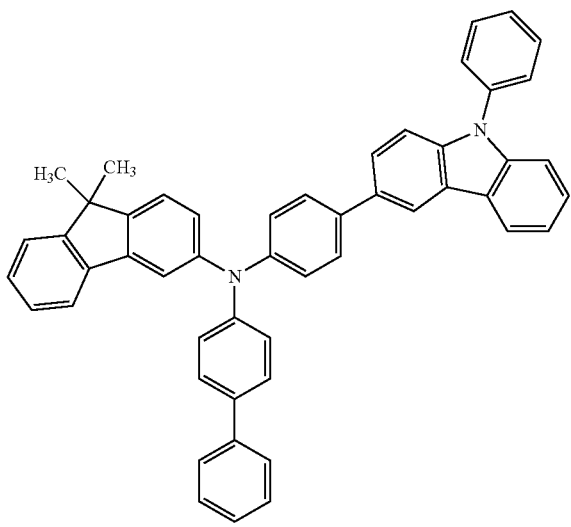

A refractive index of the capping layer CPL may be equal to or greater than about 1.6. For example, with respect to light in a wavelength range of about 550 nm to about 660 nm, the refractive index of the capping layer CPL may be equal to or greater than about 1.6.

Figure 6:
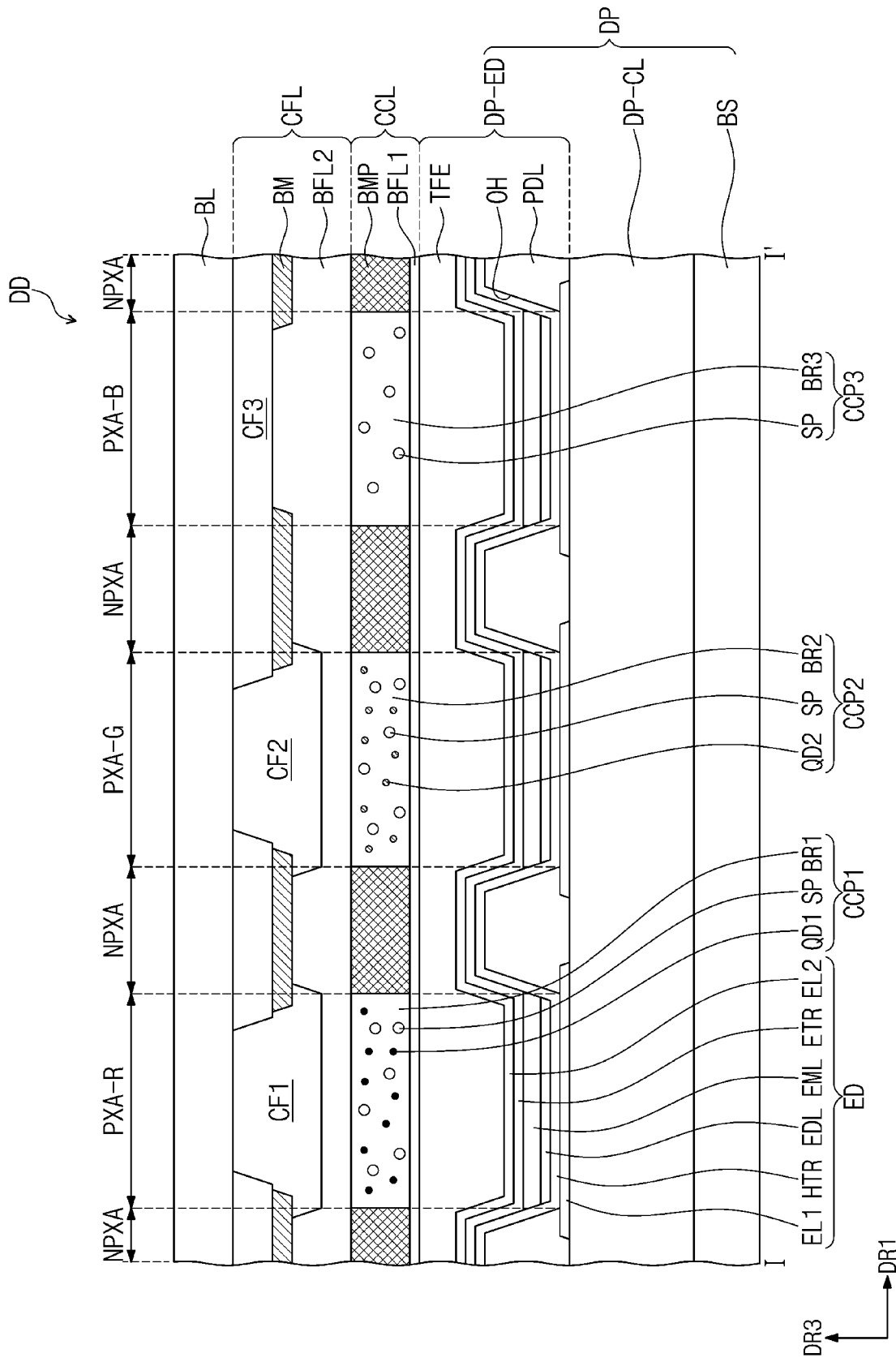
FIG. 6 is a schematic cross-sectional view illustrating a display apparatus according to an embodiment.
Figure 7:
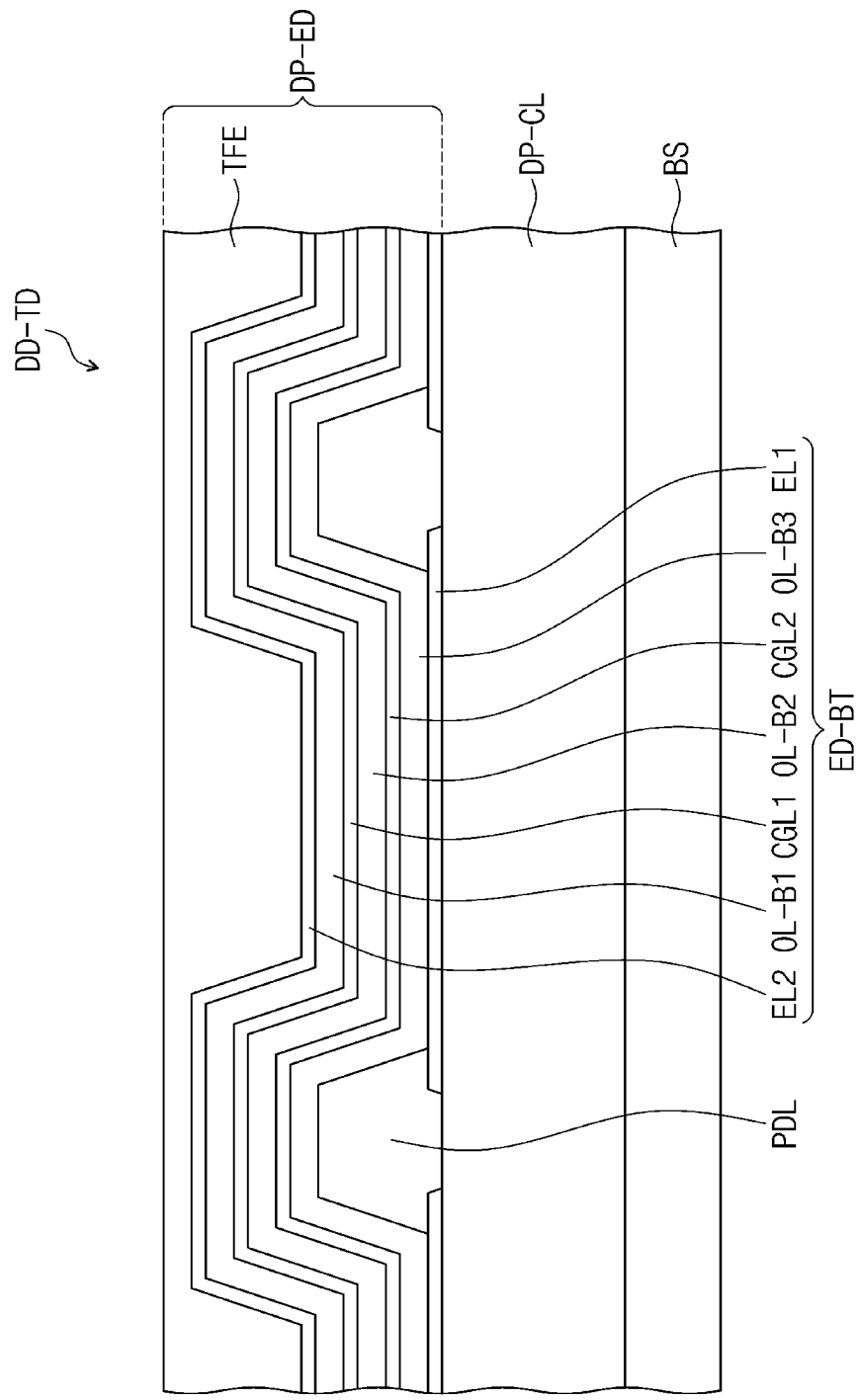
FIG. 7 is a schematic cross-sectional view illustrating a display apparatus according to an embodiment.

FIG. 6 and FIG. 7 are each a schematic cross-sectional view of a display apparatus according to an embodiment. In the description of the display apparatus according to an embodiment described with reference to FIG. 6 and FIG. 7, the contents overlapping with those described in FIGS. 1 to 5 will not be described again, and differences will be described.

Referring to FIG. 6, a display apparatus DD according to an embodiment may include a display panel DP including a display device layer DP-ED, a color filter layer CFL and a light control layer CCL disposed on the display panel DP.

In an embodiment illustrated in FIG. 6, the display panel DP may include a base layer BS, a circuit layer DP-CL provided on the base layer BS, and a display device layer DP-ED, and the display device layer DP-ED may include an organic electroluminescence device ED.

The organic electroluminescence device ED may include a first electrode EL1, a hole transport region HTR disposed on the first electrode EL1, an exciton diffusion layer EDL disposed on the hole transport region HTR, an emission layer EML disposed on the exciton diffusion layer EDL, an electron transport region ETR disposed on the emission layer EML, and a second electrode EL2 disposed on the electron transport region ETR. The structure of the organic electroluminescence device in FIGS. 3 to 5 described above may be equally applicable to the structure of the organic electroluminescence device ED illustrated in FIG. 6.

Referring to FIG. 6, the emission layer EML may be disposed in an opening OH defined in a pixel-defining film PDL. For example, the emission layer EML separated by the pixel-defining film PDL and correspondingly provided to each of the light-emitting regions PXA-R, PXA-G, and PXA-B may emit light of a same wavelength region. In the display apparatus DD according to an embodiment, the emission layer EML may emit blue light. Although not shown in the illustration, in an embodiment, the emission layer EML may be provided as a common layer over all of the light-emitting regions PXA-R, PXA-G, and PXA-B.

The light control layer CCL may be disposed on the display panel DP. The light control layer CCL may include a light conversion body. The light conversion body may include a quantum dot or a phosphor. The light conversion body may convert the wavelength of received light to emit. For example, the light control layer CCL may be a layer including a quantum dot or a layer including a phosphor.

The light control layer CCL may include light control portions CCP1, CCP2, and CCP3. The light control portions CCP1, CCP2, and CCP3 may be spaced apart from each other.

Referring to FIG. 6, a division pattern BMP may be disposed between the light control portions CCP1, CCP2, and CCP3 spaced apart from each other, but embodiments are not limited thereto. In FIG. 6, the division pattern BMP is illustrated to be non-overlapping with the light control portions CCP1, CCP2, and CCP3, but edges of the light control portions CCP1, CCP2, and CCP3 may at least partially overlap with the division pattern BMP.

The light control layer CCL may include the first light control portion CCP1 including a first quantum dot QD1 that converts a first color light provided by the organic electroluminescence device ED into a second color light, the second light control portion CCP2 including a second quantum dot QD2 that converts the first color light into a third color light, and the third light control portion CCP3 that transmits the first color light.

In an embodiment, the first light control portion CCP1 may provide red light, which is a second color light, and the second light control portion CCP2 may provide green light, which is a third color light. The third light control portion CCP3 may transmit and provide blue light, which is the first light provided by the organic electroluminescence device ED. For example, the first quantum dot QD1 may be a red quantum dot, and the second quantum dot QD2 may be a green quantum dot. The emission layer EML may include a quantum dot material. The core of the quantum dot may be selected from Group II-VI compounds, Group III-V compounds, Group I-III-VI compounds, Group III-V compounds, Group IV-VI compounds, Group IV elements, Group IV compounds, and a combination thereof.

The Group II-VI compounds may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compounds may include a binary compound such as $In_2S_3$ and $In_2Se_3$, a ternary compound such as $InGaS_3$ and $InGaSe_3$, or any combination thereof.

The Group I-III-VI compounds may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound such as $AgInGaS_2$ and $CuInGaS_2$.

The Group III-V compounds may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compounds may further include a Group II metal. For example, InZnP, or the like may be selected as III-II-V compounds.

The Group IV-VI compounds may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. Group IV elements may be selected from the group consisting of Si, Ge, and a mixture thereof. Group IV compounds may be a binary compound selected from the group consisting of SiC, SiGe, and a mixture thereof.

For example, a binary compound, a ternary compound, or a quaternary compound may be present in the particle at a uniform concentration, or may be present in the same particle at a partially different concentration distribution. The compounds may have a core/shell structure in which one quantum dot surrounds another quantum dot. In the core/shell structure, a concentration of an element present in the shell may have a concentration gradient gradually decreasing toward the core.

In embodiments, the quantum dot may have a core-shell structure including a core that includes a nanocrystal and a shell surrounding the core. The shell of the quantum dot may serve as a protective layer for maintaining characteristics of a semiconductor by preventing chemical modification of the core and/or a charging layer for imparting electrophoretic characteristics to the quantum dot. The shell may be a single layer or multiples layers. Examples of the shell of the quantum dot may include metal or non-metal oxide, a semiconductor compound, or a combination thereof.

For example, the metal or non-metal oxide may be illustrated as a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments are not limited thereto.

The semiconductor compound may be selected from CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Color purity or color gamut may be improved in these ranges. Light emitted through such a quantum dot may be emitted in all directions, and an improved wide viewing angle may be obtained.

The shape of the quantum dot may a shape generally used in the art, and is not particularly limited. For example, the quantum dot may have a spherical, a pyramidal, a multi-arm, or a cubic shape, or the quantum dot may be in the form of nanoparticles, nanotubes, nanowires, nanofibers, plate-shaped nanoparticles, or the like.

The quantum dot may control the color of emitted light according to the particle size, and thus, the quantum dots may have various light-emitting colors such as blue, red, green, and the like.

The light control layer CCL may further include a scatterer SP. The first light control portion CCP1 may include the first quantum dot QD1 and the scatterer SP, the second light control portion CCP2 may include the second quantum dot QD2 and the scatterer SP, and the third light control portion CCP3 may not include a quantum dot but may include the scatterer SP.

The scatterer SP may be an inorganic particle. For example, the scatterer SP may include at least one of $TiO_2$, ZnO, $Al_2O_3$, $SiO_2$, and hollow silica. The scatterer SP may include at least one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

Each of the first light control portion CCP1, the second light control portion CCP2, and the third light control portion CCP3 may include base resins BR1, BR2, and BR3 which disperse the quantum dots QD1 and QD2 and the scatterer SP. In an embodiment, the first light control portion CCP1 may include the first quantum dot QD1 and the scatterer SP dispersed in the first base resin BR1, the second light control portion CCP2 may include the second quantum dot QD2 and scatterer SP dispersed in the second base resin BR2, and the third light control portion CCP3 may include the scatterer SP dispersed in the third base resin BR3. The base resins BR1, BR2, and BR3 are media in which the quantum dots QD1 and QD2 and the scatterer SP are dispersed, and may be formed including various resin compositions which may be generally referred to as binders. For example, the base resins BR1, BR2, and BR3 may be acrylic-based resins, urethane-based resins, silicone-based resins, epoxy-based resins, and the like. The base resins BR1, BR2, and BR3 may be transparent resins. In an embodiment, the first base resin BR1, the second base resin BR2, and the third base resin BR3 may be the same as or different from each other.

The light control layer CCL may include a barrier layer BFL1. The barrier layer BFL1 may prevent penetration of moisture and/or oxygen (hereinafter referred to as "moisture/oxygen"). The barrier layer BFL1 may be disposed on the light control portions CCP1, CCP2, and CCP3 to prevent the light control portions CCP1, CCP2, and CCP3 from being exposed to moisture/oxygen. The barrier layer BFL1 may cover the light control portions CCP1, CCP2, and CCP3. A barrier layer BFL2 may be provided between the light control portions CCP1, CCP2, and CCP3 and the color filter layer CFL as well.

The barrier layers BFL1 and BFL2 may include at least one inorganic layer. For example, the barrier layers BFL1 and BFL2 may be formed including an inorganic material. For example, the barrier layers BFL1 and BFL2 may be formed including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured. The barrier layers BFL1 and BFL2 may further include an organic film. The barrier layers BFL1 and BFL2 may be made of a single layer or of multiple layers.

In the display apparatus DD according to an embodiment, the color filter layer CFL may be disposed on the light control layer CCL. For example, the color filter layer CFL may be directly disposed on the light control layer CCL. For example, the barrier layer BFL2 may be omitted.

The color filter layer CFL may include a light-shielding portion BM and filters CF1, CF2, and CF3. The color filter layer CFL may include a first filter CF1 that transmits a second color light, a second filter CF2 that transmits a third color light, and a third filter CF3 that transmits a first color light. For example, the first filter CF1 may be a red filter, the second filter CF2 may be a green filter, and the third filter CF3 may be a blue filter. Each of the filters CF1, CF2, and CF3 may include polymer photosensitive resin and a pigment or a dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include polymer photosensitive resin and may not include a pigment or dye. The third filter CF3 may be transparent. The third filter CF3 may be formed of transparent photosensitive resin.

In an embodiment, the first filter CF1 and the second filter CF2 each may be a yellow filter. The first filter CF1 and the second filter CF2 may not be distinguished from each other and provided integrally.

The light-shielding portion BM may be a black matrix. The light-shielding portion BM may be formed by including an organic light-shielding material or an inorganic light-shielding material including a black pigment or a black dye. The light-shielding portion BM may prevent light leakage, and separate the boundary between the adjacent filters CF1, CF2, and CF3. In an embodiment, the light-shielding portion BM may be formed of a blue filter.

The first to the third filters CF1, CF2, and CF3 may be disposed to respectively correspond to a red light-emitting region PXA-R, a green light-emitting region PXA-G, and a blue light-emitting region PXA-B.

A base substrate BL may be disposed on the color filter layer CFL. The base substrate BL may be a member that provides a base surface on which the color filter layer CFL and the light control layer CCL are disposed. The base substrate BL may be a glass substrate, a metal substrate, a plastic substrate, or the like. However, embodiments are not limited thereto, and the base substrate BL may be an inorganic layer, an organic layer, or a composite material layer. Although not shown in the drawings, the base substrate BL may be omitted in another embodiment.

FIG. 7 is a schematic cross-sectional view illustrating a portion of a display apparatus according to an embodiment. FIG. 7 illustrates a cross-sectional view of a portion corresponding to the display panel DP of FIG. 6. In the display apparatus DD-TD according to an embodiment, the organic electroluminescence device ED-BT may include light-emitting structures OL-B1, OL-B2, and OL-B3. The organic electroluminescence device ED-BT may include a first electrode EL1 and a second electrode EL2 that face each other, and light-emitting structures OL-B1, OL-B2, and OL-B3 that are provided by sequentially stacking in a thickness direction between the first electrode EL1 and the second electrode EL2. Each of the light-emitting structures OL-B1, OL-B2, and OL-B3 may include the emission layer EML (FIG. 6), and the hole transport region HTR and the electron transport region ETR disposed with the emission layer EML (FIG. 6) therebetween.

For example, the organic electroluminescence device ED-BT included in the display apparatus DD-TD according to an embodiment may be an organic electroluminescence device having a tandem structure including multiple emission layers.

In an embodiment illustrated in FIG. 7, all the light emitted from each of the light-emitting structures OL-B1, OL-B2, and OL-B3 may be blue light. However, embodiments are not limited thereto, and the wavelength ranges of light emitted from each of the light-emitting structures OL-B1, OL-B2, and OL-B3 may be different from each other. For example, the organic electroluminescence device ED-BT including the light-emitting structures OL-B1, OL-B2, and OL-B3 that emit light of different wavelength regions may emit white light.

A charge generating layer CGL1 and CGL2 may be disposed between the adjacent light-emitting structures OL-B1, OL-B2, and OL-B3. The charge generating layer CGL1 and CGL2 may include a p-type charge generating layer and/or an n-type charge generating layer.

Hereinafter, the application will be described in detail with reference to specific examples and comparative examples. The following examples are only examples to assist the understanding of the disclosure, and the scope of the disclosure is not limited thereto.

Synthesis Example

A compound according to an embodiment may be synthesized, for example, as follows. However, a method for synthesizing a compound according to an embodiment is not limited thereto.

1. Synthesis of Compound HTa-5

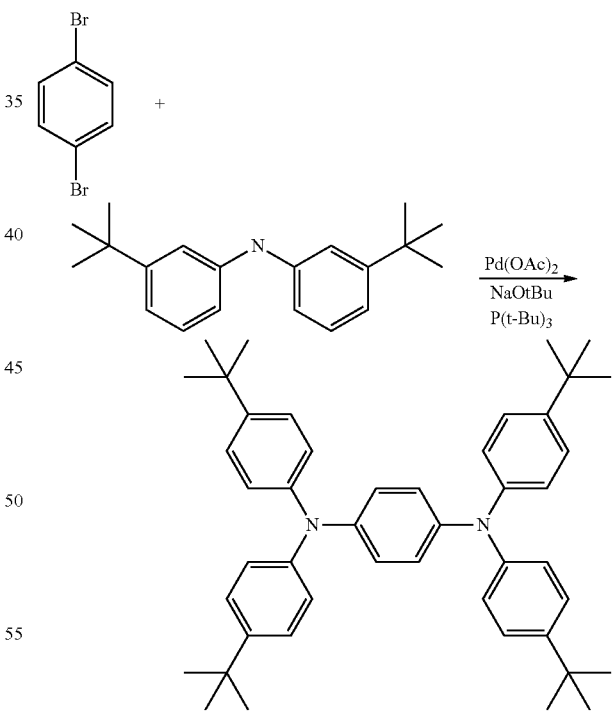

To a 3-neck round bottom flask, 1,4-dibromobenzene (1 equiv, 5 mmol), NaOtBu (2.5 equiv), Pd(OAc)$_2$ (0.05 equiv), P(t-Bu)$_3$ (0.15 equiv) were sequentially added, and xylene was added so that a concentration of 1,4-dibromobenzene was about 0.7 M. Bis(4-tert-butylphenyl)amine (2.5 equiv) was added under nitrogen, and the reaction mixture was heated to reflux overnight. After air cooling to room temperature, the concentrated residue under reduced pressure was separated by silica gel column chromatography using hexane:dichloromethane=5:1 as an elution solvent to obtain Compound HTa-5 (81%).
2. Compound HTa-7 (sigma Aldrich)
3. Compound HTb-01 (sigma Aldrich)
4. Synthesis of Compound ET-01

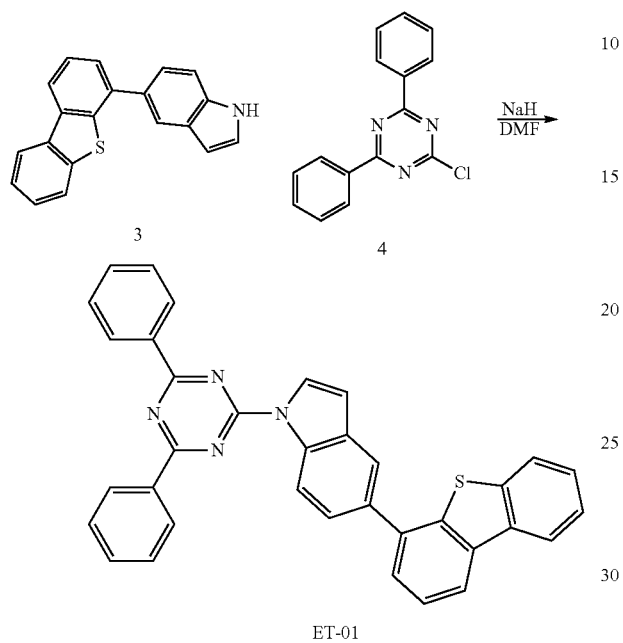

ET-01

Under Ar atmosphere, Compound 3 (1,000 mg, 3.5 mmol), Compound 4 (944 mg, 3.5 mmol), NaH (240 mg, 10 mmol), and DMF were added sequentially and stirred at room temperature for about 24 hours. After the reaction was completed, ice water was added, and the obtained precipitate was filtered, followed by washing with DCM to obtain Compound ET-01 (1290 mg, 72%).
5. Synthesis of Compound D-1

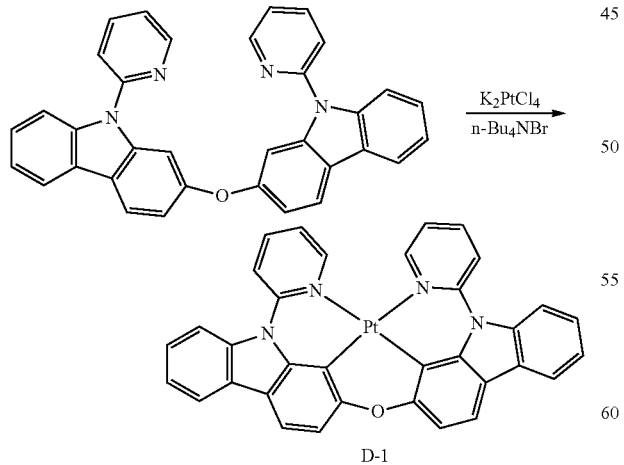

D-1

To 100 ml 3-neck round bottom flask, 9-(pyridin-2-yl)-2-(9-(pyridin-2-yl)-9H-carbazol-2-yloxy)-9H-carbazole (240 mg, 0.48 mmol), $K_2PtCl_4$ (208 mg, 0.50 mmol), and n-$Bu_4NBr$ (15.4 mg, 0.048 mmol) were added, followed by acetic acid (30 ml). The reaction mixture was bubbled with nitrogen for about 30 minutes and stirred at room temperature for about 12 hours. After warming to about 110° C. for about 36 hours in an oil bath and cooling to room temperature, water (100 ml) was added. The precipitate collected by filtration was washed three times with water and dried in air. The collected solid was purified by silica gel chromatography using dichloromethane as an elution solvent to obtain Compound D-1 (280 mg, 85%).

(Device Manufacturing Example)

Organic electroluminescence devices were manufactured using a first host, a second host, a third host, and a dopant below in order to evaluate characteristics of the organic electroluminescence devices according to Examples and Comparative Examples.

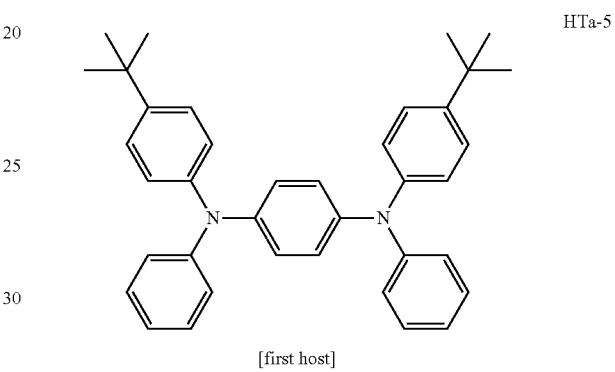

[first host]

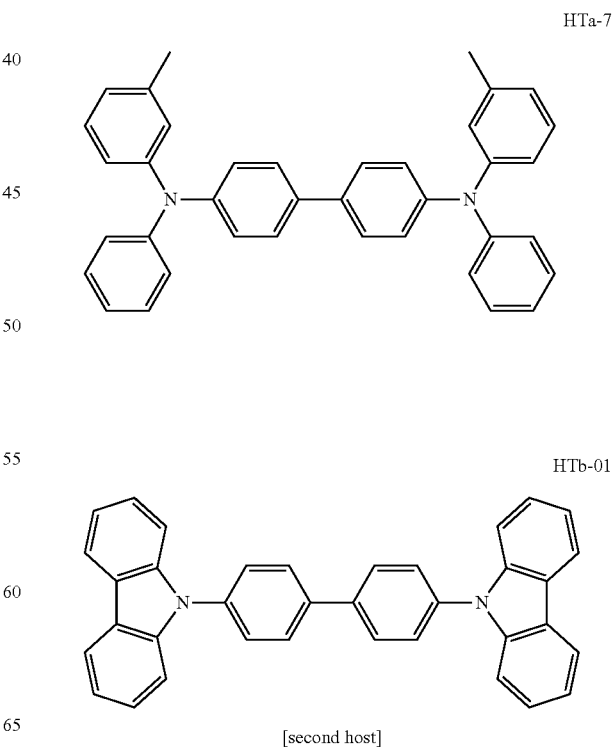

[second host]

ET-01

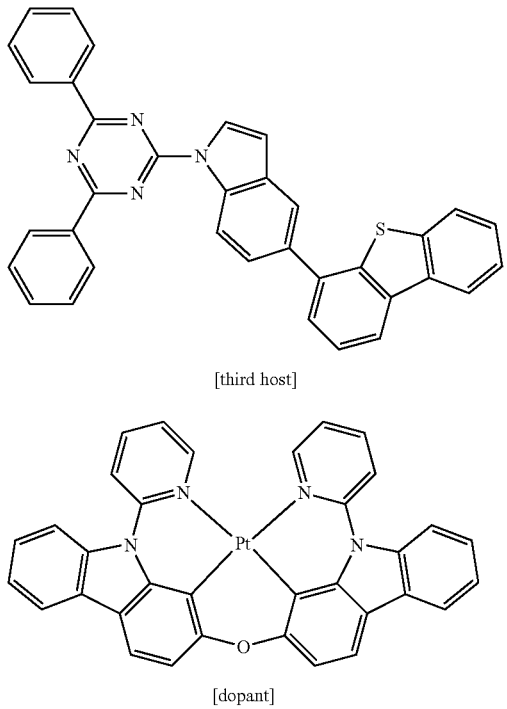

[third host]

D-1

[dopant]

The organic electroluminescence devices were manufactured by a method below. The organic electroluminescence devices of Examples 1 to 5 were manufactured using the aforementioned Example Compounds HTa-5 and HTa-7 as exciton diffusion layer materials, and HTb-1, ET-1, and D-1 as emission layer materials. Comparative Example 1 corresponds to an organic electroluminescent device that does not include the exciton diffusion layer compared to Examples 1 to 5.

(Fabrication of Organic Electroluminescence Device)

Example 1

As a substrate and anode, an ITO formed glass substrate of about 15 Ω/cm² (about 1200 Å) made by Corning Co. was cut to a size of 50 mm×50 mm×0.7 mm, cleaned by ultrasonic waves using isopropyl alcohol and pure water for about five minutes each, and irradiated with ultraviolet rays for about 30 minutes, exposed to ozone and washed to install the glass substrate on a vacuum deposition apparatus.

On the upper portion of the ITO anode formed on the glass substrate, 2-TNATA was deposited in vacuum to form a 600 Å-thick hole injection layer, and NPB was deposited in vacuum to form a 300 Å-thick hole transport layer. A 50 Å-thick electron blocking layer was formed using TCTA. A 20 Å-thick exciton diffusion layer was formed using HTa-5 as a first host. While maintaining a 1:1 molar ratio of HTb-1:ET-1, (HTb-1:ET-1):D-1 was co-deposited on the exciton diffusion layer in a weight ratio of about 90:10 to form a 380 Å-thick emission layer. On the upper portion of the emission layer, diphenyl(4-(triphenylsilyl)phenyl)-phosphine oxide (TSPO1) was deposited to form a 50 Å-thick hole blocking layer, and Alq3 was deposited to form a 300 Å-thick electron transport layer. On the upper portion of the electron transport layer, LiF was deposited to form a 10 Å-thick electron injection layer, and Al was deposited in vacuum to form a 3,000 Å-thick cathode to fabricate an organic light-emitting device. Each layer was formed by a vacuum deposition method.

Example 2

An organic electroluminescent device was fabricated in the same manner as in Example 1, except that the exciton diffusion layer was deposited to a thickness of about 50 Å and the emission layer was deposited to a thickness of about 350 Å.

Example 3

An organic electroluminescent device was fabricated in the same manner as in Example 1, except that the exciton diffusion layer with a thickness of about 50 Å was deposited by using HTa-7 instead of HTa-5 as the first host, and the emission layer was deposited to a thickness of about 350 Å.

Example 4

An organic electroluminescent device was fabricated in the same manner as in Example 1, except that the exciton diffusion layer with a thickness of about 100 Å was deposited by using HTa-7 instead of HTa-5 as the first host, and the emission layer was deposited to a thickness of about 300 Å.

Example 5

An organic electroluminescent device was fabricated in the same manner as in Example 1, except that the exciton diffusion layer with a thickness of about 150 Å was deposited by using HTa-7 instead of HTa-5 as the first host, and the emission layer was deposited to a thickness of about 250 Å.

Comparative Example 1

An organic electroluminescent device was fabricated in the same manner as in Example 1, except that the exciton diffusion layer was not deposited, and the emission layer was deposited to a thickness of about 400 Å.

(Evaluation of Energy Levels of the Second Host, the Third Host, and the Dopant)

The HOMO energy levels and LUMO energy levels of the compounds used in Examples 1 to 5 and Comparative Example 1 were measured using a cyclic voltammetry, and the results are shown in Table 1. The cyclic voltammetry was performed using EG&G Instruments model 283 potentiostat, and was measured at a scan rate of about 100 mV/s by using a silver wire pseudo-reference electrode in dried and degassed ethylene carbonate/dimethylcarbonate (1:1) containing about 0.1 M tetrabutylammonium hexafluorophosphate. Decamethylferrocene (−0.47V vs. ferrocene) was used as an internal standard, and all recorded potentials were based on reversible potentials.

TABLE 1

| Compound type | HOMO energy level(eV) | LUMO energy level(eV) |
|---|---|---|
| HTb-01 | −6.0 | −2.4 |
| ET-01 | −5.96 | −2.61 |
| ET-02 | −5.94 | −2.59 |
| D-1 | −5.2 | −1.9 |

Material and thicknesses of the exciton diffusion layer and the emission layer used in Examples and Comparative Examples are shown in Table 2 below.

TABLE 2

| Device manufacturing example | First host | Second host | Third host | Dopant | Thickness of the exciton diffusion layer (nm) | Thickness of the emission layer (nm) |
|---|---|---|---|---|---|---|
| Example 1 | HTa-5 | HTb-1 | ET-1 | D-1 | 2 | 38 |
| Example 2 | HTa-5 | HTb-1 | ET-1 | D-1 | 5 | 35 |
| Example 3 | HTa-7 | HTb-1 | ET-1 | D-1 | 5 | 35 |
| Example 4 | HTa-7 | HTb-1 | ET-1 | D-1 | 10 | 30 |
| Example 5 | HTa-7 | HTb-1 | ET-1 | D-1 | 15 | 25 |
| Comparative Example 1 | — | HTb-1 | ET-1 | D-1 | — | 40 |

(Evaluation of characteristics of an organic electroluminescence device) To evaluate characteristics of the organic electroluminescence devices according to Examples and Comparative Examples, current efficiency, external quantum efficiency, power efficiency, and service life were measured. Current efficiency (cd/A), quantum efficiency (%), and power efficiency (lm/W) at luminance of 1,000 cd/m$^2$ of the manufactured organic electroluminescence devices are shown in Table 3. Device Service time (T95), which is the time to take for the luminance to decrease from the luminance 1000 cd/m$^2$ as a standard to the 95% are shown as well.

TABLE 3

| | Current efficiency (cd/A) | Quantum efficiency (%) | Power efficiency (lm/W) | Service life (T95(h)) |
|---|---|---|---|---|
| Example 1 | 51 | 14 | 27 | 30 |
| Example 2 | 50 | 15 | 26 | 40 |
| Example 3 | 45 | 17 | 25 | 35 |
| Example 4 | 46 | 18 | 25 | 45 |
| Example 5 | 43 | 16 | 23 | 32 |
| Comparative Example 1 | 22 | 8 | 20 | 25 |

Referring to the results in Table 3, it may be confirmed that the organic electroluminescence device including the exciton diffusion layer in Examples 1 to 5 exhibit relatively higher current efficiency, external quantum efficiency, power efficiency, and service life than Comparative Example 1 without the exciton diffusion layer. Examples 1 to 5 according to the embodiment of the inventive concept include the exciton diffusion layer directly disposed on the emission layer, and thus exciton diffusion from the exciton diffusion layer to the emission layer may occur. Accordingly, exciton diffusion and direct recombination within the emission layer are utilized at the same time, so that more improved luminous efficiency and service life characteristics than those of the organic electroluminescence devices according to Comparative Examples may be exhibited.

The organic electroluminescence device according to an embodiment may include an exciton diffusion layer adjacent to an emission layer to increase a concentration of exciton in the emission layer, thereby improving service life and luminous efficiency of the organic electroluminescence device.

The organic electroluminescence device according to an embodiment may achieve high luminous efficiency and improved service life by including both the exciton diffusion layer including the first host according to an embodiment, and the emission layer including the second host, the third host, and the dopant according to an embodiment.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An organic electroluminescence device comprising:
a first electrode;
a hole transport region disposed on the first electrode;
an exciton diffusion layer disposed on the hole transport region and comprising a first host;
an emission layer disposed on the exciton diffusion layer and comprising a second host, a third host, and a phosphorescent dopant;
an electron transport region disposed on the emission layer; and
a second electrode disposed on the electron transport region, wherein
a thickness of the exciton diffusion layer is less than or equal to a triplet exciton diffusion length of the first host, and
the first host is represented by Formula 1:

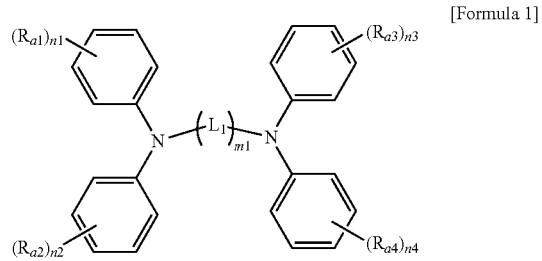

[Formula 1]

wherein in Formula 1,
$L_1$ is a substituted or unsubstituted ring-forming arylene group having 6 to 30 carbon atoms, or a substituted or unsubstituted ring-forming heteroarylene group having 2 to 30 carbon atoms,
$R_{a1}$ to $R_{a4}$ are each independently a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, m1 is 1 or 2; and n1 to n4 are each independently an integer from 0 to 5.

2. The organic electroluminescence device of claim 1, wherein an absolute value of a highest occupied molecular orbital (HOMO) energy level of the first host is in a range of about 4.7 eV to about 5.1 eV.

3. The organic electroluminescence device of claim 1, wherein an absolute value of a difference between a highest occupied molecular orbital (HOMO) energy level of the first host and a highest occupied molecular orbital (HOMO) energy level of the second host is in a range of about 0.2 eV to about 1.5 eV, and an absolute value of a difference between the highest occupied molecular orbital (HOMO) energy level of the first host and a highest occupied molecular orbital (HOMO) energy level of the third host is in a range of about 0.2 eV to about 1.5 eV.

4. The organic electroluminescence device of claim 1, wherein the hole transport region comprises:

a hole injection layer disposed on the first electrode;

a hole transport layer disposed on the hole injection layer; and an electron blocking layer disposed on the hole transport layer.

5. The organic electroluminescence device of claim 1, wherein the phosphorescent dopant comprises an organometallic complex containing Pt as a central metal atom.

6. The organic electroluminescence device of claim 1, wherein $L_1$ in Formula 1 is represented by one of Formula 2-1 to Formula 2-3:

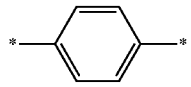

[Formula 2-1]

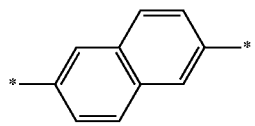

[Formula 2-2]

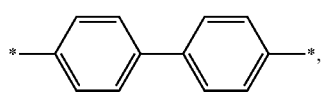

[Formula 2-3]

and in Formula 2-1 to Formula 2-3,

* indicates a binding site to a neighboring atom.

7. The organic electroluminescence device of claim 1, wherein the second host is represented by one of Formula 3-1 to Formula 3-4:

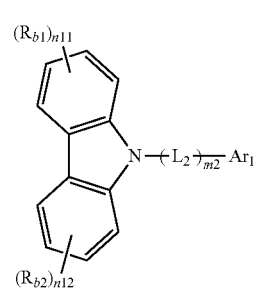

[Formula 3-1]

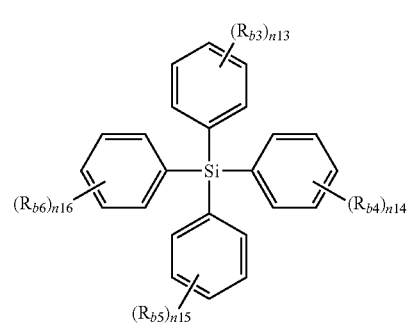

[Formula 3-2]

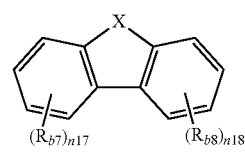

[Formula 3-3]

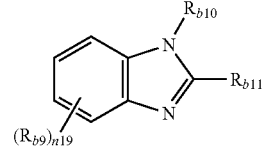

[Formula 3-4]

wherein in Formula 3-1 to Formula 3-4, $R_{b1}$ and $R_{b2}$ are each independently a hydrogen atom, a deuterium atom, a halogen atom, a substituted or unsubstituted phosphine oxide group, a substituted or unsubstituted silyl group, a substituted or unsubstituted alkyl group having 1 to 30 carbon atoms, a substituted or unsubstituted ring-forming aryl group having 6 to 30 carbon atoms, a substituted or unsubstituted ring-forming heteroaryl group having 2 to 30 carbon atoms, or are combined with an adjacent group to form a ring, $L_2$ is a direct linkage, a substituted or unsubstituted ring-forming arylene group having 6 to 30 carbon atoms, or a substituted or unsubstituted ring-forming heteroarylene group having 2 to 30 carbon atoms, $Ar_1$ is a substituted or unsubstituted alkyl group having 1 to 30 carbon atoms, a substituted or unsubstituted ring-forming hydrocarbon ring group having 4 to 30 carbon atoms, a substituted or unsubstituted ring-forming aryl group having 6 to 30 carbon atoms, a substituted or unsubstituted ring-forming heteroaryl group having 2 to 30 carbon atoms, or combined with an adjacent group to form a ring, $R_{b3}$ to $R_{b6}$ are each independently a hydrogen atom, a deuterium atom, a halogen atom, a substituted or unsubstituted silyl group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, X is O or S, R$_{b7}$ and R$_{b8}$ are each independently a hydrogen atom, a deuterium atom, a halogen atom, a substituted or unsubstituted phosphine oxide group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, R$_{b9}$ is a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms, R$_{b10}$ and R$_{b11}$ are each independently a substituted or unsubstituted ring-forming aryl group having 6 to 30 carbon atoms, or a substituted or unsubstituted ring-forming heteroaryl group having 2 to 30 carbon atoms, m2 is an integer from 0 to 4, n11, n12, and n17 to n19 are each independently an integer from 0 to 4, and n13 to n16 are each independently an integer from 0 to 5.

8. The organic electroluminescence device of claim 1, wherein the third host is represented by Formula 4:

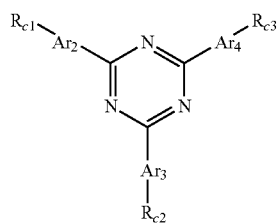

[Formula 4]

wherein in Formula 4,

Ar$_2$ to Ar$_4$ are each independently a direct linkage, a substituted or unsubstituted ring-forming arylene group having 6 to 30 carbon atoms, or a substituted or unsubstituted ring-forming heteroarylene group having 2 to 30 carbon atoms, and R$_{c1}$ to R$_{c3}$ are each independently a hydrogen atom, a deuterium atom, a halogen atom, a substituted or unsubstituted amine group, a substituted or unsubstituted alkoxy group, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms.

9. The organic electroluminescence device of claim 1, wherein the phosphorescent dopant is represented by Formula 5:

MT$_1$(T$_2$)$_d$     [Formula 5]

wherein in Formula 5,

M is Pt,

T$_1$ is a group represented by Formula 5-1 or Formula 5-2,

T$_2$ is monovalent ligand, and d is 0 or 1:

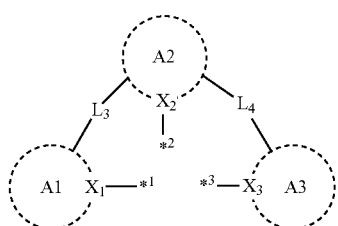

[Formula 5-1]

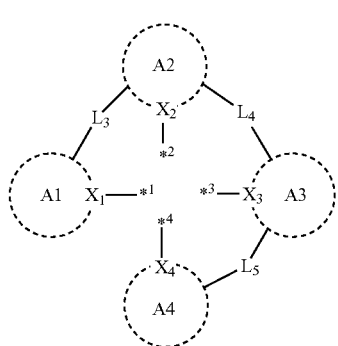

[Formula 5-2]

wherein in Formula 5-1 and Formula 5-2,

X$_1$ to X$_4$ are each independently N or C,

A1 to A4 are each independently a substituted or unsubstituted ring-forming monocyclic or polycyclic hydrocarbon ring group having 6 to 30 carbon atoms, or a substituted or unsubstituted ring-forming monocyclic or polycyclic heterocyclic group having 2 to 30 carbon atoms, L$_3$ to L$_5$ are each independently a direct linkage, O, or S, and

*$^1$ to *$^4$ are each independently a binding site to M.

10. The organic electroluminescence device of claim 9, wherein A1 to A4 are each independently represented by one of Formula 6-1 to Formula 6-6:

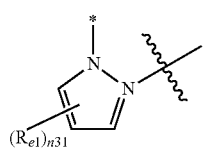

[Formula 6-1]

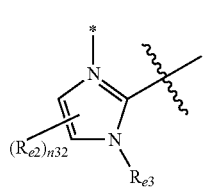

[Formula 6-2]

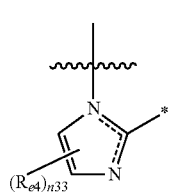

[Formula 6-3]

[Formula 6-4]

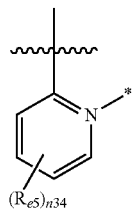

[Formula 6-5]

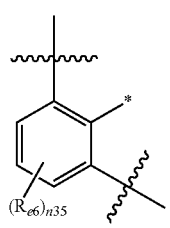

[Formula 6-6]

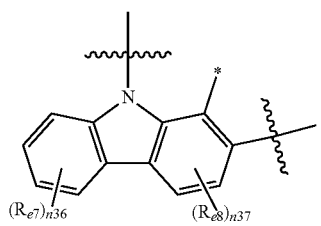

wherein in Formula 6-1 to 6-6, $R_{e1}$ to $R_{e8}$ are each independently a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, a substituted or unsubstituted ring-forming heteroaryl group having 2 to 30 carbon atoms, or are combined with an adjacent group to form a ring, n31 and n35 are each independently an integer from 0 to 3, n32, n33, and n37 are each independently an integer from 0 to 2, n34 and n36 are each independently an integer from 0 to 4, —* indicates a binding position to a Pt atom, and

indicates a binding position to an adjacent group.

11. The organic electroluminescence device of claim 1, wherein the first host is one selected from Compound Group 1:

[Compound Group 1]

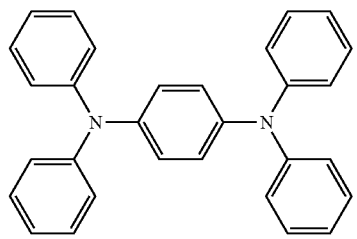
HTa-1

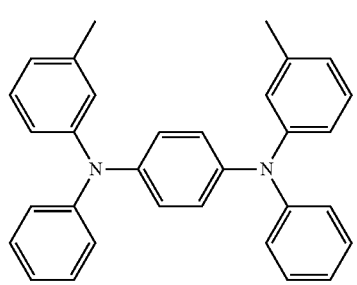
HTa-2

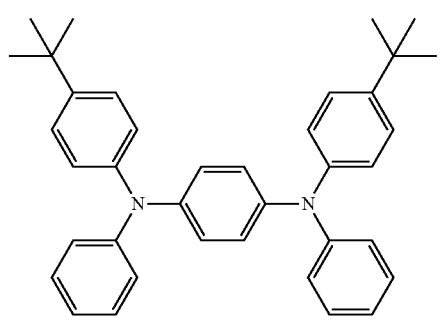
HTa-3

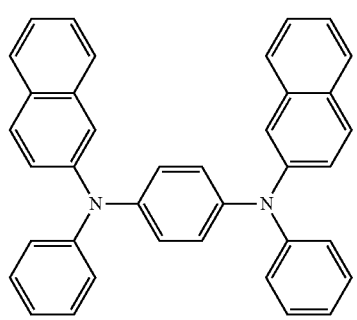
HTa-4

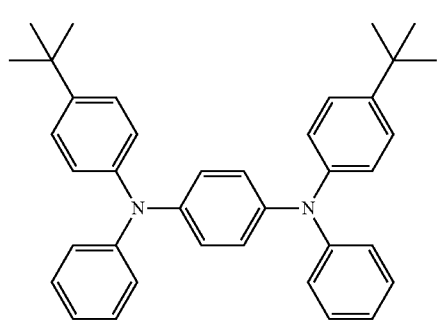
HTa-5

-continued
HTa-6
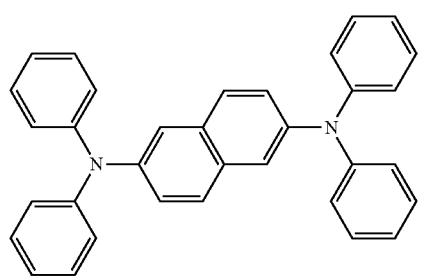
HTa-7
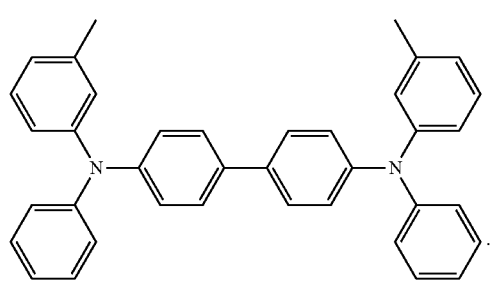
12. The organic electroluminescence device of claim 1, wherein the second host is one selected from Compound Group 2:
[Compound Group 2]
HTb-01
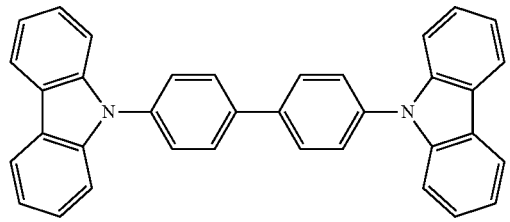
HTb-02
HTb-03
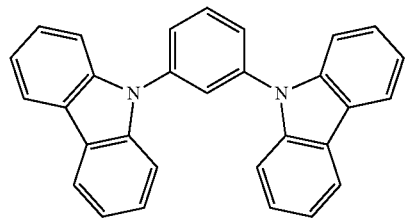
-continued
HTb-04
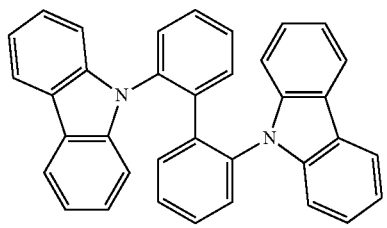
HTb-05
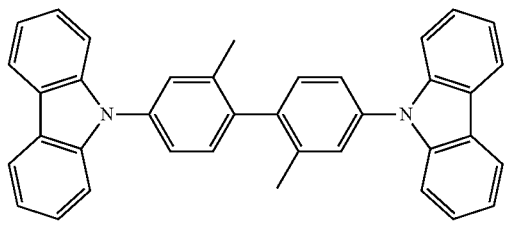
HTb-06
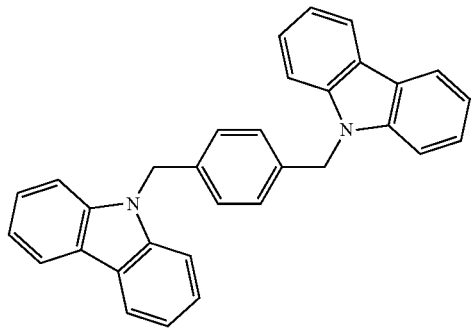
HTb-07
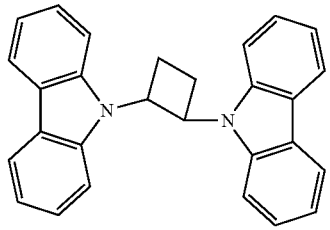
HTb-08
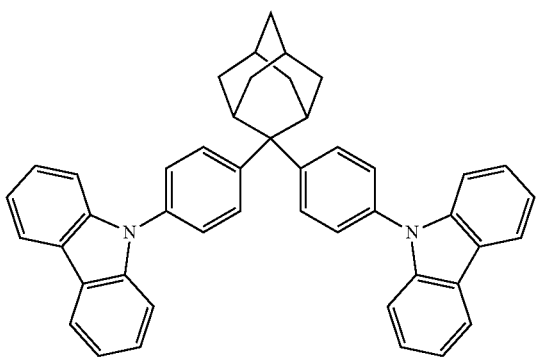

HTb-09
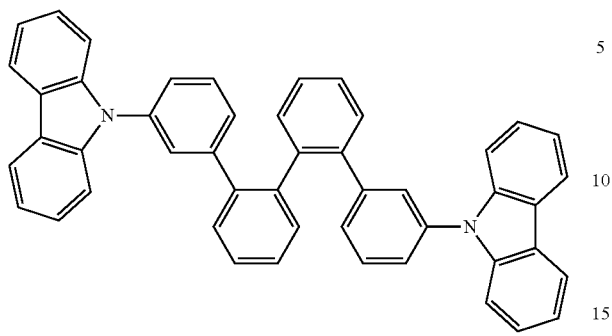
HTb-13
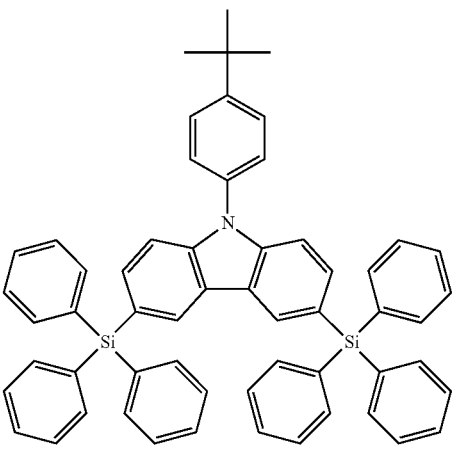
HTb-10
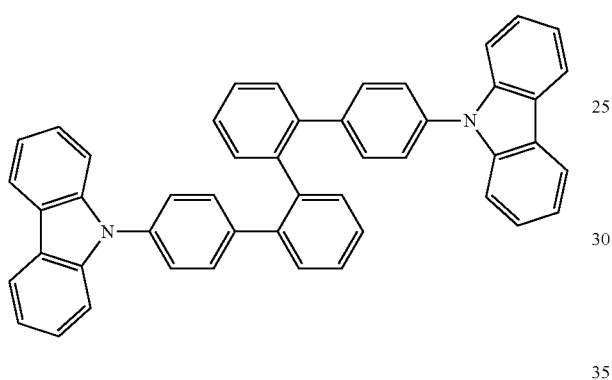
HTb-14
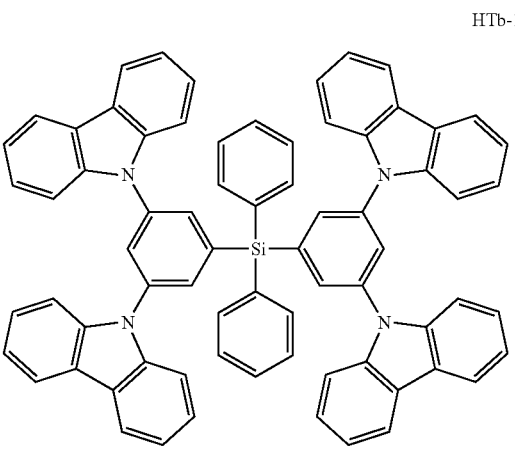
HTb-11
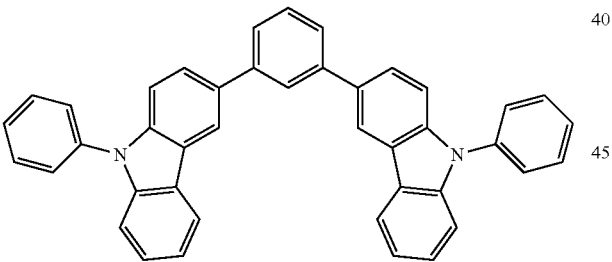
HTb-15
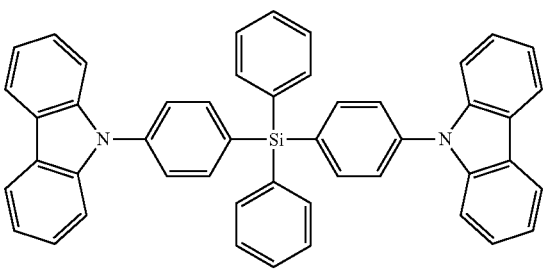
HTb-12
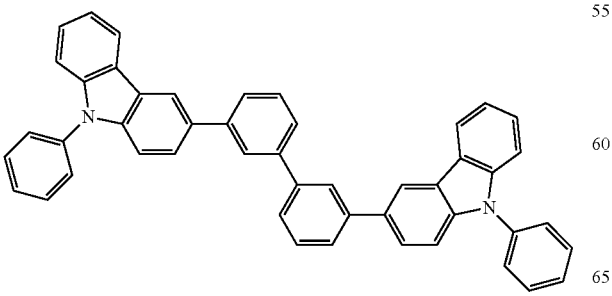
HTb-16
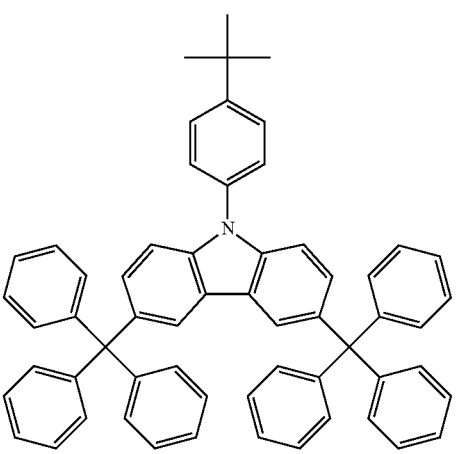

-continued
HTb-17
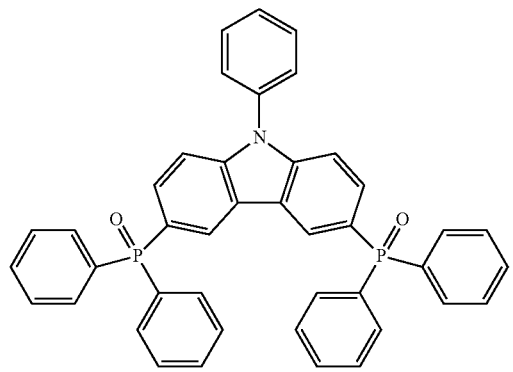
HTb-18
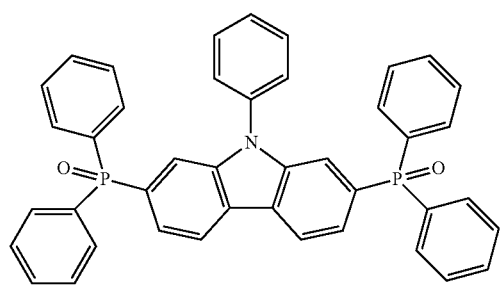
HTb-19
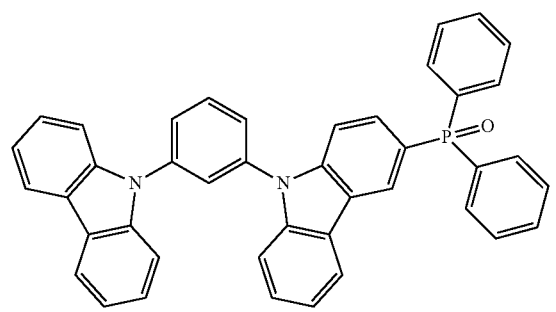
HTb-20
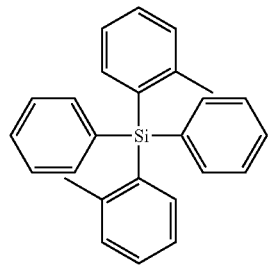
HTb-21
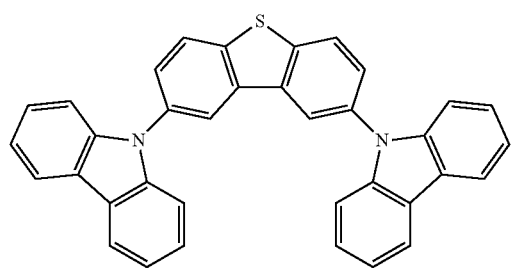
-continued
HTb-22
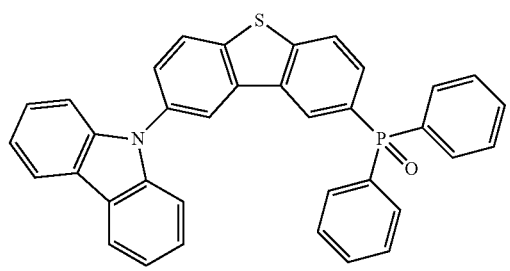
HTb-23
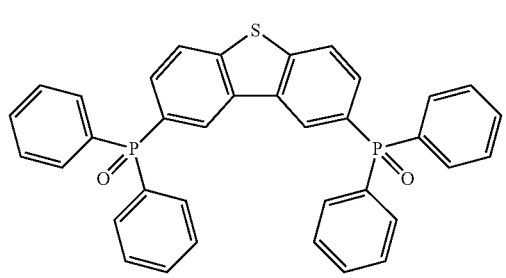
HTb-24
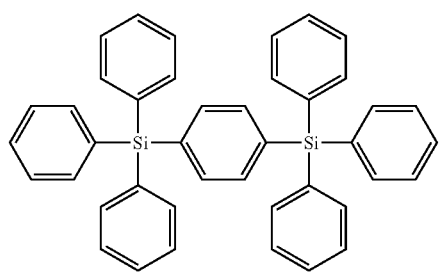
HTb-25
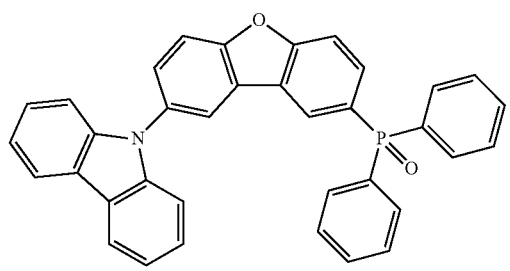
HTb-26
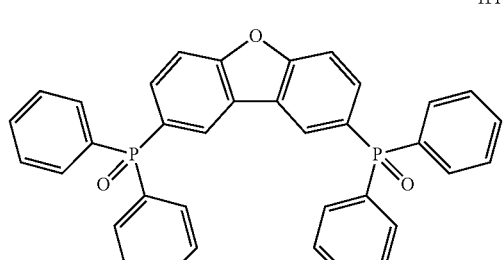

HTb-27
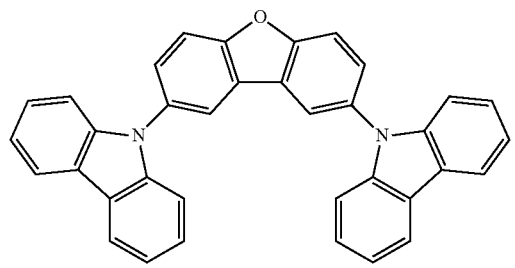
HTb-28
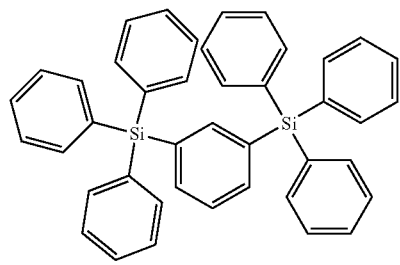
HTb-29
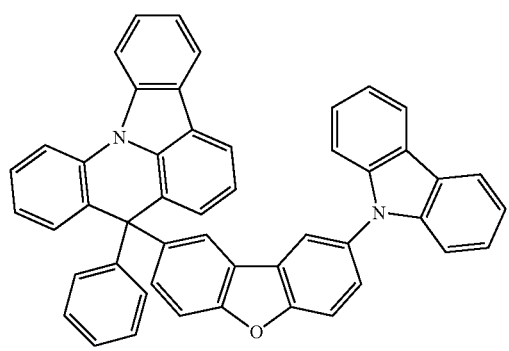
HTb-30
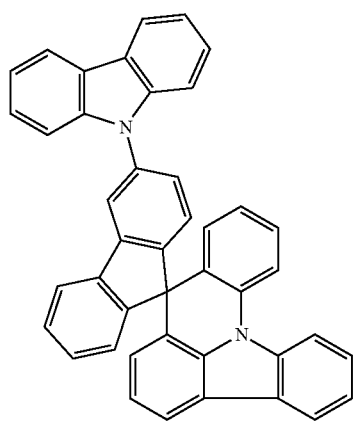
HTb-31
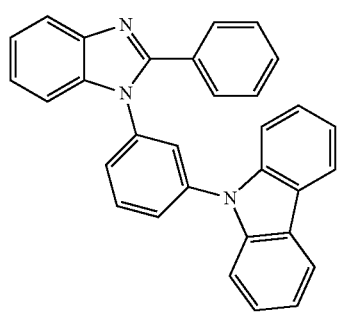
HTb-32
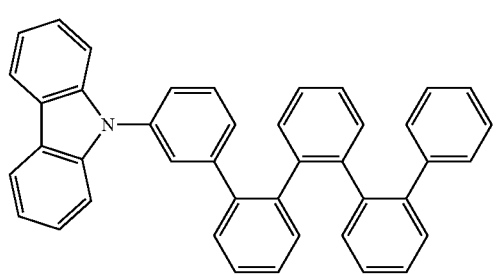
HTb-33
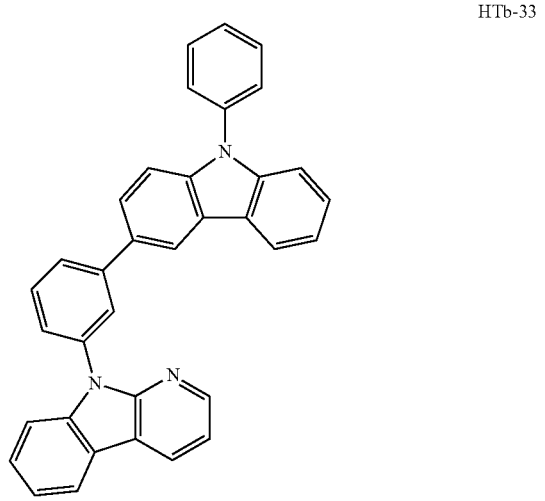
HTb-34
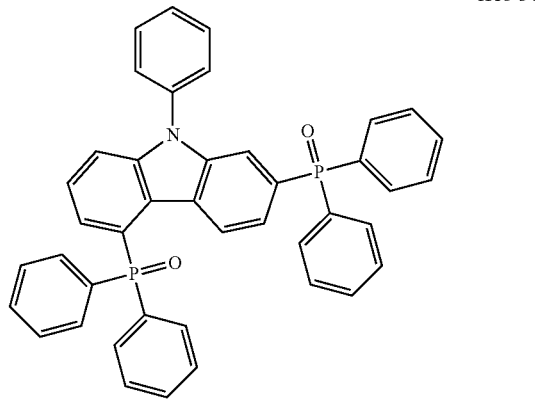
HTb-35
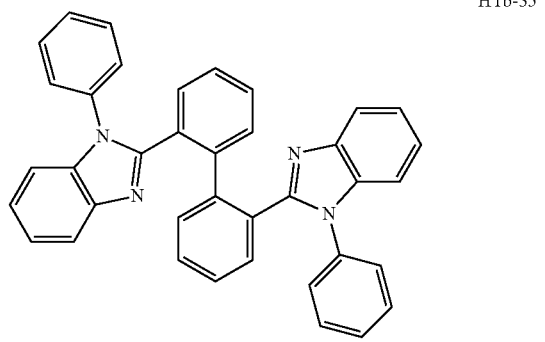

HTb-36
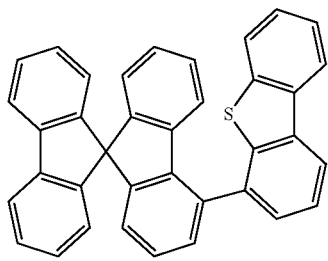
13. The organic electroluminescence device of claim 1, wherein the third host is one selected from Compound Group 3 below:
[Compound Group 3]
[Compound Group 3]
ET-01
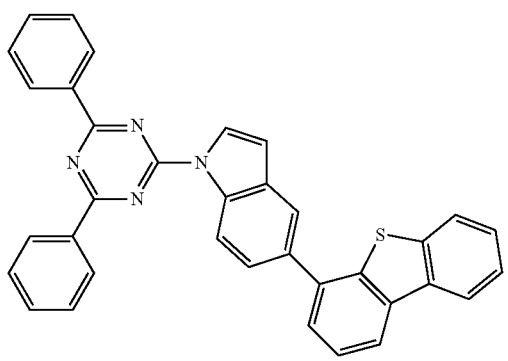
ET-02
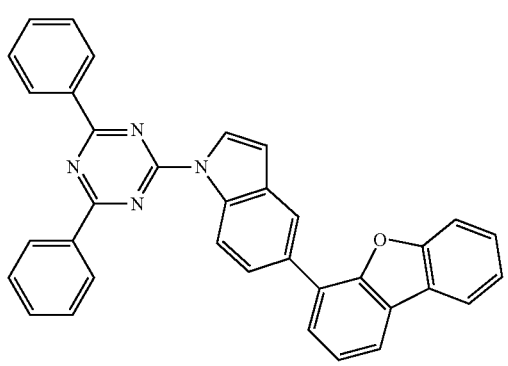
ET-03
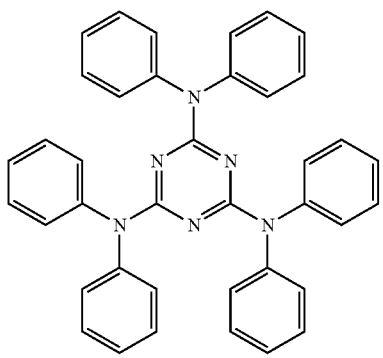
ET-04
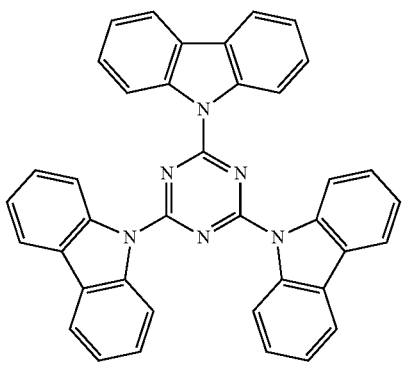
ET-05
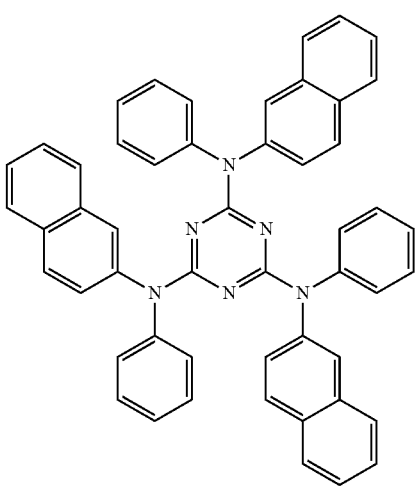
ET-06
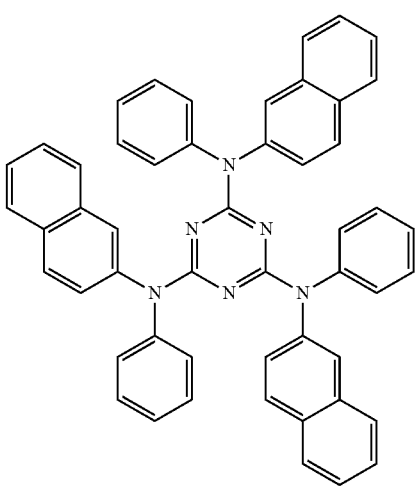
ET-07
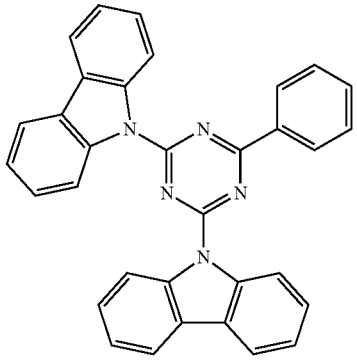

ET-08 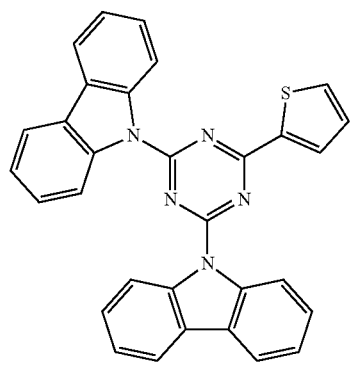
ET-12 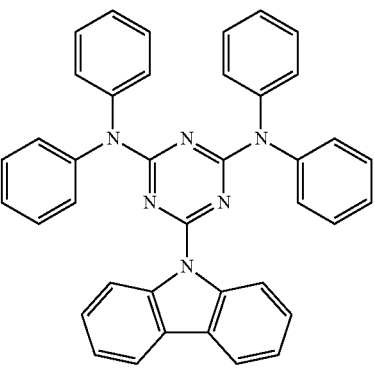
ET-09 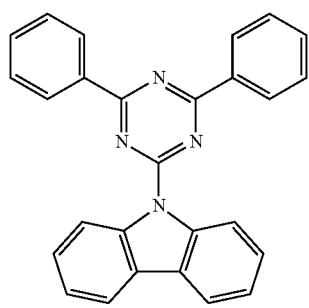
ET-13 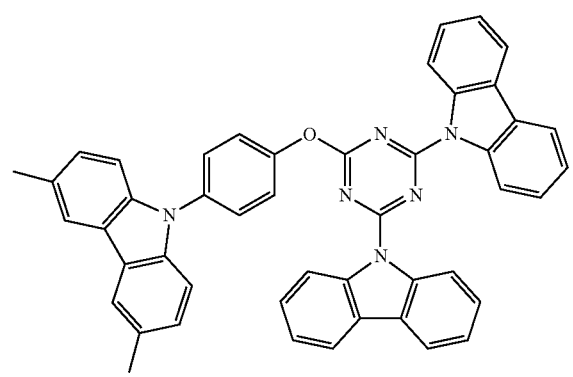
ET-10 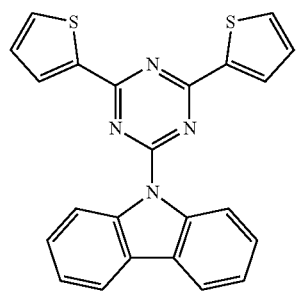
ET-11 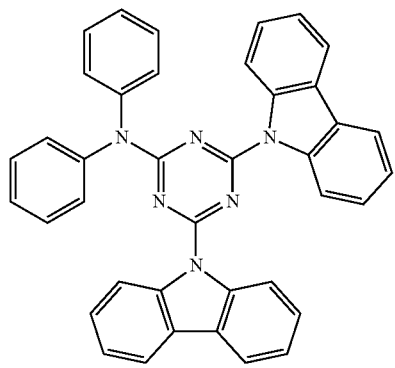
ET-14 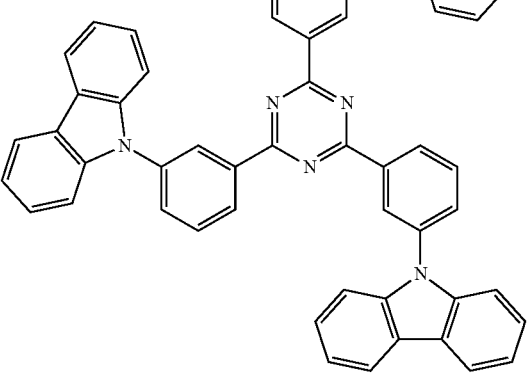

ET-15
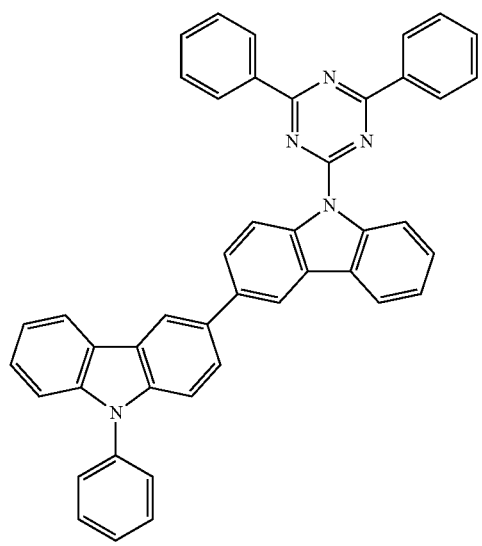
ET-16
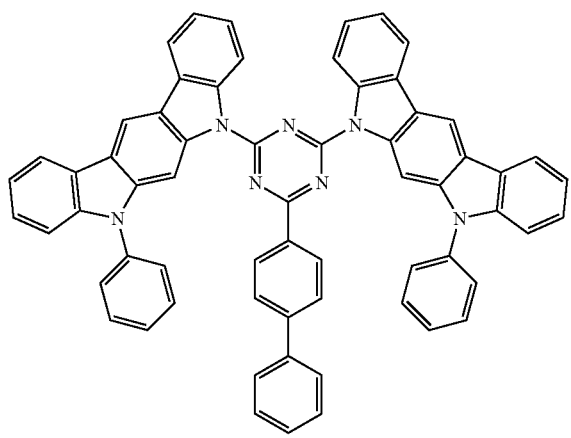
ET-17
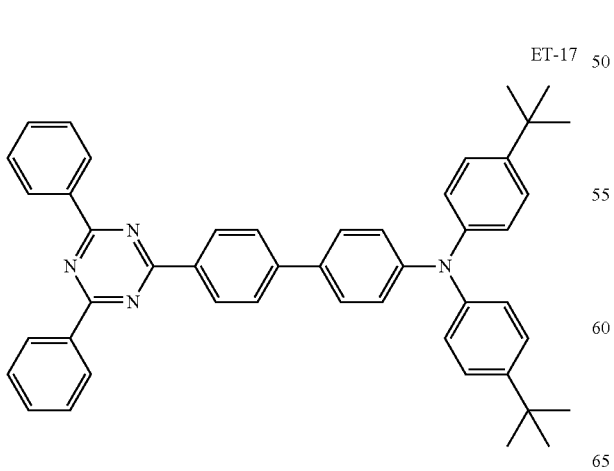
ET-18
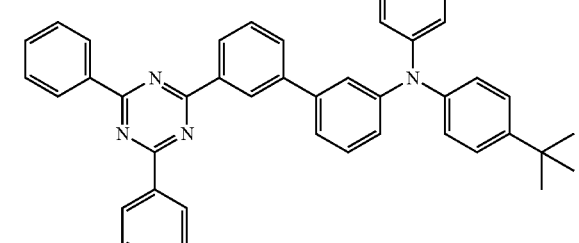
ET-19
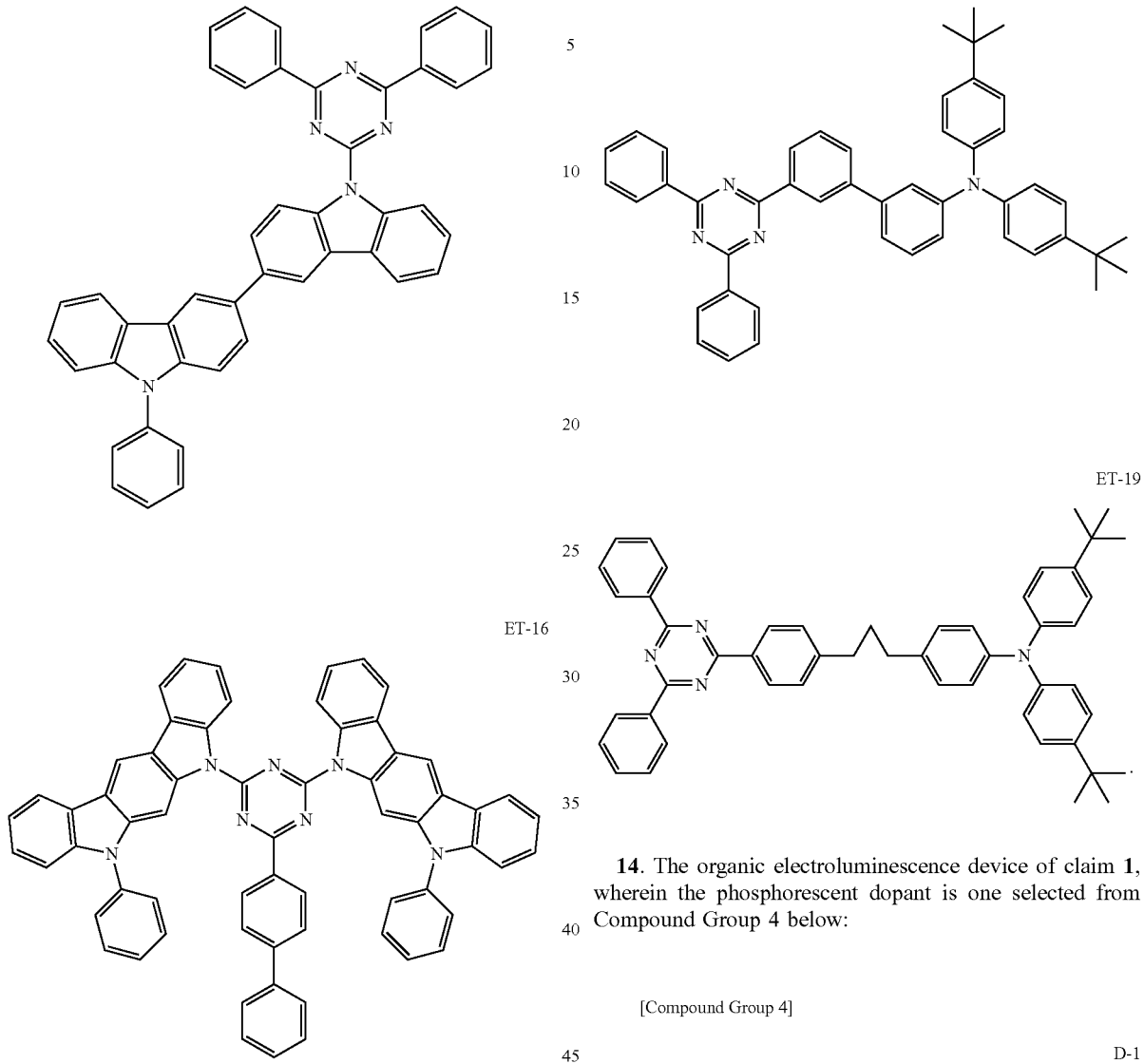
14. The organic electroluminescence device of claim 1, wherein the phosphorescent dopant is one selected from Compound Group 4 below:
[Compound Group 4]
D-1
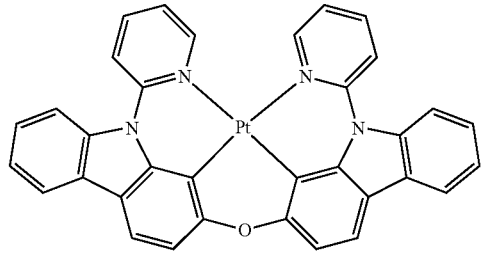
D-2
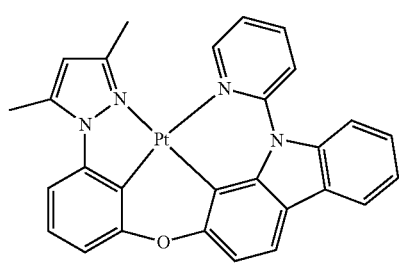

-continued

D-3
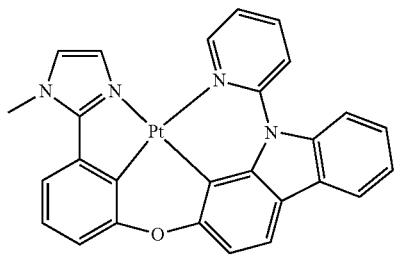

D-4
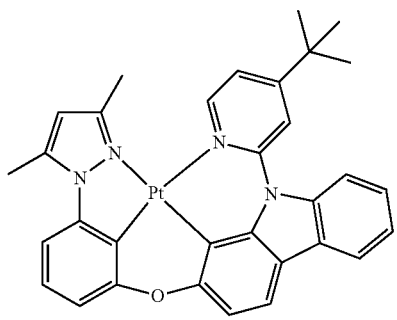

D-5
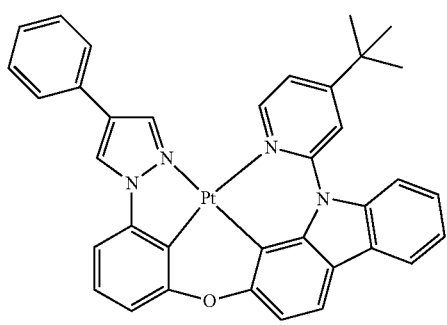

D-6
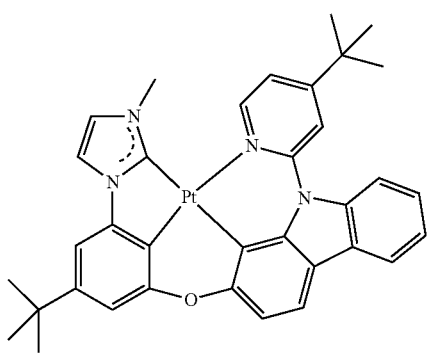

D-7
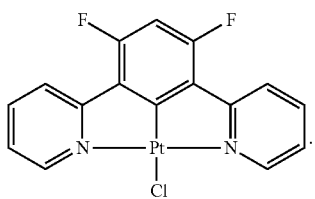

15. The organic electroluminescence device of claim 1, wherein a content of the phosphorescent dopant is in a range of about 10 wt % to about 16 wt % based on the total weight of the second host, the third host, and the phosphorescent dopant.

16. An organic electroluminescence device comprising:
a first electrode;
a hole injection layer disposed on the first electrode;
a hole transport layer disposed on the hole injection layer;
an electron blocking layer disposed on the hole transport layer;
an exciton diffusion layer disposed on the electron blocking layer and comprising a first host that transports holes;
an emission layer disposed on the exciton diffusion layer and comprising:
a second host that transports holes;
a third host that transports electrons; and
a phosphorescent dopant comprising Pt;
an electron transport layer disposed on the emission layer;
an electron injection layer disposed on the electron transport layer; and
a second electrode disposed on the electron injection layer;
wherein an absolute value of a highest occupied molecular orbital (HOMO) energy level of the first host is in a range of about 4.7 eV to about 5.1 eV.

17. The organic electroluminescence device of claim 16, wherein the first host is represented by Formula 1:

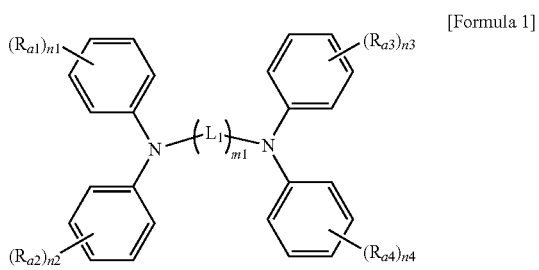

[Formula 1]

wherein in Formula 1,
$L_1$ is a substituted or unsubstituted ring-forming arylene group having 6 to 30 carbon atoms, or a substituted or unsubstituted ring-forming heteroarylene group having 2 to 30 carbon atoms,
$R_{a1}$ to $R_{a4}$ are each independently a hydrogen atom, a deuterium atom, a halogen atom, a substituted or unsubstituted alkyl group having 1 to 20 carbon atoms, a substituted or unsubstituted ring-forming aryl group having 6 to 30 carbon atoms, or a substituted or unsubstituted ring-forming heteroaryl group having 2 to 30 carbon atoms,
m1 is 1 or 2; and
n1 to n4 are each independently an integer from 0 to 5.

18. The organic electroluminescence device of claim 16, wherein a thickness of the exciton diffusion layer is less than or equal to a triplet exciton diffusion length of the first host.

19. The organic electroluminescence device of claim 16, wherein:
an absolute value of a difference between the highest occupied molecular orbital (HOMO) energy level of the first host and the highest occupied molecular orbital (HOMO) energy level of the second host is in a range of about 0.2 eV to about 1.5 eV; and
an absolute value of a difference between the highest occupied molecular orbital (HOMO) energy level of the first host and the highest occupied molecular orbital (HOMO) energy level of the third host is in a range of about 0.2 eV to about 1.5 eV.

* * * * *